US010090031B2

(12) United States Patent
Ishizu et al.

(10) Patent No.: US 10,090,031 B2
(45) Date of Patent: Oct. 2, 2018

(54) SEMICONDUCTOR DEVICE COMPRISING MEMORY CIRCUIT AND SELECTION CIRCUIT

(71) Applicant: Semiconductor Energy Laboratory Co., Ltd., Atsugi-shi, Kanagawa-ken (JP)

(72) Inventors: Takahiko Ishizu, Kanagawa (JP); Kazuma Furutani, Kanagawa (JP); Keita Sato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 205 days.

(21) Appl. No.: 15/011,809

(22) Filed: Feb. 1, 2016

(65) Prior Publication Data
US 2016/0232956 A1 Aug. 11, 2016

(30) Foreign Application Priority Data

Feb. 9, 2015 (JP) .................................. 2015-022827

(51) Int. Cl.
*G11C 5/14* (2006.01)
*G11C 8/08* (2006.01)
(Continued)

(52) U.S. Cl.
CPC ............... *G11C 8/08* (2013.01); *G11C 5/063* (2013.01); *G11C 5/148* (2013.01); *G11C 8/12* (2013.01); *G11C 5/14* (2013.01)

(58) Field of Classification Search
CPC ........... G11C 8/08; G11C 5/148; G11C 5/063; G11C 8/12; G11C 5/14
(Continued)

(56) References Cited

U.S. PATENT DOCUMENTS 5,430,859 A * 7/1995 Norman ................ G06F 3/0613
365/185.33
5,615,162 A * 3/1997 Houston ................... G11C 5/14
365/226
(Continued)

FOREIGN PATENT DOCUMENTS

EP 1737044 A 12/2006
EP 2226847 A 9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

Primary Examiner — Tha-O H Bui
(74) Attorney, Agent, or Firm — Fish & Richardson P.C.

(57) ABSTRACT

A novel semiconductor device, a semiconductor device with low power consumption, or a semiconductor device capable of retaining data for a long period is provided. The semiconductor device includes a first selection circuit connected to a plurality of first memory circuits, a second selection circuit connected to a plurality of second memory circuits, and a third selection circuit connected to a plurality of third memory circuits, thereby being capable of conducting power gating of each of the first memory circuits, each of the second memory circuits, or each of the third memory circuits separately. Accordingly, the memory circuits to which data is not written or from which data is not read can be kept in a state where power supply thereto is stopped, so that power consumption of the semiconductor device can be reduced.

20 Claims, 29 Drawing Sheets

(51) Int. Cl.
  *G11C 8/12* (2006.01)
  *G11C 5/06* (2006.01)
(58) Field of Classification Search
  USPC .......................................................... 365/226
  See application file for complete search history.

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,614,916 | B2 | 12/2013 | Nagathuka et al. |
| 9,065,438 | B2 | 6/2015 | Aoki et al. |
| 9,172,370 | B2 | 10/2015 | Ikeda et al. |
| 9,202,546 | B2 | 12/2015 | Yamazaki et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0024318 | A1 | 2/2007 | Mamidipaka |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0089417 | A1 | 4/2011 | Yamazaki et al. |
| 2011/0101351 | A1 | 5/2011 | Yamazaki |
| 2015/0061742 | A1 | 3/2015 | Maehashi et al. |
| 2015/0091629 | A1 | 4/2015 | Ishizu et al. |
| 2016/0006433 | A1 | 1/2016 | Ishizu et al. |
| 2016/0233866 | A1 | 8/2016 | Ishizu et al. |

FOREIGN PATENT DOCUMENTS

| | | | |
|---|---|---|---|
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-264794 | A | 10/1996 |
| JP | 11-505377 | | 5/1999 |
| JP | H11-505377 | A | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2012-256400 | A | 12/2012 |
| WO | WO-2004/114391 | | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

(56) References Cited

OTHER PUBLICATIONS

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples" J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 , SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-SILICON Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165021-165202-22.
Janotti.A et al., "Oxygen Vacancies in ZnO", Appl. Phys. Lett. (Applied Physics Letters) , 2005, vol. 87, pp. 122102-1-122102-3.
Jeong.J et al., "3.1 Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devicse Employing MoO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "SPINEL, YbFe2O4, and Yb2Fe3O7 Types of Structures for Compounds in the In2O3 and SC2O3—A2O3—BO Systems [A; Fe, Ga, or Al; B: Mg, Mn, Fe, Ni, Cu,or Zn] at Temperatures over 1000° C. ", Journal of Solid State Chemistry, 1985, vol. 60, pp. 382-384.
Kimizuka.N et al., "Synthesis and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-

(56) References Cited

OTHER PUBLICATIONS crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors with Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance oxide thin film transistors with transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ration Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09: Proceedings of the 16th International Display Workshops, 2009, pp. 689-692.

Son.K et al., "42.4L: Late-News Paper: 4 Inch QVGA AMOLED Driven by the Trheshold Voltage Controlled Amorphous GIZO (GaO3—In2O3—ZnO) TFT", SID Digest '08 : SID International Symposium Digest of Technical Papers, May 20, 2008, vol. 39, pp. 633-636.

Takahashi.M et al., "Theoretical Analyis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

FIG. 3A
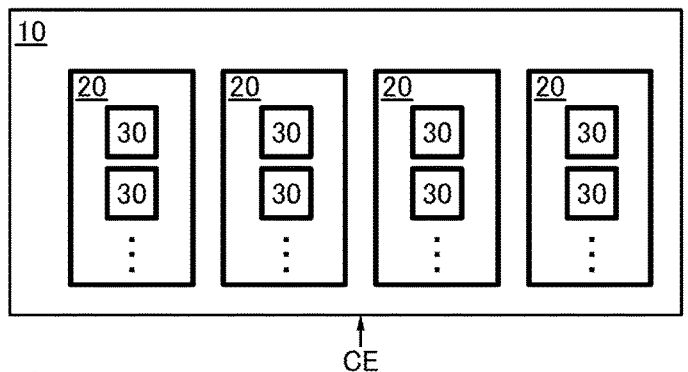
FIG. 3B
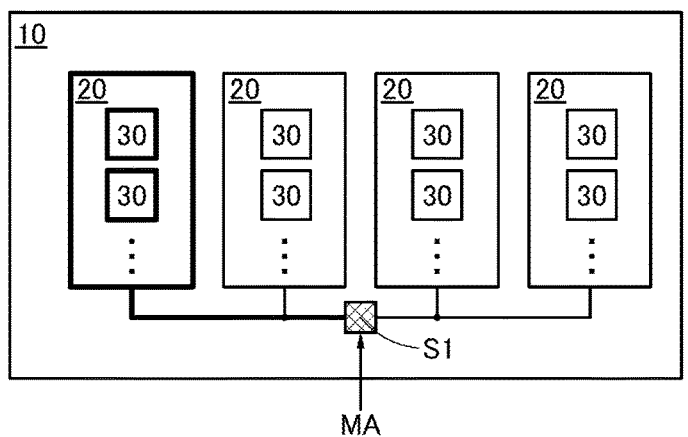
FIG. 3C
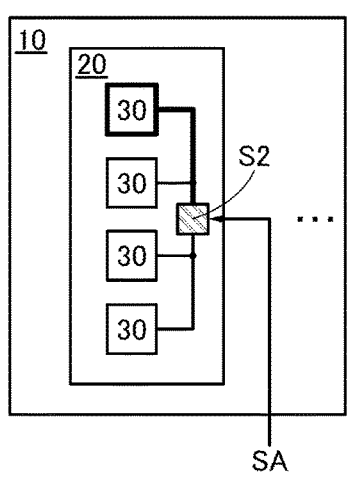
FIG. 3D

FIG. 12A
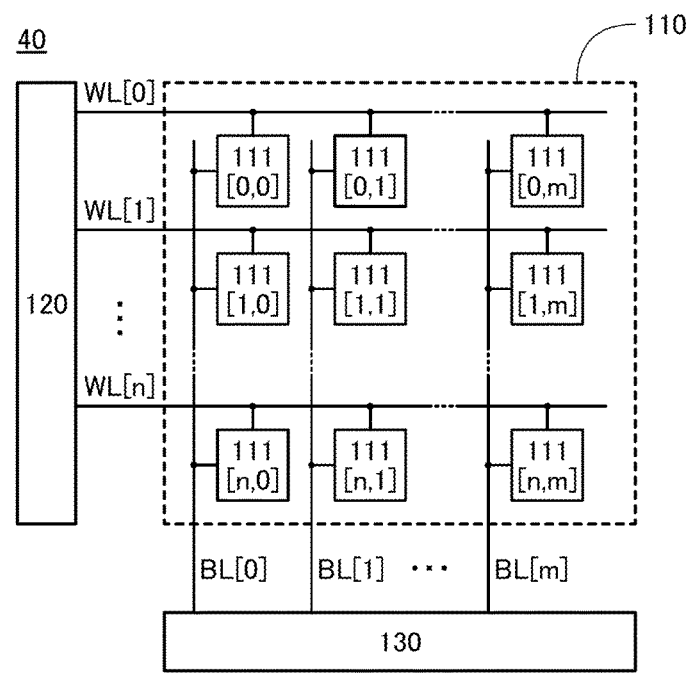
FIG. 12B    FIG. 12C    FIG. 12D
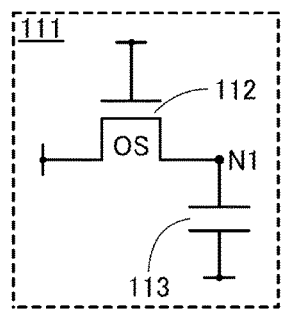  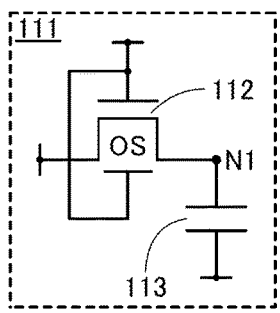  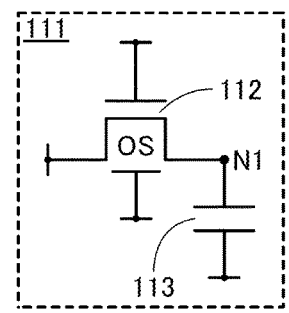

- Completion of element substrate — Step1
- Grinding back surface — Step2
- Die bonding — Step3
- Wire bonding — Step4
- Sealing — Step5
- Plating and processing lead — Step6
- Marking — Step7
- Test — Step8
- Completion — Step9

SEMICONDUCTOR DEVICE COMPRISING MEMORY CIRCUIT AND SELECTION CIRCUIT

BACKGROUND OF THE INVENTION

1. Field of the Invention

One embodiment of the present invention relates to a semiconductor device, a central processing unit, and an electronic device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. One embodiment of the present invention relates to a semiconductor device, a display device, a light-emitting device, a power storage device, a memory device, an imaging device, a driving method thereof, or a manufacturing method thereof.

2. Description of the Related Art

Patent Document 1 describes a memory device that includes a transistor using an oxide semiconductor and a transistor using single crystal silicon. According to Patent Document 1, the transistor using an oxide semiconductor has an extremely low off-state current.

REFERENCE

[Patent Document 1] Japanese Published Patent Application No. 2012-256400

SUMMARY OF THE INVENTION

An object of one embodiment of the present invention is to provide a novel semiconductor device. Another object of one embodiment of the present invention is to provide a semiconductor device with low power consumption. Another object of one embodiment of the present invention is to provide a semiconductor device capable of retaining data for a long period. Another object of one embodiment of the present invention is to provide a semiconductor device with a reduced area. Another object of one embodiment of the present invention is to provide a semiconductor device capable of operating at a high speed. Another object of one embodiment of the present invention is to provide a highly reliable semiconductor device.

One embodiment of the present invention does not necessarily achieve all the objects listed above and only needs to achieve at least one of the objects. The descriptions of the above objects do not disturb the existence of other objects. Other objects will be apparent from and can be derived from the description of the specification, the drawings, the claims, and the like.

A semiconductor device according to one embodiment of the present invention includes a plurality of memory circuits and a selection circuit. Each of the plurality of memory circuits includes a cell array and a driver circuit. The selection circuit is electrically connected to the plurality of memory circuits. The selection circuit is configured to select a particular memory circuit from the plurality of memory circuits in accordance with an address signal input to the selection circuit. The semiconductor device is configured to stop power supply to the driver circuit in each of the memory circuits not selected by the selection circuit.

A semiconductor device according to one embodiment of the present invention includes a plurality of first memory circuits and a first selection circuit. Each of the plurality of first memory circuits includes a plurality of second memory circuits and a second selection circuit. Each of the plurality of second memory circuits includes a cell array and a driver circuit. The first selection circuit is electrically connected to the plurality of first memory circuits. The second selection circuit is electrically connected to the plurality of second memory circuits. The first selection circuit is configured to select a particular first memory circuit from the plurality of first memory circuits in accordance with an address signal input to the first selection circuit. The second selection circuit is configured to select a particular second memory circuit from the plurality of second memory circuits in accordance with an address signal input to the second selection circuit. The semiconductor device is configured to stop power supply to the driver circuit in each of the plurality of first memory circuits not selected by the first selection circuit and to stop power supply to the driver circuit in each of the plurality of second memory circuits not selected by the second selection circuit.

The semiconductor device according to either of the above embodiments of the present invention may further include a switch between the driver circuit and a wiring for supplying a power supply potential. Power supply to the driver circuit may be stopped by turning off the switch.

In the semiconductor device according to either of the above embodiments of the present invention, the cell array may include a first memory cell and a second memory cell. The driver circuit may include a first logic circuit and a second logic circuit. The first logic circuit may be electrically connected to the first memory cell through a first wiring. The second logic circuit may be electrically connected to the second memory cell through a second wiring. The semiconductor device may be configured to stop power supply to the second logic circuit in a period where the first memory cell is selected.

In the semiconductor device according to either of the above embodiments of the present invention, the first memory cell and the second memory cell may each include a transistor and a capacitor. One of a source and a drain of the transistor may be electrically connected to the capacitor. A channel formation region of the transistor may include an oxide semiconductor.

A central processing unit according to one embodiment of the present invention includes a cache memory that includes the above-described semiconductor device.

An electronic device according to one embodiment of the present invention includes the above-described semiconductor device or the above-described central processing unit and a display portion, a microphone, a speaker, or an operation key.

According to one embodiment of the present invention, a novel semiconductor device can be provided. According to another embodiment of the present invention, a semiconductor device with low power consumption can be provided. According to another embodiment of the present invention, a semiconductor device capable of retaining data for a long period can be provided. According to another embodiment of the present invention, a semiconductor device with a reduced area can be provided. According to another embodiment of the present invention, a semiconductor device capable of operating at a high speed can be provided. According to another embodiment of the present invention, a highly reliable semiconductor device can be provided.

Note that the descriptions of these effects do not disturb the existence of other effects. One embodiment of the present invention does not necessarily achieve all the effects. Other effects will be apparent from and can be derived from the descriptions of the specification, the drawings, the claims, and the like.

BRIEF DESCRIPTION OF THE DRAWINGS

FIGS. 3A to 3D illustrate operation in one embodiment of the present invention.

FIGS. 12A to 12D each illustrate one embodiment of the present invention.

DETAILED DESCRIPTION OF THE INVENTION

Figure 1:
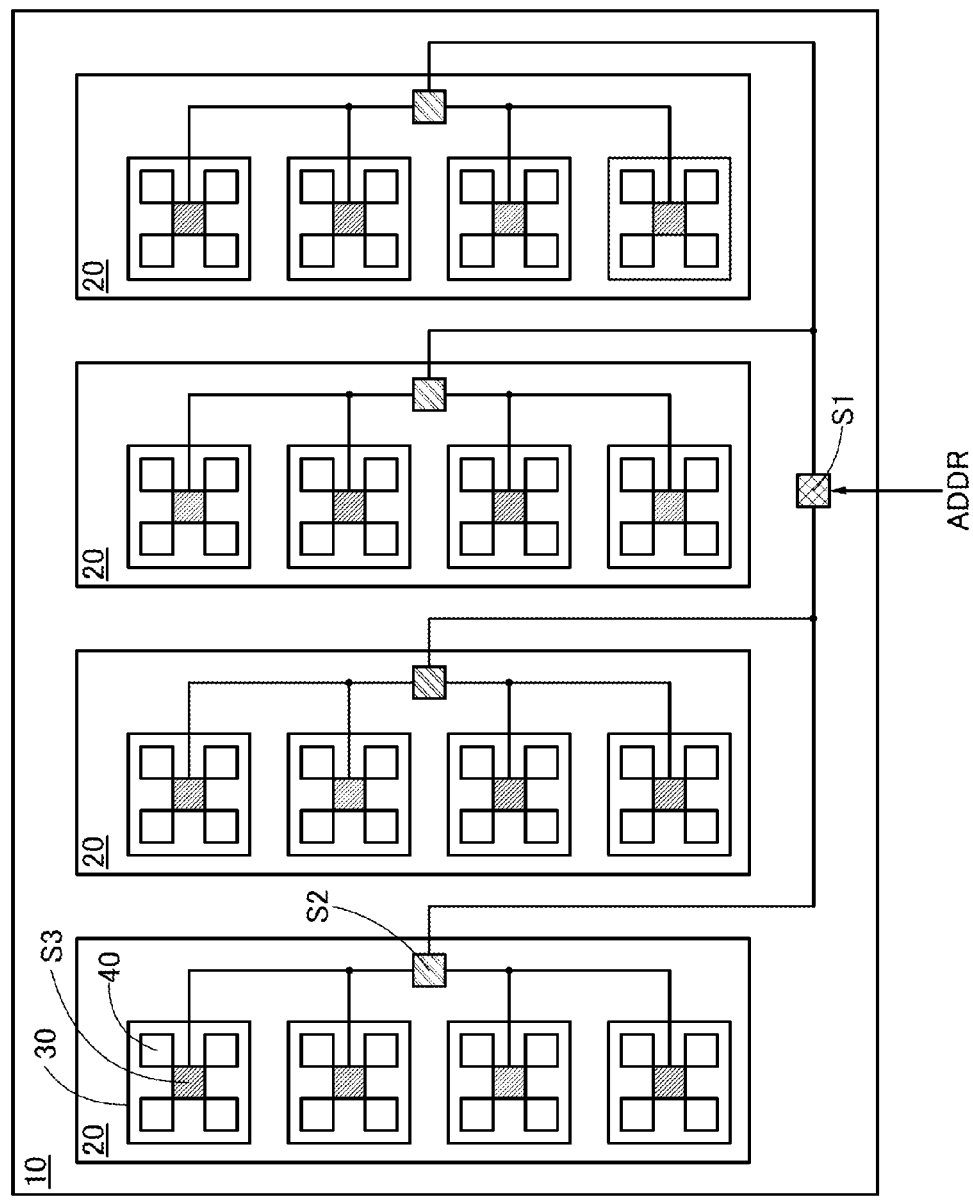
FIG. 1 illustrates one embodiment of the present invention.

Embodiments of the present invention will be described in detail below with reference to the drawings. Note that the present invention is not limited to the description in the following embodiments, and it will be easily understood by those skilled in the art that various changes and modifications can be made without departing from the spirit and scope of the present invention. Therefore, the present invention should not be construed as being limited to the description in the following embodiments.

One embodiment of the present invention includes, in its category, devices such as a memory device, a radio frequency (RF) tag, a display device, an imaging device, and an integrated circuit. In addition, the display device includes, in its category, display devices including integrated circuits, such as liquid crystal display devices, light-emitting devices in which a light-emitting element typified by an organic light-emitting element is provided in each pixel, electronic paper, digital micromirror devices (DMDs), plasma display panels (PDPs), and field emission displays (FEDs).

Note that, in the description of modes of the present invention with reference to the drawings, the same components in different diagrams are commonly denoted by the same reference numeral.

In this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text. Here, X and Y each denote an object (e.g., a device, an element, a circuit, a wiring, an electrode, a terminal, a conductive film, or a layer).

For example, in the case where X and Y are directly connected, X and Y are connected without an element that enables electrical connection between X and Y (e.g., a switch, a transistor, a capacitor, an inductor, a resistor, a diode, a display element, a light-emitting element, or a load) interposed between X and Y.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and X and Y are electrically connected.

Note that in this specification and the like, an explicit description "X and Y are electrically connected" means that X and Y are electrically connected (i.e., the case where X and Y are connected with another element or circuit provided therebetween), X and Y are functionally connected (i.e., the case where X and Y are functionally connected with another circuit provided therebetween), and X and Y are directly connected (i.e., the case where X and Y are connected without another element or circuit provided therebetween). That is, in this specification and the like, the explicit expression "X and Y are electrically connected" is the same as the explicit simple expression "X and Y are connected".

Even when independent components are electrically connected to each other in a diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Embodiment 1

In this embodiment, a configuration example of a semiconductor device of one embodiment of the present invention will be described.

<Configuration Example of Semiconductor Device>

FIG. 1 illustrates a configuration example of a semiconductor device 10 of one embodiment of the present invention. The semiconductor device 10 has a function of a memory device. Thus, the semiconductor device 10 can also be referred to as a memory device 10. The semiconductor device 10 has a function of conducting fine-grained power gating at the spatial granularity of the semiconductor device 10, a memory circuit 20, a memory circuit 30, or a memory circuit 40. Such a configuration of the semiconductor device 10 will be described below.

The semiconductor device 10 includes a plurality of memory circuits 20 (hereinafter also referred to as macros 20). Each of the macros 20 includes a plurality of memory circuits 30 (hereinafter also referred to as subarrays 30). Each of the subarrays 30 includes a plurality of memory circuits 40 (hereinafter also referred to as memory blocks 40). In other words, the subarray 30 is a memory circuit including a group of memory blocks 40, and the macro 20 is a memory circuit including a group of subarrays 30. Note that the memory block 40 is a circuit having a function of storing data.

FIG. 1 illustrates an example where the semiconductor device 10 includes four macros 20, each of the macros 20 includes four subarrays 30, and each of the subarrays 30 includes four memory blocks 40. Thus, the semiconductor device 10 has a function of a memory device which includes 64 (=4×4×4) memory blocks 40. For example, in the case where the memory block 40 has a capacity of 2 KB, the semiconductor device 10 can be used as a 128 KB memory device. Note that the numbers of macros 20, subarrays 30, and memory blocks 40 and the capacity of the memory block 40 are not limited to the above values and can be set as appropriate.

The semiconductor device 10 includes a selection circuit S1, each of the macros 20 includes a selection circuit S2, and each of the subarrays 30 includes a selection circuit S3.

When the semiconductor device 10 is accessed and an address signal ADDR is input from the outside, a predetermined memory block 40 is accessed in accordance with the address signal ADDR. Data is written to or read from the memory block 40 accessed. In a period where the address signal ADDR is not input to the semiconductor device 10, power supply to the semiconductor device 10 can be stopped. This can reduce power consumption of the semiconductor device 10 in a standby state. Note that power supply can be stopped by stopping supply of a high power supply potential or a low power supply potential or both as described later with reference to FIGS. 5A to 5C, FIGS. 6A to 6F, and the like.

The plurality of macros 20 are connected to the selection circuit S1. The selection circuit S1 has a function of selecting a particular macro 20 which is requested to be accessed from among the plurality of macros 20 in accordance with the address signal ADDR. The selection circuit S1 may include a decoder or the like. For example, in the case where four macros 20 are connected to the selection circuit S1 as illustrated in FIG. 1, the selection circuit S1 can select a particular macro 20 by decoding 2-bit data included in the address signal ADDR.

The semiconductor device 10 has a function of stopping power supply to the macros 20 which are not selected by the selection signal S1, while supplying power to the macro 20 which is selected by the selection circuit S1. Thus, processing such as data writing or reading can be conducted in the macro 20 selected by the selection circuit S1, and at the same time, power consumption of the other macros 20 can be reduced.

The plurality of subarrays 30 included in each of the macros 20 are connected to the selection circuit S2. The selection circuit S2 has a function of selecting a particular subarray 30 which is requested to be accessed from among the plurality of subarrays 30 in accordance with the address signal ADDR. The selection circuit S2 may include a decoder or the like. For example, in the case where four subarrays 30 are connected to the selection circuit S2 as illustrated in FIG. 1, the selection circuit S2 can select a particular subarray 30 by decoding 2-bit data included in the address signal ADDR.

The semiconductor device 10 has a function of stopping power supply to the subarrays 30 which are not selected by the selection signal S2, while supplying power to the subarray 30 which is selected by the selection circuit S2. Thus, processing such as data writing or reading can be conducted in the subarray 30 selected by the selection circuit S2, and at the same time, power consumption of the other subarrays 30 can be reduced.

The plurality of memory blocks 40 included in each of the subarrays 30 are connected to the selection circuit S3. The selection circuit S3 has a function of selecting a particular memory block 40 which is requested to be accessed from among the plurality of memory blocks 40 in accordance with the address signal ADDR. The selection circuit S3 may include a decoder or the like. For example, in the case where four memory blocks 40 are connected to the selection circuit S3 as illustrated in FIG. 1, the selection circuit S3 can select a particular memory block 40 by decoding 2-bit data included in the address signal ADDR.

The semiconductor device 10 has a function of stopping power supply to the memory blocks 40 which are not selected by the selection signal S3, while supplying power to the memory block 40 which is selected by the selection circuit S3. Thus, processing such as data writing or reading can be conducted in the memory block 40 selected by the selection circuit S3, and at the same time, power consumption of the other memory blocks 40 can be reduced.

In the above-described manner, the semiconductor device 10 can control power supply to each of the macros 20, each of the subarrays 30, or each of the memory blocks 40 separately.

Figure 2:
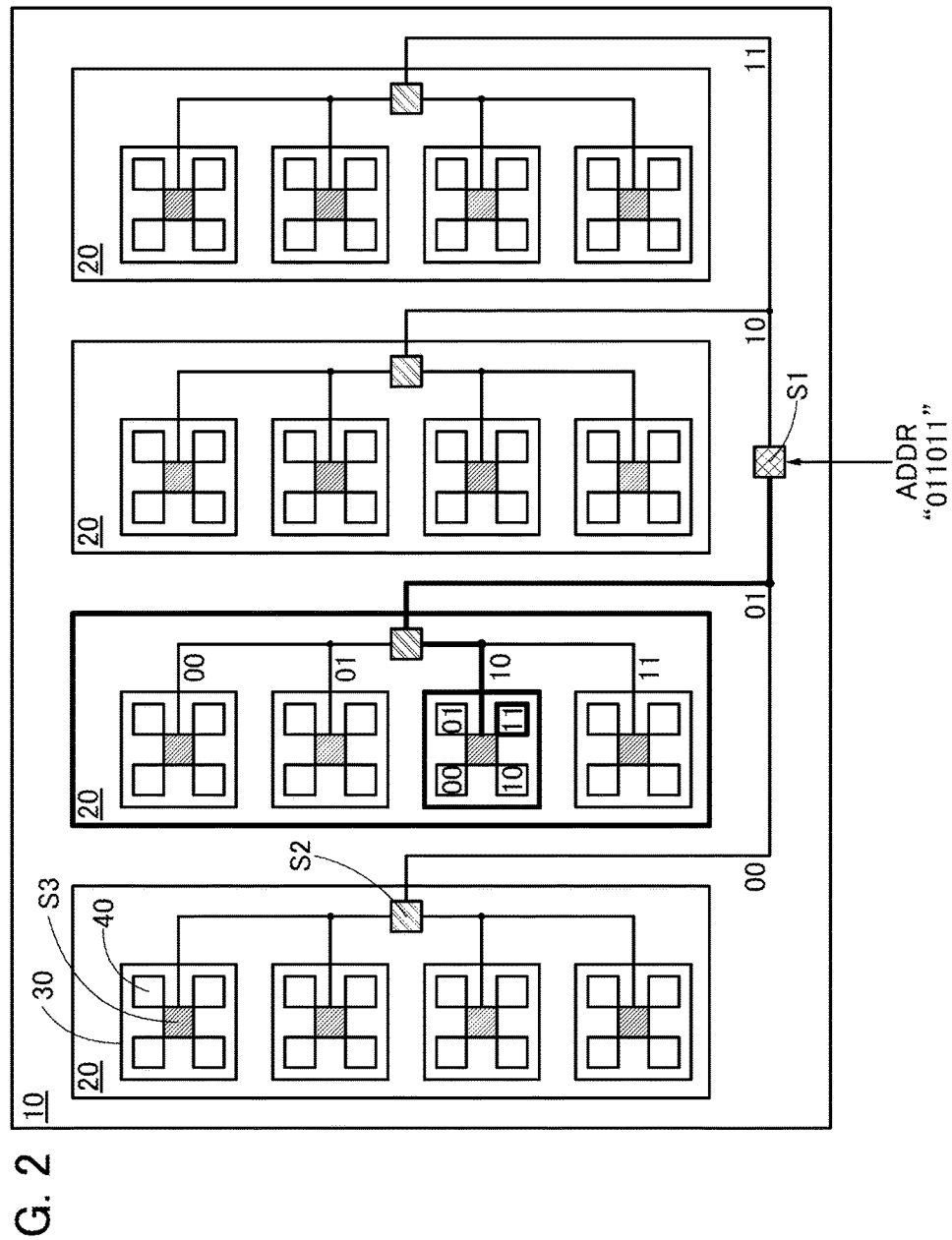
FIG. 2 illustrates operation in one embodiment of the present invention.

FIG. 2 illustrates an example of operation where the address signal ADDR is input to the semiconductor device 10. As one example, operation in the case where the address signal ADDR input to the semiconductor device 10 includes 6-bit data "011011" which specifies a memory block 40 to be accessed will be described here.

When the address signal ADDR including 6-bit data "011011" is input, the two high-order bits "01" of the 6-bit data are decoded by the selection circuit S1, and a macro 20 which is requested to be accessed (the second macro 20 from the left in the diagram) is selected.

Here, the macros 20 which are not requested to be accessed (the macros 20 specified by the two high-order bits "00", "10", or "11") can be kept in a state where power supply thereto is stopped. In other words, when the macro 20 is selected, power can be supplied only to the selection circuit S1 and to the subarrays 30 and the selection circuit S2 which are included in the macro 20 which is requested to be accessed. Thus, power gating can be conducted at the spatial granularity of the macros 20.

Next, in the macro 20 selected by the selection circuit S1, the two middle-order bits "10" of the 6-bit data are decoded by the selection circuit S2, and a subarray 30 which is requested to be accessed (the second subarray 30 from the bottom in the diagram) is selected.

Here, the subarrays 30 which are not requested to be accessed (the subarrays 30 specified by the two middle-order bits "00", "01," or "11") of the subarrays 30 included in the macro 20 selected by the selection circuit S1 can be kept in a state where power supply thereto is stopped. In other words, when the subarray 30 is selected, power can be supplied only to the selection circuit S1, to the selection circuit S2 included in the macro 20 which is requested to be accessed, and to the memory blocks 40 and the selection circuit S3 which are included in the subarray 30 which is requested to be accessed. Thus, power gating can be conducted at the spatial granularity of the subarrays 30.

Next, in the subarray 30 selected by the selection circuit S2, the two low-order bits "11" of the address data are decoded by the selection circuit S3, and a memory block 40 which is requested to be accessed (the lower right memory block 40 in the diagram) is selected.

Here, the memory blocks 40 which are not requested to be accessed (the memory blocks 40 specified by the two low-order bits "00", "01," or "10") of the memory blocks 40 included in the subarray 30 selected by the selection circuit S2 can be kept in a state where power supply thereto is stopped. In other words, when the memory block 40 is selected, power can be supplied only to the selection circuit S1, to the selection circuit S2 included in the macro 20 which is requested to be accessed, to the selection circuit S3 included in the subarray 30 which is requested to be accessed, and to the memory block 40 which is requested to be accessed. Thus, power gating can be conducted at the spatial granularity of the memory blocks 40.

In the above-described manner, in one embodiment of the present invention, when an address signal is input and a particular memory block 40 is requested to be accessed, the macros 20, the subarrays 30, or the memory blocks 40 which are not specified by the address signal can be kept in a state where power supply thereto is stopped. Note that objects to which power supply is stopped can be changed depending on the locality of data stored in the semiconductor device 10, the frequency of access thereto, or the like.

Specifically, the semiconductor device 10 can be selectively operated in a mode (1) in which power is supplied to the whole semiconductor device 10, a mode (2) in which power is supplied to a macro 20 which is requested to be accessed, a mode (3) in which power supplied to a subarray 30 which is requested to be accessed, or a mode (4) in which power is supplied to a memory block 40 which is requested to be accessed. In other words, fine-grained power gating can be conducted with the spatial granularity set to not only the semiconductor device 10 but also the macros 20, the subarrays 30, or the memory blocks 40.

Next, details of fine-grained power gating in the semiconductor device 10 will be described. As illustrated in FIGS. 3A to 3D, the spatial granularity of power gating can be changed in the semiconductor device 10. Note that circuits to which power is supplied are indicated with thick frames.

FIG. 3A illustrates the mode in which power is supplied to the whole semiconductor device 10. When a signal CE for selecting the semiconductor device 10 is input to the semiconductor device 10, power is supplied to the whole semiconductor device 10 and also to the macros 20, the subarrays 30, and the memory blocks 40 (not illustrated) which are included in the semiconductor device 10. In other words, power gating is conducted at the spatial granularity of the semiconductor device 10. Note that in a period where the signal CE is not input, a state where power supply to the semiconductor device 10 is stopped can be maintained.

FIG. 3B illustrates the mode in which power is supplied to a particular macro 20 which is selected by the selection circuit S1. A signal MA for selecting the particular macro 20 (here, the leftmost macro 20 in the diagram) is input to the selection circuit S1. At that time, power is supplied to the selected macro 20 and also to the subarrays 30 and the memory blocks 40 (not illustrated) which are included in the selected macro 20.

On the other hand, power is not supplied to the macros 20 which are not selected by the selection circuit S1. That is, the unselected macros 20 and the subarrays 30 and the memory blocks 40 (not illustrated) which are included in the unselected macros 20 are kept in a state where power supply thereto is stopped. In this manner, power gating can be conducted at the spatial granularity of the macros 20, and power consumption of the semiconductor device 10 can be reduced.

FIG. 3C illustrates the mode in which power is supplied to a particular subarray 30 which is selected by the selection circuit S2. A signal SA for selecting the particular subarray 30 (here, the uppermost subarray 30 in the diagram) is input to the selection circuit S2. At that time, power is supplied to the selected subarray 30 and also to the memory blocks 40 (not illustrated) which are included in the selected subarray 30.

On the other hand, power is not supplied to the subarrays 30 which are not selected by the selection circuit S2. That is, the unselected subarrays 30 and the memory blocks 40 (not illustrated) which are included in the unselected subarrays 30 are kept in a state where power supply thereto is stopped. In this manner, power gating can be conducted at the spatial granularity of the subarrays 30, and power consumption of the macros 20 can be reduced.

FIG. 3D illustrates the mode in which power is supplied to a particular memory block 40 which is selected by the selection circuit S3. A signal BA for selecting the particular memory block 40 (here, the upper right memory block 40 in the diagram) is input to the selection circuit S3. At that time, power is supplied to the selected memory block 40.

On the other hand, power is not supplied to the memory blocks 40 which are not selected by the selection circuit S3. That is, the unselected memory blocks 40 are kept in a state where power supply thereto is stopped. In this manner, power gating can be conducted at the spatial granularity of the memory blocks 40, and power consumption of the subarrays 30 can be reduced.

As described above, in one embodiment of the present invention, the spatial granularity of power gating can be selected from the semiconductor device 10, the macros 20, the subarrays 30, and the memory blocks 40. Accordingly, power gating can be suitably conducted depending on the locality of data stored in the semiconductor device 10, the frequency of access thereto, or the like, and power consumption of the semiconductor device 10 can be reduced efficiently. The spatial granularity may be selected using hardware or software (a system) in accordance with the content of a program to be executed.

Note that the effect of fine-grained power gating on a reduction of power consumption depends on the locality of data stored in the semiconductor device 10. In view of this, power consumption can be significantly reduced when the semiconductor device 10 is used as a memory device having high data locality, such as a cache memory. In the case where the semiconductor device 10 is used as a cache memory, a plurality of semiconductor devices 10 having different capacities may be used. For example, three types of semiconductor devices 10 having different capacities can be used as a primary cache, a secondary cache, and a tertiary cache in ascending order of capacity.

<Configuration Example of Memory Block>

Figure 4A:
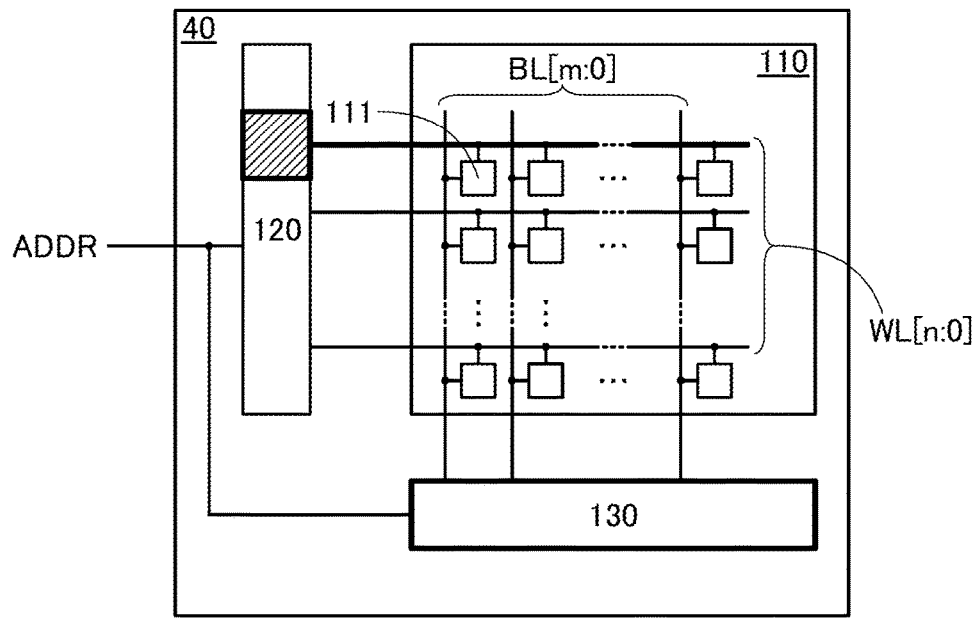
FIGS. 4A and 4B illustrate one embodiment of the present invention.
Figure 4B:
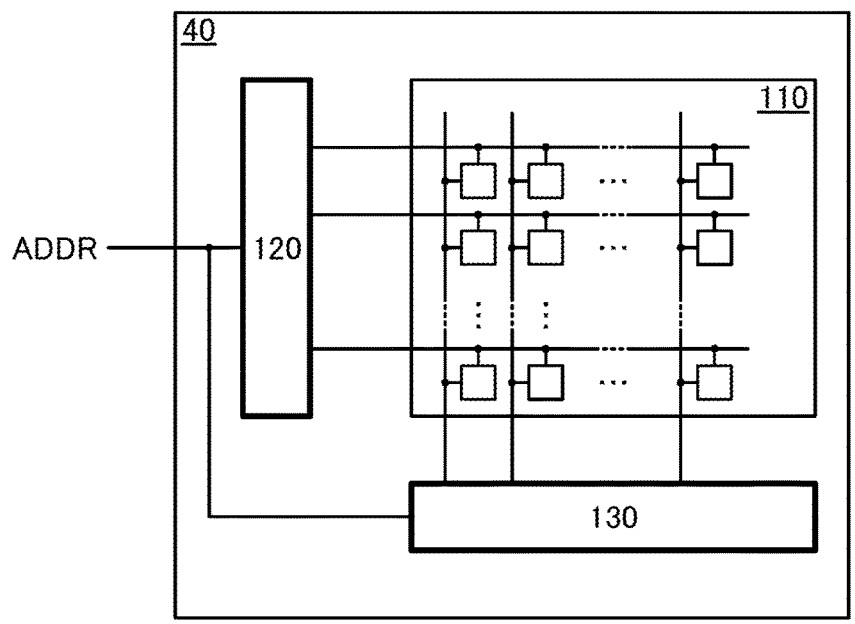

FIGS. 4A and 4B illustrate a configuration example of the memory block 40 illustrated in FIG. 1, FIG. 2, and FIGS. 3A to 3D. The memory block 40 includes a cell array 110, a driver circuit 120, and a driver circuit 130. The cell array 110 includes a plurality of memory cells 111.

Each of the memory cells 111 is a circuit having a function of storing data. Each of the memory cells 111 may store data that has one of two values (high and low levels) or data that has one of three or more values.

Each of the memory cells 111 is connected to a wiring WL and a wiring BL. The wiring WL has a function of transmitting a signal for selecting memory cells 111 in a predetermined row (this signal is hereinafter also referred to as a selection signal). The wiring BL has a function of transmitting a potential corresponding to data to be written to the selected memory cells 111 (this potential is hereinafter also referred to as a write potential). The wiring BL also has a function of transmitting a potential corresponding to data stored in the memory cell 111 (this potential is hereinafter also referred to as a read potential). A configuration example in which the memory block 40 includes n+1 wirings WL (wirings WL[n:0]), m+1 wirings BL (wirings BL[m:0]), and (n+1)×(m+1) memory cells 111 (where n and m are each an integer greater than or equal to 0) will be described here.

Note that the write potential and the read potential may be output to the same wiring BL or different wirings.

A transistor containing an oxide semiconductor in a channel formation region (this transistor is hereinafter also referred to as an OS transistor) is preferably used in the memory cell 111. An oxide semiconductor has a wider band gap and a lower carrier density than other semiconductors such as silicon. Thus, the off-state current of the OS transistor is extremely low. Therefore, when the OS transistor is used in the memory cell 111, data stored in the memory cell 111 can be retained for a long period. In addition, data can be retained even in a period where power supply to the memory block 40 is stopped. Details of the memory cell 111 including the OS transistor will be described in Embodiment 2.

The driver circuit 120 has a function of outputting the selection signal to the wiring WL in accordance with the address signal ADDR. The driver circuit 120 can include a decoder or the like.

The driver circuit 130 has a function of writing data to the memory cell 111 selected in accordance with the address signal ADDR. The driver circuit 130 also has a function of reading data stored in the memory cell 111 selected in accordance with the address signal ADDR. Specifically, the driver circuit 130 has a function of supplying the write potential to the wiring BL and a function of reading data stored in the memory cell 111 from the potential of the wiring BL. The driver circuit 130 may have a function of precharging the wiring BL to a predetermined potential, a function of amplifying the potential of the wiring BL, or the like.

Note that the driver circuits 120 and 130 can be shared with an adjacent memory block 40.

In a period where data is not written to or read from the cell array 110, power supply to the driver circuits 120 and 130 can be stopped. Accordingly, power consumption of the memory block 40 can be reduced.

When a particular memory block 40 is selected in accordance with the address signal ADDR, power is supplied to the driver circuits 120 and 130 of that memory block 40. Specifically, as illustrated in FIG. 4A, power is supplied to the driver circuit 130 and a region of the driver circuit 120 which includes an element for supplying the selection signal to the selected memory cell 111 through the wiring WL (the region is shaded in the diagram). FIG. 4A illustrates a state where the memory cells 111 in the first row are selected and power is supplied to a logic circuit of the driver circuit 120 which is connected to the wiring WL[0]. In this manner, in the driver circuit 120, power can be supplied only to a logic circuit for selecting the memory cells 111 in a particular row, whereby power consumption of the driver circuit 120 can be reduced. Note that it can be said that FIG. 4A illustrates power gating conducted at the spatial granularity of the memory cells 111 in one row.

Note that when a particular memory block 40 is selected in accordance with the address signal ADDR, power may be supplied to the whole driver circuit 120 as illustrated in FIG. 4B. In that case, power gating can be conducted at the spatial granularity of the driver circuit 120. Power gating can also be conducted at the spatial granularity of the memory cells 111 in a plurality of rows. Furthermore, power gating can be conducted in the driver circuit 130 at the spatial granularity of the memory cells 111 in one column or in a plurality of columns. A specific circuit configuration example of the driver circuit 120 will be described later with reference to FIG. 9.

<Configuration Example of Power Switch Circuit>

FIGS. 5A to 5C and FIGS. 6A to 6F each illustrate a configuration example of a circuit provided with a switch for controlling power supply (i.e., a power switch).

Figure 5A:
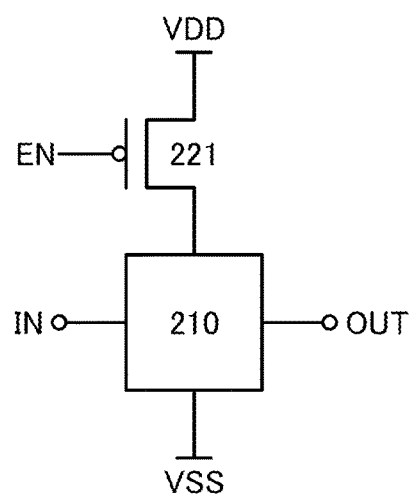
FIGS. 5A to 5C are circuit diagrams each illustrating one embodiment of the present invention.

In FIG. 5A, a circuit 210 is connected to a power switch which controls the power supply. Here, a transistor 221 is used as the power switch.

The circuit 210 is driven using a high power supply potential VDD and a low power supply potential VSS, and its configuration and function are not particularly limited. For example, the circuit 210 may be an arithmetic circuit or a memory circuit. In the case where the circuit 210 is used as an arithmetic circuit, a circuit including a combinational circuit such as an inverter circuit, an AND circuit, a NAND circuit, an OR circuit, or a NOR circuit can be used. Alternatively, the circuit 210 may include a sequential circuit such as a flip-flop circuit or a latch circuit.

The circuit 210 is connected to a wiring supplied with the low power supply potential VSS and to one of a source and a drain of the transistor 221. The other of the source and the drain of the transistor 221 is connected to a wiring supplied with the high power supply potential VDD. A gate of the transistor 221 is connected to a wiring supplied with a signal EN.

When a low-level signal is input as the signal EN, the transistor 221 is turned on, the high power supply potential VDD is supplied to the circuit 210, and thus, the circuit 210 operates. On the other hand, when a high-level signal is input as the signal EN, the transistor 221 is turned off and the supply of the high power supply potential VDD to the circuit 210 is stopped.

As the circuit 210, any of the selection circuits S1 to S3 in FIG. 1, FIG. 2, and FIGS. 3A to 3D, the cell array 110 and the driver circuits 120 and 130 in FIGS. 4A and 4B, and the like can be used. In that case, power supply to any of the selection circuits S1 to S3, the cell array 110, and the driver circuits 120 and 130 can be controlled.

Figure 5B:
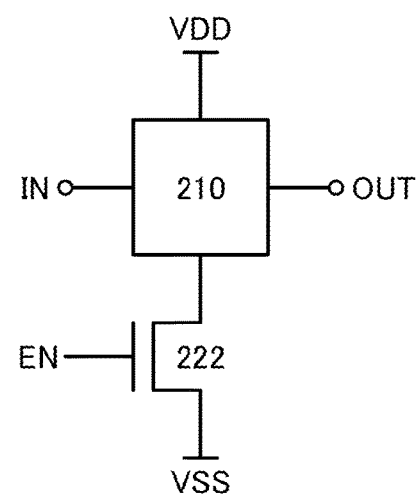

As illustrated in FIG. 5B, a switch may be provided between the circuit 210 and the wiring supplied with the low power supply potential VSS. Here, a transistor 222 is used as the switch. When a low-level signal is input as the signal EN, the transistor 222 is turned on, the low power supply potential VSS is supplied to the circuit 210, and thus, the circuit 210 operates. On the other hand, when a low-level signal is input as the signal EN, the transistor 222 is turned off and the supply of the low power supply potential VSS to the circuit 210 is stopped.

Figure 5C:
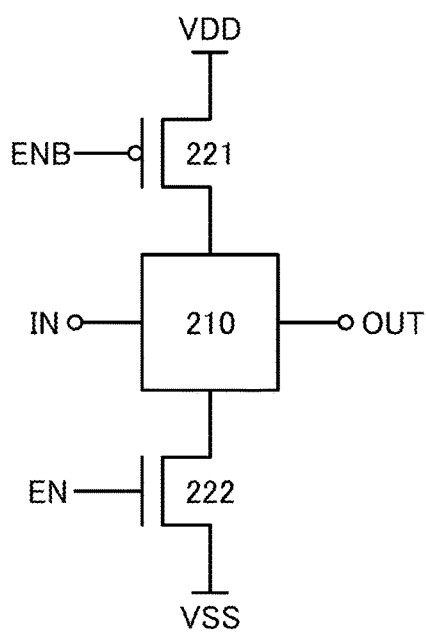

As illustrated in FIG. 5C, switches may be provided between the circuit 210 and the wiring supplied with the high power supply potential VDD and between the circuit 210 and the wiring supplied with the low power supply potential VSS. Here, a signal ENB is an inverted signal of the signal EN. When a high-level signal is input as the signal EN, the high power supply potential VDD and the low power supply potential VSS are supplied to the circuit 210.

Figure 6A:
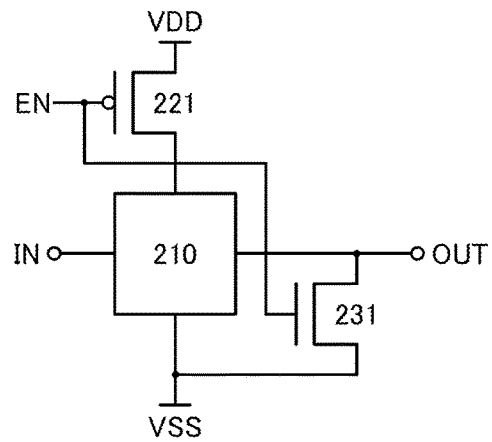
FIGS. 6A to 6F are circuit diagrams each illustrating one embodiment of the present invention.

As illustrated in FIG. 6A, a transistor 231 can be added to the configuration in FIG. 5A. A gate of the transistor 231 is connected to the wiring supplied with the signal EN. One of a source and a drain of the transistor 231 is connected to an output terminal OUT. The other of the source and the drain of the transistor 231 is connected to the wiring supplied with the low power supply potential VSS.

The transistor 231 is in an on state in a period where a high-level signal is input as the signal EN. Thus, the potential of the output terminal OUT can be kept at a low level in a period where power supply to the circuit 210 is stopped. This can prevent the output of the circuit 210 from having an undefined value.

Figure 6B:
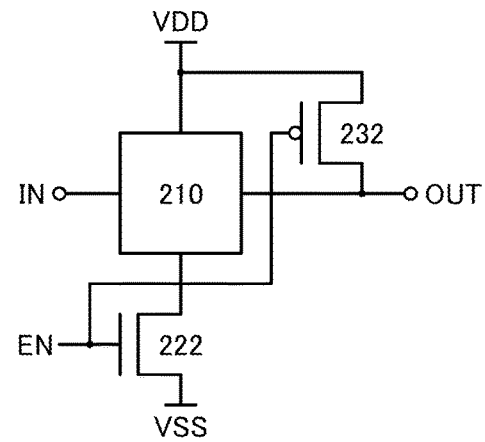

As illustrated in FIG. 6B, a transistor 232 can be added to the configuration in FIG. 5B. A gate of the transistor 232 is connected to the wiring supplied with the signal EN. One of a source and a drain of the transistor 232 is connected to the output terminal OUT. The other of the source and the drain of the transistor 232 is connected to the wiring supplied with the high power supply potential VDD.

The transistor 232 is in an on state in a period where a low-level signal is input as the signal EN. Thus, the potential of the output terminal OUT can be kept at a high level in a period where power supply to the circuit 210 is stopped. This can prevent the output of the circuit 210 from having an undefined value.

Figure 6C:
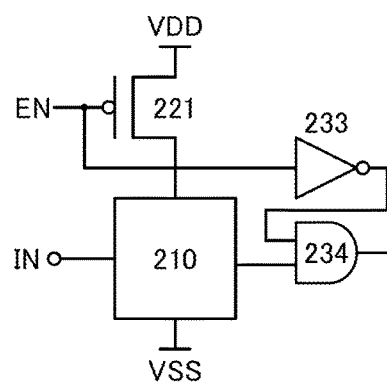
Figure 6D:
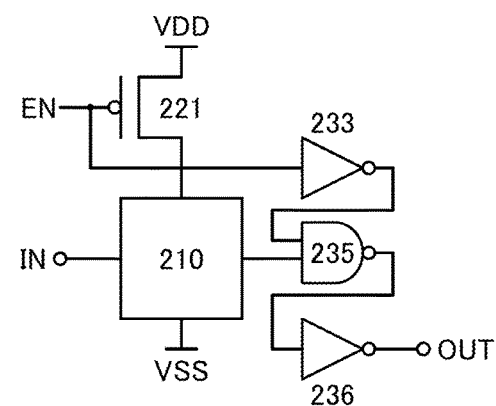

Note that a logic circuit may be provided instead of the transistor 231 in FIG. 6A. FIG. 6C illustrates a configuration in which an inverter 233 and an AND circuit 234 are provided instead of the transistor 231. FIG. 6D illustrates a configuration in which the inverter 233, a NAND circuit 235, and an inverter 236 are provided instead of the transistor 231.

Figure 6E:
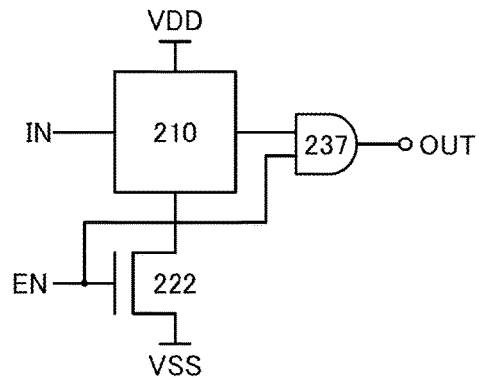
Figure 6F:
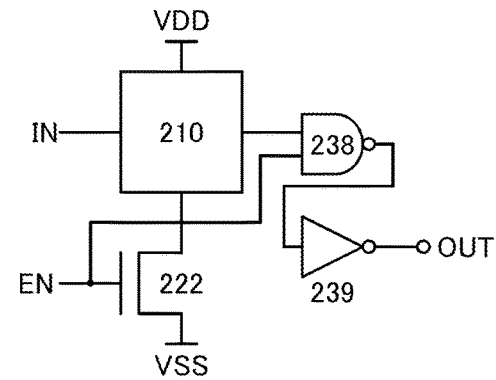

A logic circuit may be provided instead of the transistor 232 in FIG. 6B. FIG. 6E illustrates a configuration in which an AND circuit 237 is provided instead of the transistor 232. FIG. 6F illustrates a configuration in which a NAND circuit 238 and an inverter 239 are provided instead of the transistor 232.

In FIGS. 6C to 6F, the potential of the output terminal OUT can be kept at a low level in a period where power supply to the circuit 210 is stopped. This can prevent the output of the circuit 210 from having an undefined value.

In FIGS. 5A to 5C and FIGS. 6A to 6F, power supply may be stopped by changing the high power supply potential VDD to the low power supply potential VSS. In that case, the circuit 210 is connected to the two wirings supplied with the low power supply potential VSS, and current does not flow to the circuit 210. Similarly, in FIGS. 5A to 5C and FIGS. 6A to 6F, power supply may be stopped by changing the low power supply potential VSS to the high power supply potential VDD.

A material of the transistors in FIGS. 5A to 5C and FIGS. 6A to 6F (such as the transistors 221, 222, 231, and 232 and transistors included in the inverter, the AND circuit, and the NAND circuit) is not particularly limited, and for example, OS transistors can be used. In particular, when OS transistors are used as the transistors 221 and 222, power consumption can be extremely low in a period where the transistors 221 and 222 are turned off and power supply is stopped.

OS transistors can be stacked over other transistors. Thus, the transistors in FIGS. 5A to 5C and FIGS. 6A to 6F can be stacked over transistors included in the circuit 210, so that an increase in area due to the presence of the power switch can be suppressed.

As each of the transistors in FIGS. 5A to 5C and FIGS. 6A to 6F, a transistor whose channel formation region is formed in part of a substrate including a single crystal semiconductor (the transistor is hereinafter also referred to as a single crystal transistor) may be used. As the substrate including a single crystal semiconductor, a single crystal silicon substrate, a single crystal germanium substrate, or the like can be used. Since a single crystal transistor can operate at a high speed, when single crystal transistors are used as the transistors 221 and 222, power supply can be switched at a high speed.

As each of the transistors in FIGS. 5A to 5C and FIGS. 6A to 6F, a transistor whose channel formation region is formed in a film including a semiconductor material other than an oxide semiconductor can also be used. For example, a transistor whose channel formation region includes a non-single-crystal semiconductor can be used. As the non-single-crystal semiconductor, non-single-crystal silicon such as amorphous silicon, microcrystalline silicon, or polycrystalline silicon, non-single-crystal germanium such as amorphous germanium, microcrystalline germanium, or polycrystalline germanium, or the like can be used.

<Configuration Example of Circuit 210>

Next, specific configuration examples of the circuit 210 will be described with reference to FIGS. 7A and 7B and FIGS. 8A and 8B.

Figure 7A:
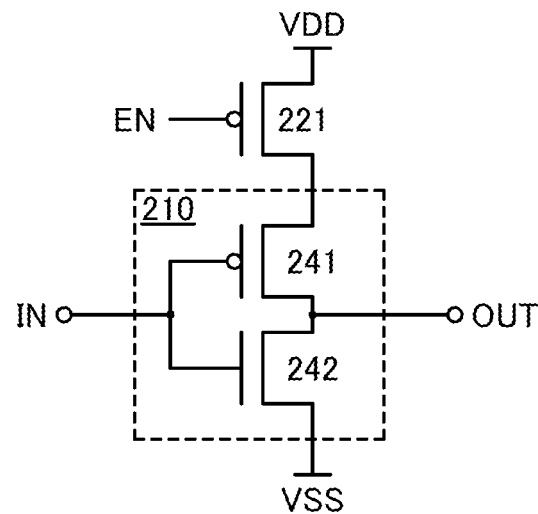
FIGS. 7A and 7B are circuit diagrams each illustrating one embodiment of the present invention.

FIG. 7A illustrates a configuration in which the circuit 210 in FIG. 5A is an inverter. The circuit 210 includes transistors 241 and 242.

A gate of the transistor 241 is connected to an input terminal IN. One of a source and a drain of the transistor 241 is connected to the one of the source and the drain of the transistor 221. The other of the source and the drain of the transistor 241 is connected to one of a source and a drain of the transistor 242. A gate of the transistor 242 is connected to the input terminal IN. The other of the source and the drain of the transistor 242 is connected to the wiring supplied with the low power supply potential VSS. Although the configuration in which the circuit 210 in FIG. 5A is the inverter is described here, any of the circuits 210 in FIGS. 5B and 5C and FIGS. 6A to 6F may be an inverter.

Figure 7B:
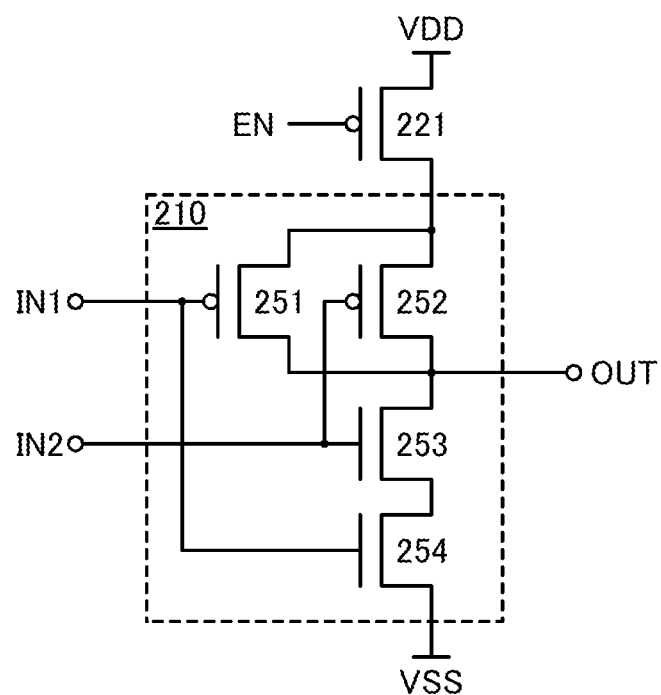

FIG. 7B illustrates a configuration in which the circuit 210 in FIG. 5A is a NAND circuit. The circuit 210 includes transistors 251, 252, 253, and 254.

A gate of the transistor 251 is connected to an input terminal IN1. One of a source and a drain of the transistor 251 is connected to one of a source and a drain of the transistor 252 and the one of the source and the drain of the transistor 221. The other of the source and the drain of the transistor 251 is connected to the other of the source and the drain of the transistor 252 and one of a source and a drain of the transistor 253. A gate of the transistor 252 is connected to an input terminal IN2. A gate of the transistor 253 is connected to the input terminal IN2. The other of the source and the drain of the transistor 253 is connected to one of a source and a drain of the transistor 254. A gate of the transistor 254 is connected to the input terminal IN1. The other of the source and the drain of the transistor 254 is connected to the wiring supplied with the low power supply potential VSS. Although the configuration in which the circuit 210 in FIG. 5A is the NAND circuit is described here, any of the circuits 210 in FIGS. 5B and 5C and FIGS. 6A to 6F can be a NAND circuit.

The circuit 210 in FIG. 7A or 7B can be used as any of the selection circuits S1 to S3 in FIG. 1, FIG. 2, and FIGS. 3A to 3D, the cell array 110 and the driver circuits 120 and 130 in FIGS. 4A and 4B, and the like. In addition, an AND circuit can be formed by combining the inverter in FIG. 7A with the NAND circuit in FIG. 7B.

Figure 8A:
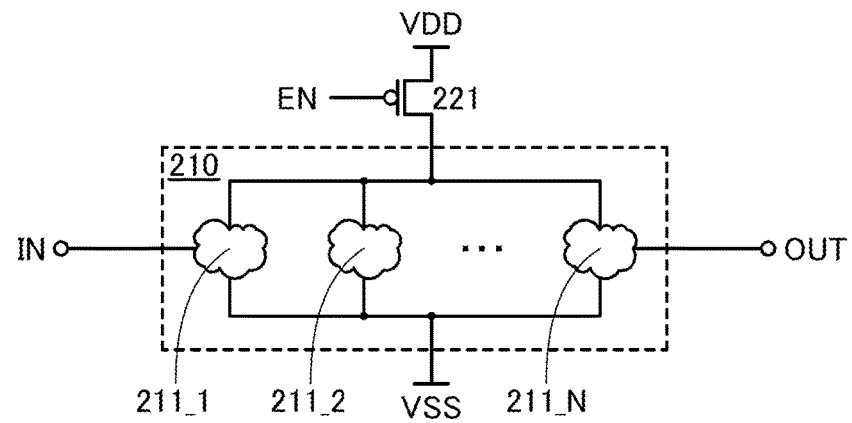
FIGS. 8A and 8B are circuit diagrams each illustrating one embodiment of the present invention.
Figure 8B:
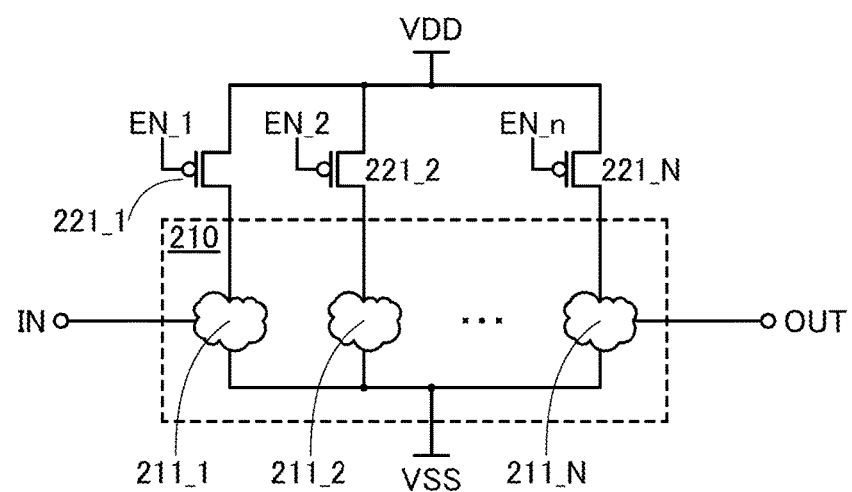

Note that any of the circuits 210 in FIGS. 5A to 5C and FIGS. 6A to 6F may be formed using a plurality of logic elements. FIGS. 8A and 8B each illustrate a configuration in which the circuit 210 in FIG. 5A includes a plurality of logic circuits 211.

The circuit 210 in FIG. 8A includes N logic circuits 211 (logic circuits 211_1 to 211_N) (where N is a natural number). Each of the logic circuits 211 is connected to the wiring supplied with the high power supply potential VDD through the transistor 221. Each of the logic circuits 211 is also connected to the wiring supplied with the low power supply potential VSS. When a low-level signal is supplied as the signal EN, the high power supply potential VDD is supplied to the logic circuits 211_1 to 211_N. Accordingly, power supply to the logic circuits 211_1 to 211_N can be collectively controlled.

The logic circuit 211 may include a combinational circuit such as an inverter circuit, an AND circuit, a NAND circuit, an OR circuit, or a NOR circuit or a sequential circuit such as a flip-flop circuit or a latch circuit.

As illustrated in FIG. 8B, the logic circuits 211 may be provided with respective transistors 221. In that case, power supply to each of the logic circuits 211 can be controlled separately.

Note that in each of the circuits 210 in FIGS. 8A and 8B, the output terminal of one logic circuit 211 may be connected to the input terminal of another logic circuit 211. This allows the logic circuits 211 to be combined to form a logic circuit.

Each of the circuits 210 in FIGS. 8A and 8B can be used as any of the circuits 210 in FIGS. 5B and 5C and FIGS. 6A to 6F.

<Configuration Example of Driver Circuit>

A configuration example in which the driver circuit 120 in FIGS. 4A and 4B is provided with a power switch will be described.

Figure 9:
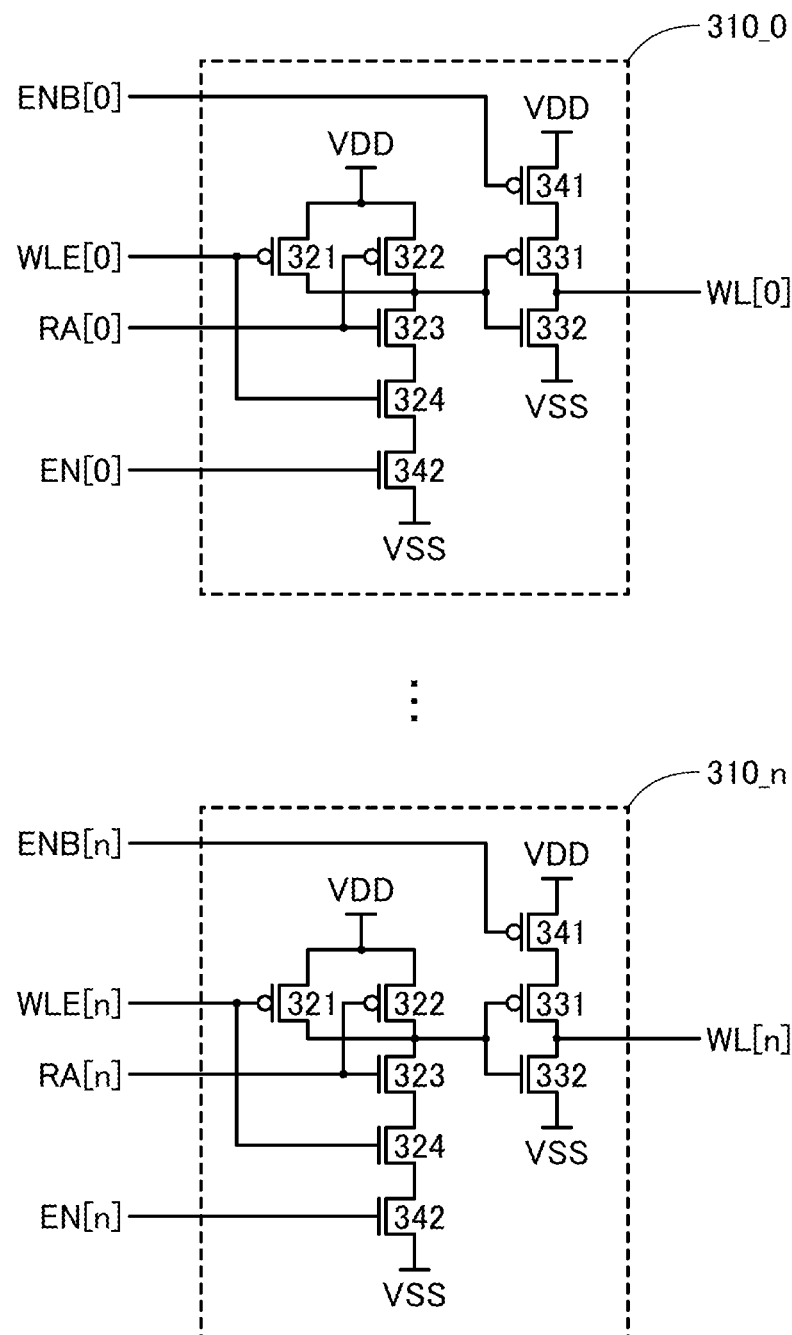
FIG. 9 is a circuit diagram illustrating one embodiment of the present invention.

FIG. 9 illustrates a configuration example of the driver circuit 120 which enables power gating of circuits connected to each of the wirings WL to be conducted separately as illustrated in FIG. 4A. The driver circuit 120 includes logic circuits 310_0 to 310_n, and the wirings WL are provided with the respective logic circuits 310. In addition, the wirings WL are connected to a plurality of memory cells (not illustrated).

The logic circuits 310 each include transistors 321 to 324, transistors 331 and 332, and transistors 341 and 342. Note that the transistors 321 to 324 correspond to the transistors 251 to 254 in FIG. 7B and form a NAND circuit. The transistors 331 and 332 correspond to the transistors 241 and 242 in FIG. 7A and form an inverter. The logic circuits 310 each have the configuration of an AND circuit.

A signal RA corresponds to the selection signal which is output to the wiring WL. The selection signal is output to the wiring WL when a signal WLE is set at a high level in a state where the signal RA is input.

The transistor 341 is provided between the transistor 331 and the wiring supplied with the high power supply potential VDD, and has a function of controlling the supply of the high power supply potential VDD to the logic circuit 310. The transistor 342 is provided between the transistor 324 and the wiring supplied with the low power supply potential VSS, and has a function of controlling the supply of the low power supply potential VSS to the logic circuit 310. The transistor 341 and the transistor 342 have functions similar to those of the transistor 221 and the transistor 222 in FIGS. 5A to 5C, respectively.

Since each of the logic circuits 310 is provided with the transistors 341 and 342 as described above, power gating of each of the logic circuits 310 can be conducted separately. Accordingly, power can be supplied only to the logic circuit 310 corresponding to the wiring WL selected, and fine-grained power gating can be conducted at the spatial granularity of the memory cells 111 in one row (see FIG. 4A).

Figure 10:
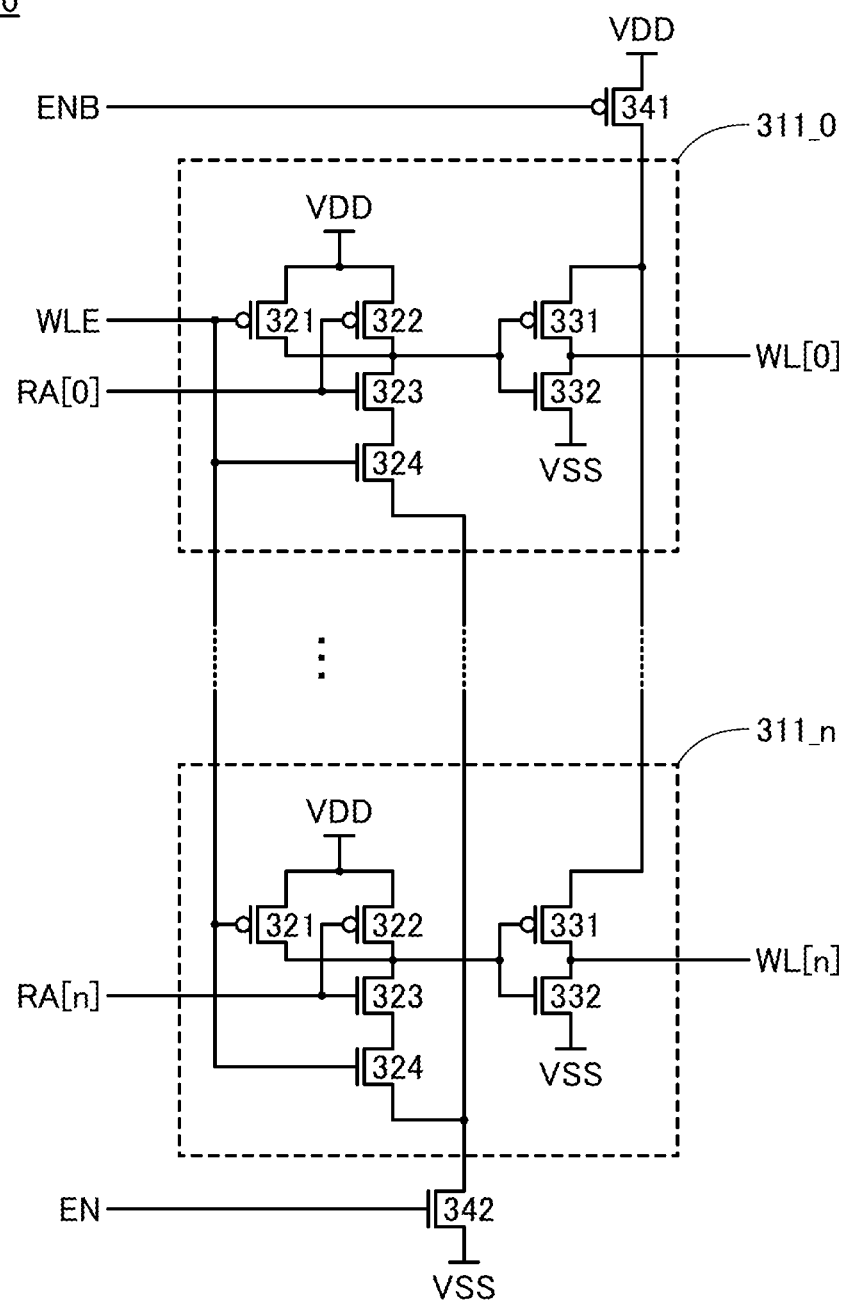
FIG. 10 is a circuit diagram illustrating one embodiment of the present invention.

In a configuration in which the wirings WL are provided with respective logic circuits 311 for controlling the wirings WL as illustrated in FIG. 10, the wiring supplied with the high power supply potential VDD and the wiring supplied with the low power supply potential VSS may be shared by the logic circuits 311_1 to 311_n, and the transistor 341 connected to the wiring supplied with the high power supply potential VDD and the transistor 342 connected to the wiring supplied with the low power supply potential VSS may be provided. In that case, power supply to the logic circuits 311_1 to 311_n can be collectively controlled. Therefore, power gating of the whole driver circuit 120 can be conducted as illustrated in FIG. 4B. Note that in FIG. 10, the selection signal is output to the wirings WL[0] to WL[n] when the signal WLE is set at a high level in a state where the signals RA[0] to RA[n] are input.

Each of the driver circuit 120 in FIGS. 9 and 10 may include any of the configurations of FIGS. 5A to 5C and FIGS. 6A to 6F. For example, one of the transistors 341 and 342 can be eliminated. Power gating may be conducted with a transistor provided between the transistors 321 and 322 and the wiring connected to the transistors 321 and 322 and supplied with the high power supply potential VDD, in addition to the transistor 341 or instead of the transistor 341. Furthermore, power gating may be conducted with a transistor provided between the transistor 332 and the wiring connected to the transistor 332 and supplied with the low power supply potential VSS, in addition to the transistor 342 or instead of the transistor 342.

<Power Switch Enable Generation Circuit>

Figure 11A:
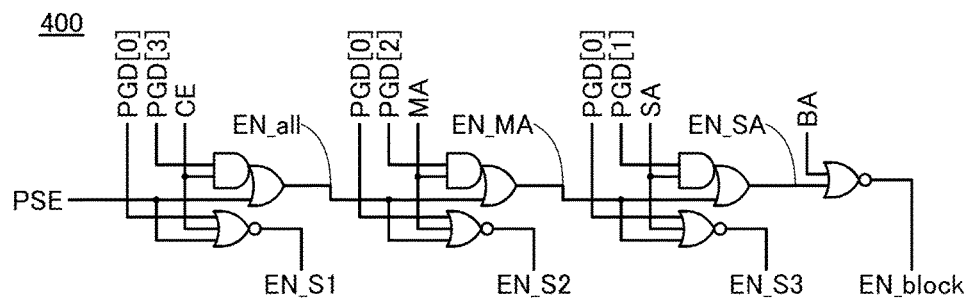
FIGS. 11A to 11C are circuit diagrams each illustrating one embodiment of the present invention.
Figure 11B:
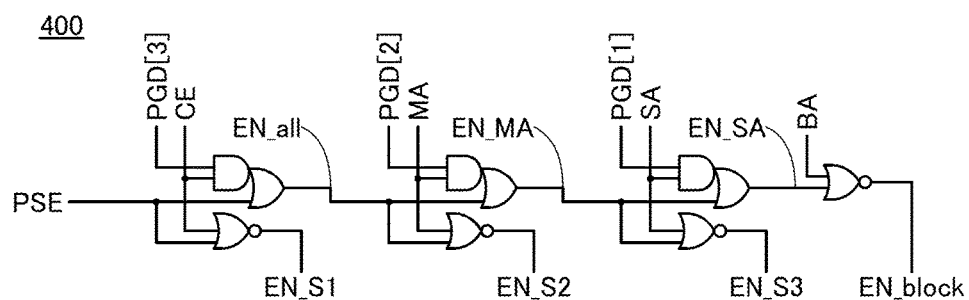
Figure 11C:
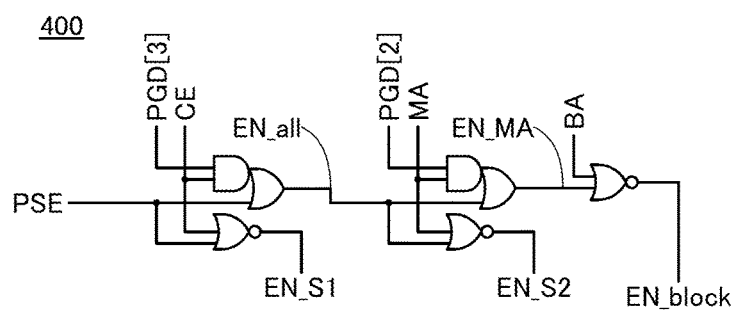

FIGS. 11A to 11C each illustrate a configuration example of a circuit (a power switch enable generation circuit) for outputting a control signal to a power switch which controls power supply to any one of the selection circuits S1 to S3 in FIG. 1, FIG. 2, and FIGS. 3A to 3D or a power switch which controls power supply to any one of the circuits (such as the driver circuits 120 and 130, see FIGS. 4A and 4B) inside the memory block 40. Note that FIGS. 5A to 5C, FIGS. 6A to 6F, FIGS. 7A and 7B, FIGS. 8A and 8B, FIG. 9, and FIG. 10 can be referred to for the configuration of each of the power switches provided for the selection circuits S1 to S3 and the driver circuits 120 and 130.

FIG. 11A illustrates a configuration example of a circuit 400 configured to generate a signal for controlling the power switch. The circuit 400 includes AO circuits (AND circuits and OR circuits) and NOR circuits. The circuit 400 has a function of outputting signals EN_S1 to EN_S3 and a signal EN_block which are input to power switches, in accordance with signals PGD[0] to PGD[3] and signals PSE, CE, MA, SA, and BA.

The signals PGD[0] to PGD[3] are used to determine the spatial granularity of power gating. The signals PGD[0] to PGD[3] may be input using hardware or software (a system) in accordance with the content of a program to be executed.

The signals CE, MA, SA, and BA are selection signals which are input to the semiconductor device 10, the selection circuit S1, the selection circuit S2, and the selection circuit S3 as illustrated in FIGS. 3A to 3D, respectively.

The signal PSE is used to supply power to the whole semiconductor device 10, regardless of the signals PGD[3:0] and the signals CE, MA, SA, and BA which are input to the circuit 400.

The signals EN_S1 to EN_S3 are selection signals supplied to the power switches of the selection circuits S1 to S3. The signal EN_block is a selection signal supplied to any of the power switches provided in the circuits (such as the driver circuits 120 and 130, see FIGS. 4A and 4B) inside the memory block 40 selected in accordance with the address signal.

As illustrated, the AO circuits of the circuit 400 output signals EN_all, EN_MA, and EN_SA from their respective output terminals, and the NOR circuit to which the signal BA is input outputs the signal EN_block from its output terminal. The signals EN_all, EN_MA, EN_SA, and EN_block correspond to a control signal for selecting the whole semiconductor device 10, a control signal for selecting a specific macro 20, a control signal for selecting a specific subarray 30, and a control signal for selecting a specific memory block 40, respectively.

Note that a configuration example is described here in which power switches provided for the selection circuits S1 to S3 and the circuits (such as the driver circuits 120 and 130) inside the memory block 40 are p-channel transistors like the transistors 221 in FIGS. 5A and 5C and FIGS. 6A, 6C, and 6D. That is, when low-level signals are input as the signals EN_S1 to EN_S3 and the signal EN_block, the power switches are turned on and power is supplied.

Table 1 shows correspondences between the signals PGD[0] to PGD[3], the signal PSE, and the range of power gating. Note that the letter "X" in Table 1 denotes an undefined value, and the numbers "1" and "0" correspond to high-level and low-level signals, respectively.

TABLE 1

| PSE | PGD [3:0] | Power gating |
| --- | --- | --- |
| 0 | 000X | Each memory block |
| 0 | 001X | Each subarray |
| 0 | 01XX | Each macro |
| 0 | 1XXX | Each access |
| 0 | XXX1 | Selection circuit constantly ON |
| 1 | XXXX | Entirely ON |
| 0 | 0000 | Entirely OFF |

When the semiconductor device 10 is selected, the signal CE is set at a high level, and the signals MA, SA, and BA which are input to the macro 20, the subarray 30, and the memory block 40 selected in accordance with the address signal ADDR are set at high levels. Accordingly, the signals EN_S1 to EN_S3 are set at a low level, and power is supplied to the selection circuits S1 to S3.

In the case where power gating of each of the memory blocks 40 is conducted separately, the signal PSE is set at a low level and the signals PGD[1] to PGD[3] are set at a low level. At that time, each of the signals EN_all, EN_MA, and EN_SA is at a low level. Therefore, the signal EN_block at a low level is output only to the memory block 40 selected by the selection circuit S3 to which the signal BA at a high level is input. Accordingly, the power switch provided for the circuit inside the selected memory block 40 is turned on and power is supplied. In other words, power gating can be conducted at the spatial granularity of the memory blocks 40.

In the case where power gating of each of the subarrays 30 is conducted separately, the signal PSE is set at the low level, the signal PGD[1] is set at a high level, and the signals PGD[2] and PGD[3] are set at the low level. At that time, when the signal SA is at the high level, the signal EN_SA is at a high level. Therefore, the signal EN_block at the low level is output to the subarray 30 selected by the selection circuit S2 to which the signal SA is input, regardless of the signal BA. Accordingly, power is supplied to all the memory blocks 40 in the subarray 30 selected by the selection circuit S2. In other words, power gating can be conducted at the spatial granularity of the subarrays 30.

In the case where power gating of each of the macros 20 is conducted separately, the signal PSE is set at the low level, the signal PGD[2] is set at a high level, and the signal PGD[3] is set at the low level. At that time, when the signal MA is at a high level, the signal EN_MA is at a high level and the signal EN_SA is also at a high level. Therefore, the signal EN_block at the low level is output to the macro 20 selected by the selection circuit S1 to which the signal MA is input, regardless of the signals SA and BA. Accordingly, power is supplied to all the memory blocks 40 in the macro 20 selected by the selection circuit S1. In other words, power gating can be conducted at the spatial granularity of the macros 20.

In the case where power is supplied to all the memory blocks 40 in the semiconductor device 10 every time the semiconductor device 10 is accessed and the address signal ADDR is input, the signal PGD[3] is set at the high level in a state where the signal PSE is at the low level. At that time, when the signal CE is at the high level, the signal EN_all is at a high level and the signals EN_MA and EN_SA are also at high levels. Therefore, in the case where the signal CE is input, the signal EN_block at the low level is output regardless of the signals MA, SA, and BA. Accordingly, power is supplied to all the memory blocks 40 included in the semiconductor device 10. In other words, power gating can be conducted at the spatial granularity of the semiconductor device 10.

When the signal PGD[0] is at a high level, the signals EN_S1 to EN_S3 are at the low level regardless of the signals PGD[1] to PGD[3] and the signals CE, MA, SA, and BA, and power is supplied to the selection circuits S1 to S3. In other words, the semiconductor device 10 can be set in a mode in which power is constantly supplied to the selection circuits S1 to S3. The selection circuits S1 to S3 do not need to be provided for each of the wirings WL and the wirings BL inside the memory block 40, and the proportion of power consumption of the selection circuits S1 to S3 to the total power consumption of the semiconductor device 10 is relatively small. Therefore, an increase in power consumption is small even when the selection circuits S1 to S3 are constantly in an on state. In the case where the semiconductor device 10 should be capable of operating at a high speed, a decrease in operation speed due to switching of power supply to the selection circuits S1 to S3 can be prevented by setting the semiconductor device 10 in the mode in which power is constantly supplied to the selection circuits S1 to S3.

When the signal PSE is set at a high level, power can be supplied to all the memory blocks 40 and the selection circuits S1 to S3 which are included in the semiconductor device 10, regardless of the signals PGD[0] to PGD[3] and the signals CE, MA, SA, and BA. This corresponds to a mode in which power gating is not conducted in the semiconductor device 10. In that case, switching of power supply to the semiconductor device 10 does not need to be performed; therefore, the operation frequency and the operation speed of the semiconductor device 10 can be increased. Setting the signal PSE at the high level is effective when a program which requires high-speed processing is executed, for example.

To stop power supply to all the memory blocks 40 and the selection circuits S1 to S3 which are included in the semiconductor device 10, the signals PGD[0] to PGD[3] are set at the low level.

Although the signal PGD is a signal of 4 bits in FIG. 11A, the signal PGD can be a signal of 3 bits or less. For example, in the case where the mode in which power is constantly supplied to the selection circuits S1 to S3 is not employed, the wiring through which the signal PGD[0] is input can be eliminated as illustrated in FIG. 11B. In the case where the mode in which power gating of each of the subarrays 30 is conducted separately is not employed, the wirings through which the signal PGD[1] and the signal SA are input can be eliminated as illustrated in FIG. 11C, so that the number of AND, OR, and NOR circuits can be reduced. Similarly, in the case in which the mode where power gating of each of the macros 20 is conducted separately is not employed, the wirings through which the signal PGD[2] and the signal MA are input can be eliminated. In the case where the mode in which power gating of each of the memory blocks 40 is conducted separately is not employed, the wirings through which the signal PGD[0] and the signal BA are input can be eliminated.

As described above, the semiconductor device 10 according to one embodiment of the present invention includes the selection circuit S1 connected to a plurality of memory circuits 20, the selection circuit S2 connected to a plurality of memory circuits 30, and the selection circuit S3 connected to a plurality of memory circuits 40, thereby being capable of conducting power gating of each of the memory circuits 20, each of the memory circuits 30, or each of the memory circuits 40 separately. Accordingly, the memory circuits 40 to which data is not written or from which data is not read can be kept in a state where power supply thereto is stopped, so that power consumption of the semiconductor device 10 can be reduced.

Note that one embodiment of the present invention is not limited to the above configurations. In other words, since various embodiments of the invention are described in this embodiment, one embodiment of the present invention is not limited to a particular embodiment. The semiconductor device in which power gating of each of the memory circuits 20, each of the memory circuits 30, or each of the memory circuits 40 can be conducted separately is described above as an example of one embodiment of the present invention. However, depending on circumstances or conditions, power gating of the whole semiconductor device 10 may or may not be conducted in one embodiment of the present invention.

This embodiment can be combined with any of the other embodiments as appropriate. Therefore, what is described (or part thereof) in an embodiment can be applied to, combined with, or replaced with another content in the same embodiment and/or what is described (or part thereof) in another embodiment or other embodiments. Note that in each embodiment, a content described in the embodiment is a content described with reference to a variety of diagrams or a content described with text disclosed in this specification. In addition, by combining a diagram (or may be part of the diagram) described in one embodiment with another part of the diagram, a different diagram (or may be part of the different diagram) described in the embodiment, and/or a diagram (or may be part of the diagram) described in one or a plurality of different embodiments, much more diagrams can be formed. The same applies to the following embodiments.

Embodiment 2

In this embodiment, configuration examples of a memory cell of one embodiment of the present invention will be described. Configurations of the memory cell 111 including an OS transistor will be described below.

FIG. 12A illustrates a configuration example of the memory block 40. Note that the memory block 40 in FIG. 12A corresponds to the memory block 40 in FIGS. 4A and 4B. The cell array 110 includes the (n+1)×(m+1) memory cells 111 (memory cells [0,0] to [n,m]).

In one embodiment of the present invention, power supply to the cell array 110 and the driver circuits 120 and 130 can be stopped in a period where the memory cells 111 are not selected. Therefore, the memory cells 111 are preferably capable of retaining data even in a period where power is not supplied.

An OS transistor is preferably used as a transistor in the memory cell 111 because of its extremely low off-state current. Specifically, as illustrated in FIG. 12B, the memory cell 111 is preferably provided with a transistor 112 which is an OS transistor and a capacitor 113. In the drawing, a transistor indicated by "OS" is an OS transistor.

One of a source and a drain of the transistor 112 is connected to the capacitor 113. Here, a node which is connected to the one of the source and the drain of the transistor 112 and the capacitor 113 is referred to as a node N1.

A potential to be retained in the memory cell 111 is supplied to the node N1 from a wiring BL or the like through the transistor 112. When the transistor 112 is in an off state, the node N1 is in a floating state and thus the potential of the node N1 is retained. Since the off-state current of the transistor 112 which is an OS transistor is extremely low, the potential of the node N1 can be retained for a long period. Note that whether the transistor 112 is turned on or off can be controlled by supply of a predetermined potential to a wiring which is connected to a gate of the transistor 112.

The potential retained at the node N1 may be one of two (high- and low-level) potentials or three or more potentials. In the case where one of three or more potentials is retained at the node N1, the differences between the potentials to be retained are particularly narrow, and therefore slight leakage of charge might cause a change in data. However, since the off-state current of an OS transistor is extremely low, leakage of charge from the node N1 can be significantly suppressed. Therefore, the transistor 112 is preferably an OS transistor particularly in the case where one of three or more potentials is to be retained at the node N1.

In addition, the OS transistor has a higher withstand voltage than a transistor whose channel formation region contains silicon (the transistor is hereinafter also referred to as a Si transistor) or the like. Therefore, when the transistor 112 is the OS transistor, the range of potentials to be retained at the node N1 can be widened. Accordingly, the number of data values to be retained in the memory cell 111 can be increased. For example, one of 16 potentials can be retained at the node N1. In that case, 4-bit data can be stored in the memory cell 111.

Note that the OS transistor may include a back gate. FIGS. 12C and 12D each illustrate an example where the transistor 112 includes a back gate. The back gate of the transistor 112 in FIG. 12C is connected to the front gate of the transistor 112. The back gate of the transistor 112 in FIG. 12D is connected to a wiring supplied with a predetermined potential.

With the use of the OS transistor in the memory cell 111 in such a manner, a highly reliable semiconductor device in which data stored in the memory cell 111 can be retained for a long period can be provided. Specific configuration examples of the memory cell 111 will be described below.

<Configuration Example 1 of Memory Cell>

Figure 13A:
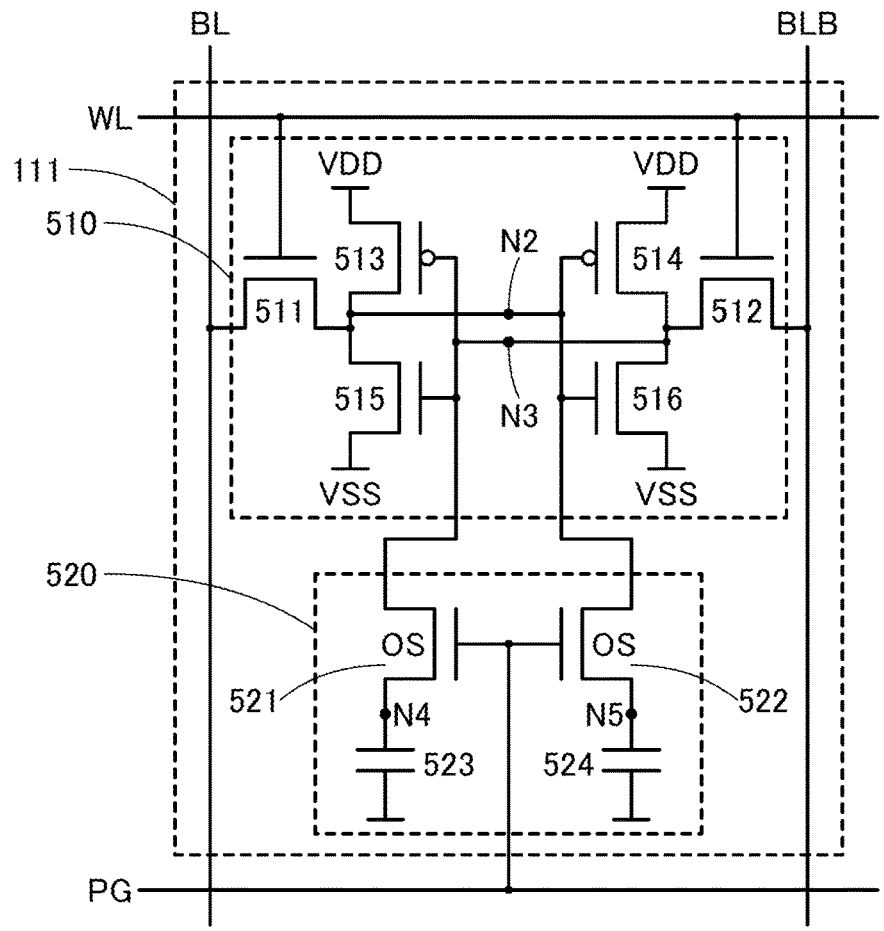
FIGS. 13A and 13B are circuit diagrams each illustrating one embodiment of the present invention.

FIG. 13A illustrates a configuration example of the memory cell 111. The memory cell 111 includes a circuit 510 and a circuit 520.

The circuit 510 includes transistors 511 to 516. The transistors 511, 512, 515, and 516 are n-channel transistors, and the transistors 513 and 514 are p-channel transistors. Note that the transistors 511 and 512 may each be either an n-channel transistor or a p-channel transistor.

A gate of the transistor 511 is connected to the wiring WL. One of a source and a drain of the transistor 511 is connected to one of a source and a drain of the transistor 513, one of a source and a drain of the transistor 515, a gate of the transistor 514, and a gate of the transistor 516. The other of the source and the drain of the transistor 511 is connected to the wiring BL. A gate of the transistor 512 is connected to the wiring WL. One of a source and a drain of the transistor 512 is connected to one of a source and a drain of the transistor 514, one of a source and a drain of the transistor 516, a gate of the transistor 513, and a gate of the transistor 515. The other of the source and the drain of the transistor 512 is connected to a wiring BLB. The other of the source and the drain of the transistor 513 and the other of the source and the drain of the transistor 514 are each connected to the high-potential power supply line VDD. The other of the source and the drain of the transistor 515 and the other of the source and the drain of the transistor 516 are each connected to the low-potential power supply line VSS. A node which is connected to the gate of the transistor 513 and the gate of the transistor 515 is referred to as a node N3, and a node which is connected to the gate of the transistor 514 and the gate of the transistor 516 is referred to as a node N2.

The wiring WL has a function of transmitting the selection signal, the wiring BL has a function of transmitting the write potential or the read potential, and the wiring BLB has a function of transmitting an inverted signal of the signal supplied to the wiring BL. The wiring BLB may be connected to the driver circuit 130 or may be connected to the wiring BL through an inverter or the like.

The circuit 510 has the configuration of a static random access memory (SRAM) cell, which is a volatile memory cell. The node N2 and the node N3 each correspond to a node at which charge corresponding to the data written to the memory cell 111 is retained.

The circuit 520 includes transistors 521 and 522 and capacitors 523 and 524. Here, the transistors 521 and 522 are OS transistors.

A gate of the transistor 521 is connected to a wiring PG, one of a source and a drain of the transistor 521 is connected to one electrode of the capacitor 523, and the other of the source and the drain of the transistor 521 is connected to the node N3. A gate of the transistor 522 is connected to the wiring PG, one of a source and a drain of the transistor 522 is connected to one electrode of the capacitor 524, and the other of the source and the drain of the transistor 522 is connected to the node N2. The other electrode of the capacitor 523 and the other electrode of the capacitor 524 are each connected to a wiring to which a predetermined potential is supplied. The wiring to which a predetermined potential is supplied may be either a high-potential power supply line or a low-potential power supply line (e.g., a ground line). Alternatively, potentials supplied to the wiring may be switched. A node which is connected to the one of the source and the drain of the transistor 521 and the one electrode of the capacitor 523 is referred to as a node N4, and a node which is connected to the one of the source and the drain of the transistor 522 and the one electrode of the capacitor 524 is referred to as a node N5.

The wiring PG has a function of selecting the memory cell 111 to which data is to be backed up. As for the signal supplied to the wiring WL and the signal supplied to the wiring PG, one signal may depend on the other signal, or they may be independent signals. When the wiring PG is connected to the driver circuit 120, the potential of the wiring PG can be controlled by the driver circuit 120.

In the memory cell 111, the node N2 corresponding to the node at which data is retained is connected to the node N5 through the transistor 522 which is the OS transistor. Similarly, in the memory cell 111, the node N3 corresponding to the node at which data is retained is connected to the node N4 through the transistor 521 which is an OS transistor. Thus, the data retained in the circuit 510, which has the configuration of an SRAM cell, can be backed up to the node N4 and the node N5. Furthermore, the data that has been backed up can be restored to the circuit 510.

Specifically, in a period where no data is written to or read from the circuit 510, the potential of the wiring PG is set to the high level to turn on the transistors 521 and 522, whereby the data retained at the node N2 and the data retained at the node N3 can be backed up to the node N5 and the node N4, respectively. After that, the potential of the wiring PG is set to the low level to turn off the transistors 521 and 522, whereby the potentials of the nodes N4 and N5 can be retained. Then, the potential of the wiring PG is set to the high level again to turn on the transistors 521 and 522, whereby the data that have been backed up to the nodes N4 and N5 can be restored to the nodes N2 and N3.

Here, the transistors 521 and 522 are OS transistors and have extremely low off-state current. Therefore, when the transistors 521 and 522 are in the off state, the potential of the node N4 and the potential of the node N5 can be retained for a long time. Therefore, by backing up the data retained at the nodes N2 and N3 to the nodes N4 and N5 immediately before power supply to the memory cell 111 is stopped, the data stored in the memory cell 111 can be retained even when the power supply to the memory cell 111 is stopped. After the power supply to the memory cell 111 is restarted, the data retained at the nodes N4 and N5 can be restored to the nodes N2 and N3.

Since the memory cell 111 has the configuration of an SRAM cell, the transistors 511 to 516 are required to operate at high speed. Therefore, Si transistors or the like are preferably used as the transistors 511 to 516. Note that the transistors 511 to 516 are not limited to such transistors and may be OS transistors.

In addition, in a period where power is supplied to the memory cell 111 and the circuit 510 operates as an SRAM cell, the transistors 521 and 522 are preferably in the off state. This can prevent a decrease in operation speed of the circuit 510.

Although FIG. 13A illustrates an example in which the circuit 520 includes the transistors 521 and 522 and the capacitors 523 and 524, the transistor 521 and the capacitor 523 may be omitted, or the transistor 522 and the capacitor 524 may be omitted.

In FIG. 13A, an SRAM cell including six transistors, which is a volatile memory cell, is used as the circuit 510; however, the configuration is not limited thereto, and a different volatile memory cell may be used as the circuit 510. Also in the case where a different volatile memory cell is used, an OS transistor and a capacitor which are connected thereto as illustrated in FIG. 13A make it possible to back up and restore the data.

In the above-described manner, in the memory cell 111, data stored in the circuit 510 is backed up to and retained by the circuit 520; thus, the data can be retained even in a period where power is not supplied to the memory cell 111. Furthermore, after the power supply is restarted, the data retained by the circuit 520 can be restored to the circuit 510. Accordingly, the power supply to the memory cell 111 can be stopped in the data retention period, which can reduce the power consumption.

Moreover, as described later, an OS transistor can be stacked over a Si transistor. Therefore, the circuit 520 can be stacked over the circuit 510. Accordingly, an increase in the area of the memory cell 111 due to the presence of the circuit 520 can be suppressed.

<Configuration Example 2 of Memory Cell>

Figure 13B:
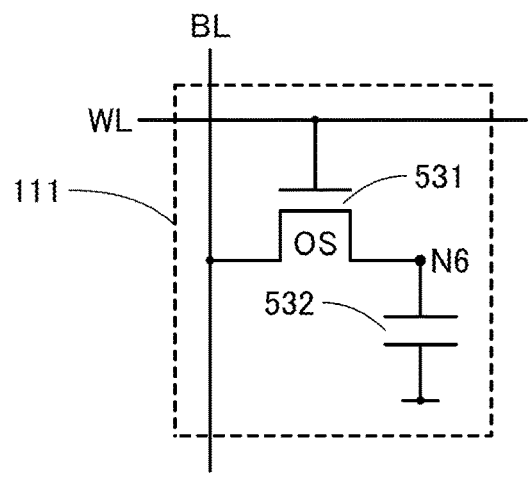

FIG. 13B illustrates another configuration example of the memory cell 111. The memory cell 111 in FIG. 13B includes a transistor 531 and a capacitor 532. Here, the transistor 531 is an n-channel OS transistor.

A gate of the transistor 531 is connected to the wiring WL, one of a source and a drain of the transistor 531 is connected to one electrode of the capacitor 532, and the other of the source and the drain of the transistor 531 is connected to the wiring BL. The other electrode of the capacitor 532 is connected to a wiring to which a predetermined potential is supplied. Here, a node which is connected to the one of the source and the drain of the transistor 531 and the one electrode of the capacitor 532 is referred to as a node N6. The operation of the memory cell 111 will be described below.

First, the potential of the wiring connected to the other electrode of the capacitor 532 is fixed to a constant level, and then, the potential of the wiring WL is set to a potential at which the transistor 531 is turned on, so that the transistor 531 is turned on. Accordingly, the potential of the wiring BL is supplied to the node N6 (data writing).

Next, the potential of the wiring WL is set to a potential at which the transistor 531 is turned off, so that the transistor 531 is turned off. This makes the node N6 floating, so that the potential of the node N6 is retained (data retention). Since the transistor 531 is an OS transistor which has extremely low off-state current in the off state, the potential of the node N6 can be retained for a long time.

Subsequently, the potential of the wiring connected to the other electrode of the capacitor 532 is fixed to a constant level, and then, the potential of the wiring WL is set to a potential at which the transistor 531 is turned on, so that the transistor 531 is turned on. Accordingly, the potential of the node N6 is supplied to the wiring BL. At this time, the potential of the wiring BL varies depending on the potential of the node N6. Thus, the data stored in the memory cell 111 can be read out by determining the potential of the wiring BL. When the change in potential of the wiring BL depending on charge accumulated at the node N6 is small, the wiring BL may be connected to a sense amplifier or the like so that the potential of the wiring BL is amplified for reading.

Data can be rewritten in a manner similar to that of the data writing and the data retention. Specifically, the potential of the wiring WL is set to a potential at which the transistor 531 is turned on, so that the transistor 531 is turned on. Accordingly, the potential of the wiring BL which corresponds to data to be newly written is supplied to the node N6. After that, the potential of the wiring WL is set to a potential at which the transistor 531 is turned off, so that the transistor 531 is turned off. This makes the node N6 floating, so that the potential corresponding to the newly written data is retained at the node N6.

Since the transistor 531 is an OS transistor with extremely low off-state current, the potential of the node N6 can be maintained for a long time in the retention period. Consequently, operation in which another writing is performed at predetermined intervals (refresh operation) is unnecessary or the frequency of the refresh operation can be extremely low. Moreover, even in a period in which the power supply to the memory cell 111 is stopped, data can be retained.

<Configuration Example 3 of Memory Cell>

Figure 14A:
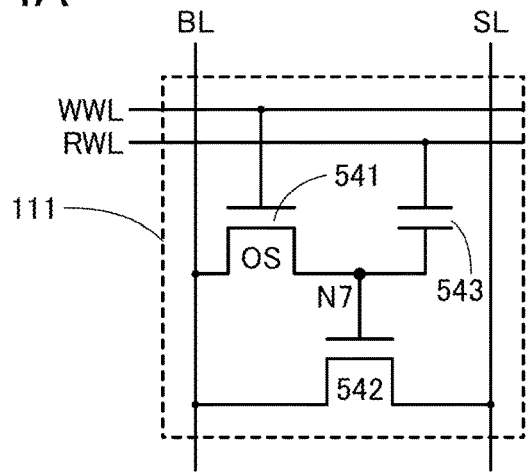
FIGS. 14A to 14C are circuit diagrams each illustrating one embodiment of the present invention.

FIG. 14A illustrates another configuration example of the memory cell 111. The memory cell 111 in FIG. 14A includes transistors 541 and 542 and a capacitor 543. Note that the transistor 541 is an OS transistor. Although the transistor 542 is an n-channel transistor here, the transistor 542 may be a p-channel transistor.

A gate of the transistor 541 is connected to a wiring WWL. One of a source and a drain of the transistor 541 is connected to a gate of the transistor 542 and one electrode of the capacitor 543. The other of the source and the drain of the transistor 541 is connected to the wiring BL. One of a source and a drain of the transistor 542 is connected to a wiring SL, and the other of the source and the drain of the transistor 542 is connected to the wiring BL. The other electrode of the capacitor 543 is connected to a wiring RWL. Here, a node which is connected to the one of the source and the drain of the transistor 541, the gate of the transistor 542, and the one electrode of the capacitor 543 is referred to as a node N7.

The wiring WWL has a function of transmitting the selection signal to the memory cell 111 to be written. The wiring RWL has a function of transmitting the selection signal to the memory cell 111 to be read. The wiring BL has a function of transmitting the write potential or the read potential. The wiring SL is supplied with a predetermined potential. The predetermined potential may be a fixed potential, or may be two or more different potentials. Note that the wiring WWL and the wiring RWL correspond to the wiring WL in FIG. 12A and are connected to the driver circuit 120. The wiring SL may be connected to the driver circuit 120 or the driver circuit 130, or may be connected to a power supply line provided separately from the driver circuit 120 and the driver circuit 130.

When an OS transistor is used as the transistor 541, the transistor 541 in the off state enables the potential of the node N7 to be retained for an extremely long time.

Next, the operation of the memory cell 111 in FIG. 14A will be described. First, the potential of the wiring WWL is set to a potential at which the transistor 541 is turned on, so that the transistor 541 is turned on. Accordingly, the potential of the wiring BL is supplied to the node N7. That is, predetermined charge is applied to the gate electrode of the transistor 542 (data writing).

After that, the potential of the wiring WWL is set to a potential at which the transistor 541 is turned off, so that the transistor 541 is turned off. This makes the node N7 floating, so that the potential of the node N7 is retained (data retention).

Subsequently, the potential of the wiring SL is fixed to a constant potential, and then, the potential of the wiring RWL is set to a predetermined potential, so that the potential of the wiring BL varies depending on the amount of charge retained at the node N7. This is because, in general, in the case where the transistor 542 is an n-channel transistor, an apparent threshold voltage $V_{th\_H}$ at the time when the potential of the gate of the transistor 542 is at the high level is lower than an apparent threshold voltage $V_{th\_L}$ at the time when the potential of the gate of the transistor 542 is at the low level. Here, the apparent threshold voltage refers to the potential of the wiring RWL which is needed to turn on the transistor 542. Thus, by setting the potential of the wiring RWL to a potential $V_0$ which is between $V_{th\_H}$ and $V_{th\_L}$, the potential of the node N7 can be determined. For example, in the case where the potential of the node N7 is at the high level, the transistor 542 is turned on when the potential of the wiring RWL becomes $V_0$ ($>V_{th\_H}$). In the case where the potential of the node N7 is at the low level, the transistor 542 remains in the off state even when the potential of the wiring RWL becomes $V_0$ ($<V_{th\_L}$). Thus, the data stored in the memory cell 111 can be read out by determining the potential of the wiring BL.

In the case where the data reading is not performed, a potential at which the transistor 542 is turned off regardless of the potential of the node N7, that is, a potential lower than $V_{th\_H}$ may be supplied to the wiring RWL.

Data can be rewritten in a manner similar to that of the data writing and the data retention. Specifically, the potential of the wiring WWL is set to a potential at which the transistor 541 is turned on, so that the transistor 541 is turned on. Accordingly, the potential of the wiring BL which corresponds to data to be rewritten is supplied to the node N7. After that, the potential of the wiring WWL is set to a potential at which the transistor 541 is turned off, so that the transistor 541 is turned off. This makes the node N7 floating, so that the potential corresponding to the rewritten data is retained at the node N7.

Since the transistor 541 is an OS transistor with extremely low off-state current, the potential of the node N7 can be maintained for a long time in the retention period. Consequently, even in a period where the power supply to the memory cell 111 is stopped, data can be retained.

Note that the one of the source and the drain of the transistor 541 is connected to the gate of the transistor 542, thereby having a function similar to that of a floating gate of a floating-gate transistor which is used as a non-volatile memory. Therefore, in FIG. 14A, a portion where the one of the source and the drain of the transistor 541 and the gate of the transistor 542 are connected to each other can also be called a floating gate portion. When the transistor 541 is in the off state, the floating gate portion can be regarded as being buried in an insulator, and charge is retained in the floating gate portion. The off-state current of the transistor 541 is less than or equal to 1/100,000 of the off-state current of a Si transistor; thus, a loss of the charge accumulated in the floating gate portion due to leakage current of the transistor 541 is extremely small. Alternatively, a loss of the charge accumulated in the floating gate portion is negligible for a long period. Therefore, with the use of the transistor 541 which is the OS transistor, a memory device capable of retaining data for a long period even in a period where power supply is stopped can be obtained.

In the memory cell 111 in FIG. 14A, data can be directly rewritten by another writing of data. For this reason, erasing operation which is necessary for a flash memory or the like is not needed, so that a decrease in operating speed caused by the erasing operation can be suppressed. That is, high-speed operation of the semiconductor device can be achieved.

Furthermore, in this case, the problem of deterioration of a gate insulating film (tunnel insulating film), which is pointed out in a conventional floating-gate transistor, does not exist. That is, the problem of deterioration of a gate insulating film due to injection of electrons into a floating gate, which is a conventional problem, can be solved. This means that there is no limit on the number of times of writing in principle. In addition, a high voltage needed for writing or erasing in a conventional floating-gate transistor is not necessary.

Although one of two potentials is retained at the node N7 here, one of three or more potentials may be retained. Thus, the memory cell 111 can store multilevel data.

It is supposed that 1-bit (2-level) data is retained at the node N7 for 10 years. In the case where the power supply voltage is higher than or equal to 2 V and lower than or equal to 3.5 V, the capacitance of the capacitor 543 is 21 fF, and the acceptable amount of change in retained potential is less than 0.5 V, the leakage current of the node N7 needs to be lower than $33 \times 10^{-24}$ A in order that a change in retained potential is within the acceptable range for 10 years at 85° C. In the case where the leakage current of other components is lower than the above and a leakage current occurs almost exclusively in OS transistors, each OS transistor with a channel width of 350 nm preferably has a leakage current per unit area of lower than $93 \times 10^{-24}$ A/μm. In the memory cell 111 having the above configuration, data can be retained at 85° C. for 10 years.

It is supposed that 4-bit (16-level) data is retained at the node N7 for 10 years. In the case where the power supply voltage is higher than or equal to 2 V and lower than or equal to 3.5 V, the capacitance of the capacitor 543 is 0.1 fF, the distribution width of a retained potential is less than 30 mV, and the acceptable amount of change in retained potential is less than 80 mV, the leakage current of the node N7 needs to be lower than $0.025 \times 10^{-24}$ A in order that a change in retained potential is within the acceptable range for 10 years at 85° C. In the case where the leakage current of other components is lower than the above and a leakage current occurs almost exclusively in OS transistors, each OS transistor with a channel width of 60 nm preferably has a leakage current per unit area of lower than $0.423 \times 10^{-24}$ A/μm. In the memory cell 111 having the above configuration, data can be retained for 10 years at 85° C.

It is supposed that 8-bit (256-level) data is retained at the node N7. In the case where the power supply voltage is higher than or equal to 2 V and lower than or equal to 3.5 V, the storage capacitance is 0.1 fF, the distribution width of a retained potential is less than 2 mV, and the acceptable amount of change in retained potential is less than 5 mV, the leakage current of the node N7 needs to be lower than $0.0016 \times 10^{-24}$ A in order that a change in retained potential is within the acceptable range for 10 years at 85° C. In the case where the leakage current of other components is lower than the above and a leakage current occurs almost exclusively in OS transistors, each OS transistor with a channel width of 60 nm preferably has a leakage current per unit area of lower than $0.026 \times 10^{-24}$ A/μm. In the memory cell 111 having the above configuration, data can be retained for 10 years at 85° C.

Figure 14B:
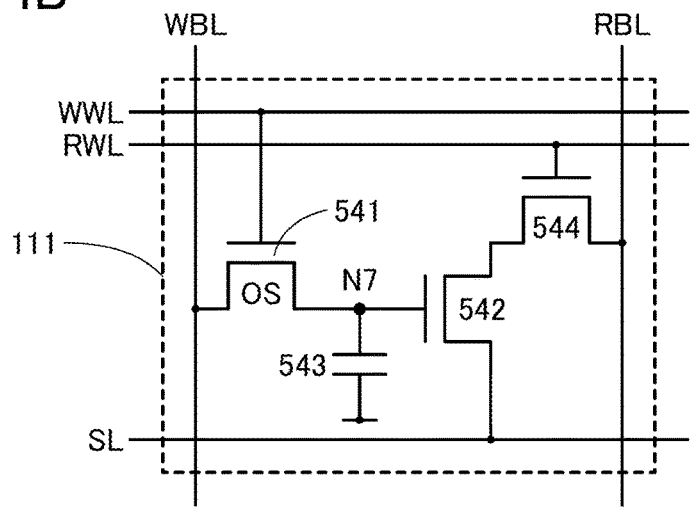

Although FIG. 14A illustrates a configuration in which the data writing and the data reading are performed using the same wiring BL, the data writing and the data reading may be performed using different wirings. In other words, the other of the source and the drain of the transistor 541 and the other of the source and the drain of the transistor 542 may be connected to different wirings. In addition, the transistor 542 may be connected to the wiring BL through another transistor, or the transistor 542 may be connected to the wiring SL through another transistor. FIG. 14B illustrates a modification example of the memory cell 111 in FIG. 14A.

The memory cell 111 in FIG. 14B includes a transistor 544 in addition to the transistors 541 and 542 and the capacitor 543. Although the transistors 542 and 544 are n-channel transistors here, the transistors 542 and 544 may be p-channel transistors.

A gate of the transistor 541 is connected to the wiring WWL. One of a source and a drain of the transistor 541 is connected to a gate of the transistor 542 and one electrode of the capacitor 543. The other of the source and the drain of the transistor 541 is connected to a wiring WBL. One of a source and a drain of the transistor 542 is connected to the wiring SL, and the other of the source and the drain of the transistor 542 is connected to one of a source and a drain of the transistor 544. A gate of the transistor 544 is connected to the wiring RWL, and the other of the source and the drain of the transistor 544 is connected to a wiring RBL. The other electrode of the capacitor 543 is connected to a wiring to which a predetermined potential is supplied.

The memory cell 111 in FIG. 14B includes different wirings, the wiring WBL and the wiring RBL, as the wiring BL. The wiring WBL has a function of transmitting the write potential, and the wiring RBL has a function of transmitting the read potential.

In FIG. 14B, the potential of the wiring RWL is set to a potential at which the transistor 544 is turned on, so that the transistor 544 is turned on. Accordingly, the read potential can be output to the wiring RBL. That is, data reading from the memory cell 111 can be controlled by a signal supplied to the wiring RBL.

Figure 14C:
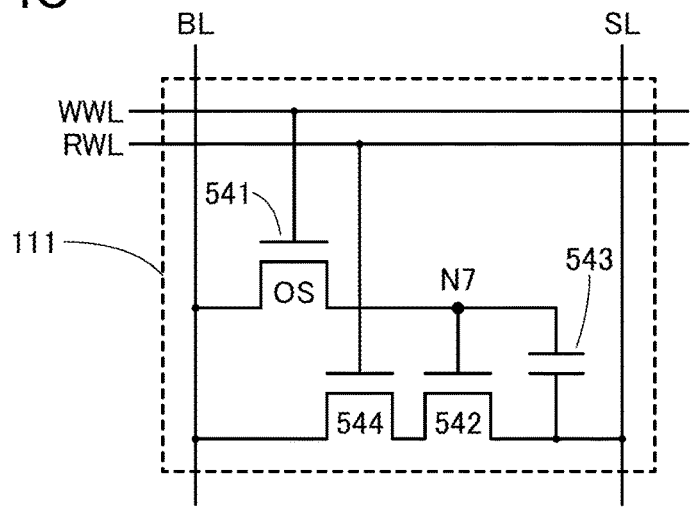

In FIG. 14B, the wiring WBL and the wiring RBL may be the single wiring BL. FIG. 14C illustrates such a configuration of the memory cell 111. In FIG. 14C, the transistor 541 and the transistor 544 are connected to the wiring BL. The capacitor 543 is connected to the wiring SL.

Note that the transistor 541 and the transistor 542 (and the transistor 544) in FIGS. 14A to 14C can be stacked. For example, an insulating layer can be provided above the transistor 542, and the transistor 541 which is an OS transistor and the capacitor 543 can be provided above the insulating layer. Accordingly, the area of the memory cell 111 can be reduced.

When the OS transistor is used in the memory cell 111 as described above, data stored in the memory cell 111 can be retained for a long time. Data stored in the memory cell 111 can be retained even in a period where power supply to the memory cell 111 is stopped.

Note that a material of the transistors other than the transistors indicated by "OS" in FIGS. 13A and 13B and FIGS. 14A to 14C is not particularly limited. For example, a material similar to that of the transistors in FIGS. 5A to 5C and FIGS. 6A to 6F can be used.

The transistors illustrated in FIGS. 13A and 13B and FIGS. 14A to 14C may each include a pair of gates between which a semiconductor film is positioned. When a transistor T has a pair of gates (front and back gates) between which a semiconductor film is positioned as in the above case, one of the gates may be supplied with a signal A, and the other gate may be supplied with a fixed potential $V_b$.

The signal A is, for example, a signal for controlling the on/off state. The signal A may be a digital signal with two kinds of potentials, a potential $V_1$ and a potential $V_2$ ($V_1 > V_2$). For example, the potential $V_1$ can be a high power supply potential, and the potential $V_2$ can be a low power supply potential (e.g., a ground potential). The signal A may be an analog signal.

The fixed potential $V_b$ is, for example, a potential for controlling the threshold voltage $V_{thA}$ of the transistor T. The fixed potential $V_b$ may be the potential $V_1$ or the potential $V_2$. In this case, no additional potential generation circuit is necessary to generate the fixed potential $V_b$, which is preferable. The fixed potential $V_b$ may be a potential different from the potential $V_1$ or the potential $V_2$. When the fixed potential $V_b$ is low, the threshold voltage $V_{thA}$ can be high in some cases. As a result, the drain current flowing when the gate-source voltage $V_{gs}$ is 0 V can be reduced, and leakage current in a circuit including the transistor T can be reduced in some cases. The fixed potential $V_b$ may be, for example, lower than the low power supply potential. When the fixed potential $V_b$ is high, the threshold voltage $V_{thA}$ can be low in some cases. As a result, the drain current flowing when the gate-source voltage $V_{gs}$ is $V_{DD}$ and the operating speed of the circuit including the transistor T can be increased in some cases. The fixed potential $V_b$ may be, for example, higher than the low power supply potential.

Alternatively, one of the gates of the transistor T may be supplied with the signal A, and the other gate may be supplied with a signal B. The signal B is, for example, a signal for controlling the on/off state of the transistor T. The signal B may be a digital signal with two kinds of potentials, a potential $V_3$ and a potential $V_4$ ($V_3 > V_4$). For example, the potential $V_3$ may be a high power supply potential, and the potential $V_4$ may be a low power supply potential. The signal B may be an analog signal.

When both the signal A and the signal B are digital signals, the signal B may have the same digital value as the signal A. In this case, the on-state current of the transistor T and the operating speed of the circuit including the transistor T can be increased in some cases. Here, the potential $V_1$ of the signal A may be different from the potential $V_3$ of the signal B. Furthermore, the potential $V_2$ of the signal A may be different from the potential $V_4$ of the signal B. For example, if a gate insulating layer for the gate to which the signal B is input is thicker than a gate insulating layer for the gate to which the signal A is input, the potential amplitude of the signal B ($V_3-V_4$) may be larger than the potential amplitude of the signal A ($V_1-V_2$). In this manner, the influence of the signal A and that of the signal B on the on/off state of the transistor T can be substantially the same in some cases.

When both the signal A and the signal B are digital signals, the signal B may have a digital value different from that of the signal A. In this case, the signal A and the signal B can separately control the transistor T, and thus, higher performance can be achieved. The transistor T which is, for example, an n-channel transistor can function by itself as a NAND circuit, a NOR circuit, or the like in the following case: the transistor T is turned on only when the signal A has the potential $V_1$ and the signal B has the potential $V_3$, or the transistor T is turned off only when the signal A has the potential $V_2$ and the signal B has the potential $V_4$. The signal B may be a signal for controlling the threshold voltage $V_{thA}$. For example, the potential of the signal B in a period where the circuit including the transistor T operates may be different from the potential of the signal B in a period where the circuit does not operate. The potential of the signal B may vary depending on the operation mode of the circuit. In this case, the potential of the signal B is not necessarily changed as frequently as the potential of the signal A.

When both the signal A and the signal B are analog signals, the signal B may be an analog signal having the same potential as the signal A, an analog signal whose potential is a constant times the potential of the signal A, an analog signal whose potential is higher or lower than the potential of the signal A by a constant, or the like. In this case, it may be possible to increase the on-state current of the transistor T and the operating speed of the circuit including the transistor T. The signal B may have an analog value different from that of the signal A. In this case, the signal A and the signal B can separately control the transistor T, and thus, higher performance can be achieved.

The signal A may be a digital signal, and the signal B may be an analog signal. Alternatively, the signal A may be an analog signal, and the signal B may be a digital signal.

Alternatively, one of the gates of the transistor T may be supplied with a fixed potential $V_a$, and the other gate may be supplied with the fixed potential $V_b$. When both of the gates of the transistor T are supplied with the fixed potentials, the transistor T can function as an element equivalent to a resistor in some cases. For example, when the transistor T is an n-channel transistor, the effective resistance of the transistor can be sometimes low (high) when the fixed potential $V_a$ or the fixed potential $V_b$ is high (low). When both the fixed potential $V_a$ and the fixed potential $V_b$ are high (low), the effective resistance can be lower (higher) than that of a transistor with only one gate in some cases.

This embodiment can be combined with any of the other embodiments as appropriate.

Embodiment 3

In this embodiment, a specific configuration example of the memory block of one embodiment of the present invention will be described.

Figure 15:
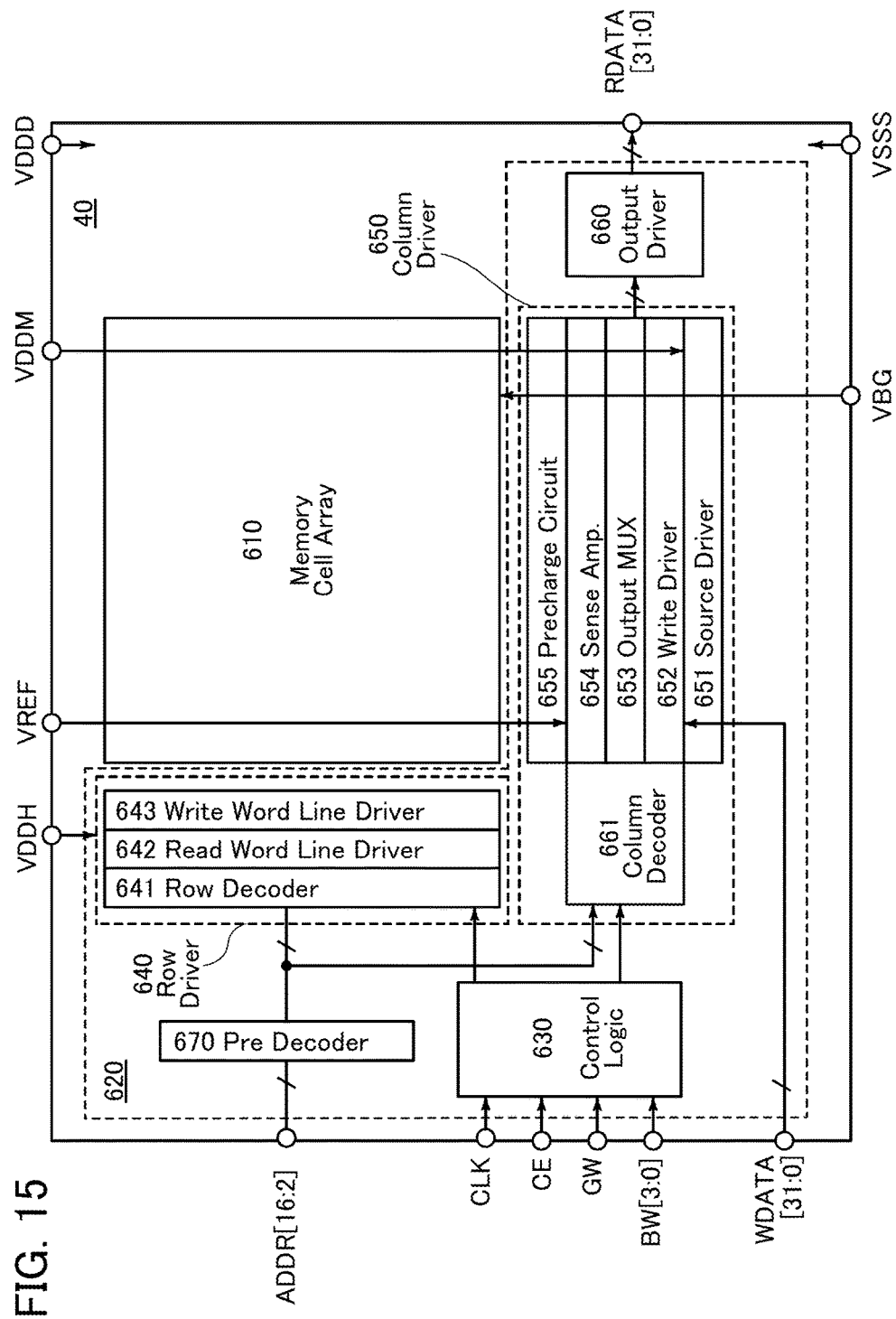
FIG. 15 illustrates one embodiment of the present invention.

FIG. 15 illustrates a configuration example of the memory block 40. The memory block 40 in FIG. 15 can be used as a random access memory.

The memory block 40 includes a memory cell array 610 and a peripheral circuit 620. The peripheral circuit 620 includes a control logic circuit 630, a row driver 640, a column driver 650, an output driver 660, and a predecoder 670. A high power supply potential VDDD and a low power supply potential VSSS are input to the memory block 40.

The memory cell array 610 corresponds to the cell array 110 in FIGS. 4A and 4B and includes a plurality of memory cells. The memory cell 111 in any of FIGS. 14A to 14C is used here in the memory cell array 610. Note that the transistor 541 of the memory cell 111 includes a back gate, and a potential VBG is supplied to the back gate from the outside.

The control logic circuit 630 has a function of generating signals for controlling the row driver 640 and the column driver 650 in accordance with a clock signal CLK, a chip enable signal CE, a global write signal GW, and a byte write signal BW[3:0].

The row driver 640 includes a row decoder 641, a read word line driver 642, and a write word line driver 643. The row decoder 641 has a function of decoding an address signal ADDR. The read word line driver 642 has a function of generating a signal to be output to the wiring RWL. The write word line driver 643 has a function of generating a signal to be output to the wiring WWL. A high power supply potential VDDH is input to the row driver 640.

The column driver 650 includes a source driver 651, a write driver 652, an output multiplexer (MUX) 653, a sense amplifier 654, and a precharge circuit 655. The source driver 651 has a function of driving the wiring SL. A potential VDDM is supplied to the wiring SL by the source driver 651. Note that the potential VDDM may be one of two or more different potentials. The write driver 652 has a function of outputting, to the wiring BL, a write potential which corresponds to write data WDATA[31:0] input from the outside. The output multiplexer 653 has a function of selecting a signal which is output from the sense amplifier 654 and transmitting the selected signal to the output driver 660. The sense amplifier 654 has a function of comparing the potential of the wiring BL with a potential VREF and amplifying the potential of the wiring BL. The precharge circuit 655 has a function of precharging the wiring BL. A column decoder 661 has a function of decoding the address signal ADDR.

The output driver 660 has a function of processing data which is input from the output multiplexer 653 and outputting the processed data to the outside as read data RDATA [31:0].

The predecoder 670 has a function of selecting a predetermined memory block 40 in accordance with the address signal ADDR. The predecoder 670 corresponds to any of the selection circuits S3 in FIG. 1, FIG. 2, and FIGS. 3A to 3D and is shared by a plurality of memory blocks 40. The semiconductor device 10 is used here as a 128 KB memory device, and an address signal ADDR[16:2] is input to the predecoder 670.

This embodiment can be combined with any of the other embodiments as appropriate.

Embodiment 4

In this embodiment, an example of a stacked structure of a semiconductor device of one embodiment of the present invention will be described.

In the above embodiment, a layer including OS transistors and a layer including transistors other than the OS transistors can be stacked. Furthermore, a plurality of layers including OS transistors can be stacked. Accordingly, the area of the memory cell can be reduced. Structural examples of semiconductor devices in which OS transistors and Si transistors are stacked will be described with reference to FIGS. 16A and 16B, FIG. 17, FIGS. 18A and 18B, FIG. 19, FIG. 20, and FIG. 21.

<Cross-Sectional Structure>

Transistors included in the semiconductor device of one embodiment of the present invention can be Si transistors or OS transistors. The semiconductor device may have a cross-sectional structure in which a layer including Si transistors and a layer including OS transistors are stacked. Each of the layers includes a plurality of transistors containing the same semiconductor material.

Figure 16A:
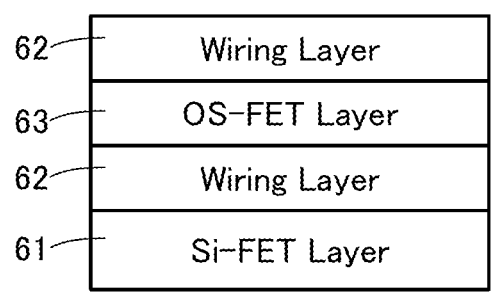
FIGS. 16A and 16B each illustrate one embodiment of the present invention.

The semiconductor device of one embodiment of the present invention can be formed by, for example as illustrated in FIG. 16A, stacking a layer 61 including Si transistors (represented as Si-FET Layer in the drawing), a wiring layer 62 (represented as Wiring Layer in the drawing), and a layer 63 including OS transistors (represented as OS-FET Layer in the drawing) in this order. In the schematic view of the cross-sectional structure in FIG. 16A, the layer 61 including Si transistors includes Si transistors formed on, for example, a single crystal silicon substrate. Note that the Si transistors may be transistors including a thin semiconductor layer of silicon, germanium, or the like in an amorphous, microcrystalline, polycrystalline, or single crystal state.

The layer 63 including OS transistors in the schematic view of the cross-sectional structure in FIG. 16A includes OS transistors formed over a planarized insulating surface.

The wiring layer 62 in the schematic view of the cross-sectional structure in FIG. 16A includes a wiring for electrically connecting transistors in the layer 61 including Si transistors and/or the layer 63 including OS transistors or includes a wiring for supplying a potential to the transistors. Although the wiring layer 62 is illustrated as a single layer in FIG. 16A, it may include a plurality of stacked layers.

Although the layer 63 including OS transistors is illustrated as a single layer in the schematic view of the cross-sectional structure in FIG. 16A, it may include a plurality of stacked layers. In the case of stacking a plurality of layers, the schematic view of the cross sectional structure can be illustrated as in FIG. 16B.

Figure 16B:
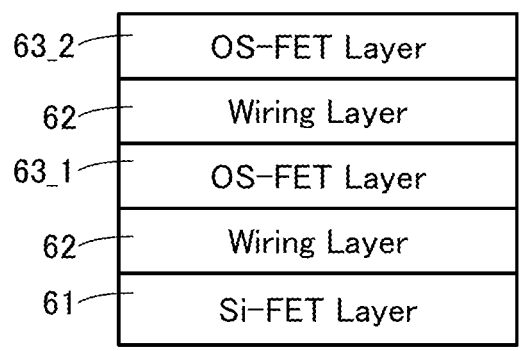

FIG. 16B illustrates a structure in which a layer 63_1 including OS transistors and a layer 63_2 including OS transistors are stacked. In the schematic view of the cross-sectional structure in FIG. 16B, the layer 63_1 including OS transistors and the layer 63_2 including OS transistors include OS transistors each formed over a planarized insulating surface. Although the example of stacking two layers is illustrated in FIG. 16B, the number of stacked layers is not limited to two and may be three or more. The wiring layer 62 can be provided between the layer 63_1 including OS transistors and the layer 63_2 including OS transistors. With this structure, OS transistors can be electrically connected to each other.

For example, the transistors 221 and 222 in FIGS. 5A to 5C and FIGS. 6A to 6F can be OS transistors, and other transistors and transistors of the circuit 210 can be Si transistors. In the case where the structure in FIG. 16A is employed for any of the circuits in FIGS. 5A to 5C, the layer 61 including Si transistors may include the circuit 210, and the layer 63 including OS transistors may include the transistors 221 and 222. Furthermore, the OS transistors in the memory cell 111 in any of FIGS. 12A to 12D, FIGS. 13A and 13B, and FIGS. 14A to 14C may be provided in the layer 63 including OS transistors, and other transistors may be provided in the layer 61 including Si transistors.

Stacking the layer including OS transistors over the layer including Si transistors as illustrated in FIGS. 16A and 16B enables a reduction in the area and size of the semiconductor device.

<Layer Including Si Transistors and Wiring Layer>

Figure 17:
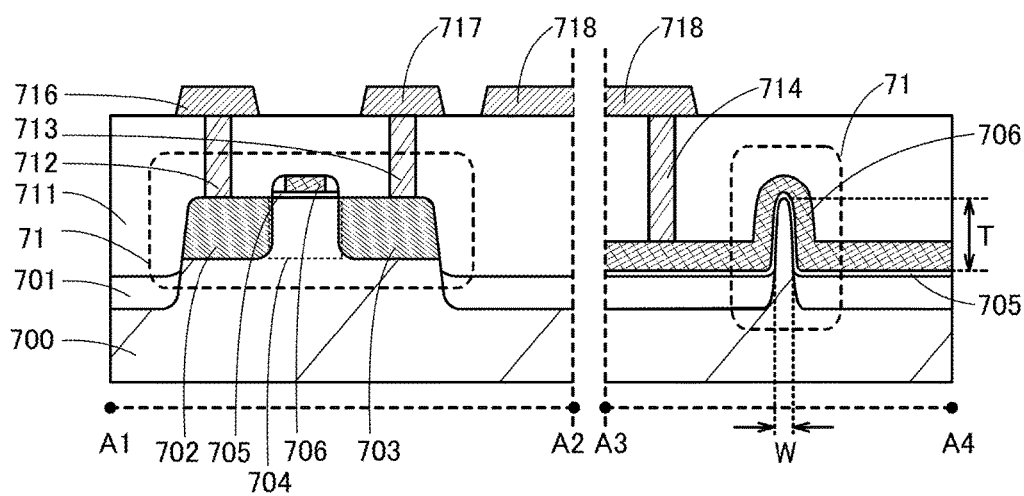
FIG. 17 illustrates one embodiment of the present invention.

FIG. 17 illustrates an example of a cross-sectional structure of the layer 61 including Si transistors and the wiring layer 62 over the layer 61 including Si transistors, which are described with reference to FIG. 16A or 16B. FIG. 17 illustrates a cross-sectional structure of a transistor 71 included in the layer 61 including Si transistors. The cross-sectional structure of the transistor 71 in FIG. 17 can be used for any of the circuits 210 in FIGS. 5A to 5C and FIGS. 6A to 6F and transistors other than OS transistors in FIGS. 12A to 12D, FIGS. 13A and 13B, and FIGS. 14A to 14C, for example. In FIG. 17, a region along dashed line A1-A2 shows a structure of the transistor 71 in the channel length direction, and a region along dashed line A3-A4 shows a structure of the transistor 71 in the channel width direction.

In FIG. 17, a substrate 700 where the transistor 71 is formed can be, for example, a silicon substrate, a germanium substrate, or a silicon germanium substrate. In FIG. 17, a single crystal silicon substrate is used as the substrate 700.

The transistor 71 is electrically isolated by an element isolation method. As the element isolation method, a trench isolation method (a shallow trench isolation (STI) method) or the like can be used. FIG. 17 illustrates an example where the trench isolation method is used to electrically isolate the transistor 71. Specifically, in FIG. 17, the transistor 71 is electrically isolated by element isolation using an element isolation region 701 formed in such a manner that an insulator including silicon oxide or the like is buried in a trench formed in the substrate 700 by etching or the like and then the insulator is partly removed by etching or the like.

In a projection of the substrate 700 that exists in a region other than the trench, an impurity region 702 and an impurity region 703 of the transistor 71 and a channel formation region 704 placed between the impurity regions 702 and 703 are provided. Furthermore, the transistor 71 includes an insulating film 705 that covers the channel formation region 704 and a gate electrode 706 that overlaps with the channel formation region 704 with the insulating film 705 provided therebetween.

In the transistor 71, a side portion and an upper portion of the projection in the channel formation region 704 overlap with the gate electrode 706 with the insulating film 705 positioned therebetween, so that carriers flow in a wide area including the side portion and the upper portion of the channel formation region 704. Therefore, an area over the substrate occupied by the transistor 71 can be reduced, and the number of transferred carriers in the transistor 71 can be increased. As a result, the on-state current and field-effect mobility of the transistor 71 are increased. Suppose the length in the channel width direction (channel width) of the projection in the channel formation region 704 is W, and the thickness of the projection in the channel formation region 704 is T. When the aspect ratio of the thickness T to the channel width W is high, a region where carriers flow becomes larger. Thus, the on-state current of the transistor 71 can be further increased and the field-effect mobility of the transistor 71 can be further increased.

Note that when the transistor 71 is formed using a bulk semiconductor substrate, the aspect ratio is preferably 0.5 or more, further preferably 1 or more.

An insulating film 711 is provided over the transistor 71. Openings are formed in the insulating film 711. Conductive films 712 and 713 that are electrically connected to the impurity regions 702 and 703, respectively, and a conductive film 714 that is electrically connected to the gate electrode 706 are formed in the openings.

The conductive film 712 is electrically connected to a conductive film 716 formed over the insulating film 711. The conductive film 713 is electrically connected to a conductive film 717 formed over the insulating film 711. The conductive film 714 is electrically connected to a conductive film 718 formed over the insulating film 711.

Note that the wiring layer 62 illustrated in FIGS. 16A and 16B corresponds to the conductive films 716, 717, and 718 in FIG. 17. The wiring layer 62 can be stacked by forming an insulating film, an opening in the insulating film, and a conductive film in a region including the opening, in this order.

<Layer Including OS Transistors>

Figure 18A:
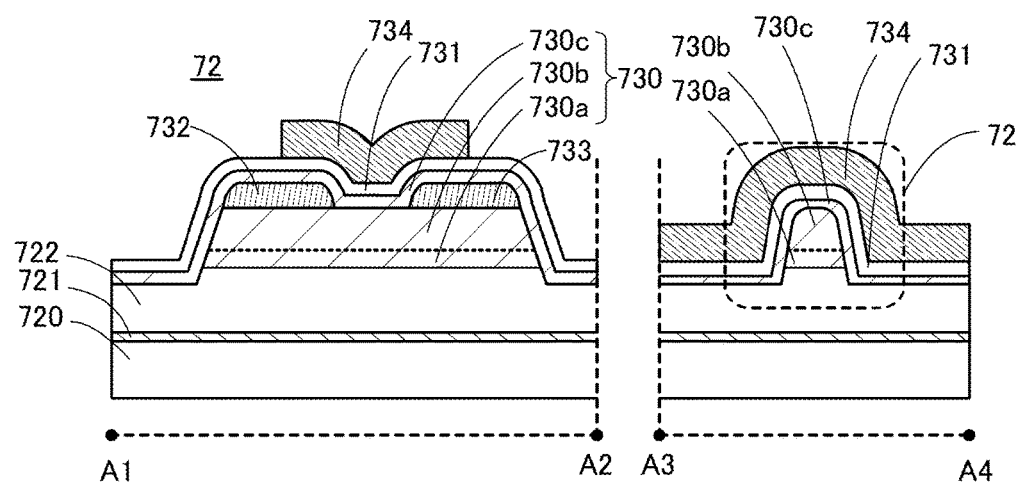
FIGS. 18A and 18B each illustrate one embodiment of the present invention.
Figure 18B:
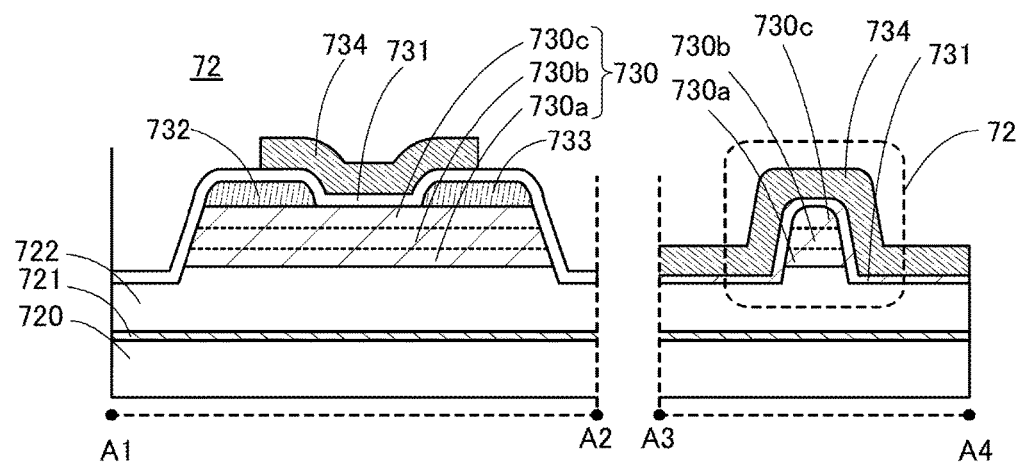

FIGS. 18A and 18B each illustrate an example of a cross-sectional structure of the layer 63 including OS transistors described with reference to FIGS. 16A and 16B. FIG. 18A illustrates a cross-sectional structure of a transistor 72 included in the layer 63 including OS transistors. The cross-sectional structure of the transistor 72 in FIG. 18A can be used for any of the transistors 221 and 222 in FIGS. 5A to 5C and FIGS. 6A to 6F, the OS transistors in FIGS. 12A to 12D, FIGS. 13A and 13B, and FIGS. 14A to 14C, and the like, for example.

In each of FIGS. 18A and 18B, as in FIG. 17, a region along dashed line A1-A2 shows a structure of the transistor 72 in the channel length direction, and a region along dashed line A3-A4 shows a structure of the transistor 72 in the channel width direction.

An insulating film 721 having a blocking effect of preventing diffusion of oxygen, hydrogen, and water is provided over an insulating film 720 that is provided over the wiring layer 62 described with reference to FIGS. 16A and 16B. As the insulating film 721 has higher density and becomes denser or has a fewer dangling bonds and becomes more chemically stable, the insulating film 721 has a higher blocking effect. The insulating film 721 that has the effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 721 having the effect of blocking diffusion of hydrogen and water can be formed using, for example, silicon nitride or silicon nitride oxide.

An insulating film 722 is provided over the insulating film 721, and the transistor 72 is provided over the insulating film 722.

The transistor 72 includes, over the insulating film 722, a semiconductor film 730 including an oxide semiconductor, conductive films 732 and 733 functioning as source and drain electrodes and electrically connected to the semiconductor film 730, a gate insulating film 731 covering the semiconductor film 730, and a gate electrode 734 overlapping with the semiconductor film 730 with the gate insulating film 731 positioned therebetween.

Note that in FIG. 18A, the transistor 72 includes at least the gate electrode 734 on one side of the semiconductor film 730, and may further include a gate electrode overlapping with the semiconductor film 730 with the insulating film 722 positioned therebetween.

In the case where the transistor 72 has a pair of gate electrodes, one of the gate electrodes may be supplied with a signal for controlling the on/off state, and the other of the gate electrodes may be supplied with a voltage from another wiring. In this case, voltages at the same level may be supplied to the pair of gate electrodes, or a fixed voltage such as the ground voltage may be supplied only to the other of the gate electrodes. By controlling a voltage supplied to the other of the gate electrodes, the threshold voltage of the transistor can be controlled.

In FIG. 18A, the transistor 72 has a single-gate structure where one channel formation region corresponding to one gate electrode 734 is provided. However, the transistor 72 may have a multi-gate structure where a plurality of electrically connected gate electrodes are provided so that a plurality of channel formation regions are included in one active layer.

FIG. 18A illustrates an example in which the semiconductor film 730 of the transistor 72 includes oxide semiconductor films 730a to 730c that are stacked in this order over the insulating film 722. Note that in one embodiment of the present invention, the semiconductor film 730 of the transistor 72 may be formed using a single-layer metal oxide film. In the structure illustrated here, the oxide semiconductor film 730c is provided over the conductive films 732 and 733.

In the case where the oxide semiconductor film 730b is an In-M-Zn oxide film (M is Ga, Y, Zr, La, Ce, or Nd) and a target having the atomic ratio of metal elements of In:M:Zn=$x_1$:$y_1$:$z_1$ is used for forming the oxide semiconductor film 730b, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a c-axis aligned crystalline oxide semiconductor (CAAC-OS) film as the oxide semiconductor film 730b is easily formed. Typical examples of the atomic ratio of the metal elements of the target are In:M:Zn=1:1:1, In:M:Zn=3:1:2, and the like. Details of the CAAC-OS film will be described later.

Note that in the case where the oxide semiconductor film 730a and the oxide semiconductor film 730c are In-M-Zn oxide films (M is Ga, Y, Zr, La, Ce, or Nd) and a target having the atomic ratio of metal elements of In:M:Zn=$x_2$: $y_2$: $z_2$ is used for forming the oxide semiconductor films 730a and 730c, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, CAAC-OS films are easily formed as the oxide semiconductor films 730a and 730c. Typical examples of the atomic ratio of the metal elements of the target are In:M:Zn=1:3:2, In:M:Zn=1:3:4, In:M:Zn=1:3:6, and the like.

The insulating film 722 preferably has a function of supplying part of oxygen to the oxide semiconductor films 730a to 730c by heating. It is preferable that the number of defects in the insulating film 722 be small, and typically the spin density of g=2.001 due to a dangling bond of silicon be lower than or equal to $1 \times 10^{18}$ spins/cm$^3$. The spin density is measured by electron spin resonance (ESR) spectroscopy.

The insulating film 722, which has a function of supplying part of the oxygen to the oxide semiconductor films 730a to 730c by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 722 can be formed by a plasma CVD (chemical vapor deposition) method, a sputtering method, or the like.

Note that in this specification, oxynitride contains more oxygen than nitrogen, and nitride oxide contains more nitrogen than oxygen.

Note that in the transistor 72 illustrated in FIG. 18A, the gate electrode 734 overlaps with end portions of the oxide semiconductor film 730b including a channel region that do not overlap with the conductive films 732 and 733, i.e., end portions of the oxide semiconductor film 730b that are in a region different from a region where the conductive films 732 and 733 are located. When the end portions of the oxide semiconductor film 730b are exposed to plasma by etching for forming the end portions, a chlorine radical, a fluorine radical, or other radicals generated from an etching gas are easily bonded to a metal element contained in an oxide semiconductor. For this reason, in the end portions of the oxide semiconductor film, oxygen bonded to the metal element is easily eliminated, so that an oxygen vacancy is easily formed; thus, the oxide semiconductor film easily has n-type conductivity. However, an electric field applied to the end portions can be controlled by controlling the voltage of the gate electrode 734 because the end portions of the oxide semiconductor film 730b that do not overlap with the conductive films 732 and 733 overlap with the gate electrode 734 in the transistor 72 illustrated in FIG. 18A. Consequently, current that flows between the conductive films 732 and 733 through the end portions of the oxide semiconductor film 730b can be controlled by the voltage applied to the gate electrode 734. Such a structure of the transistor 72 is referred to as a surrounded channel (s-channel) structure.

With the s-channel structure, specifically, when a voltage at which the transistor 72 is turned off is supplied to the gate electrode 734, the amount of off-state current that flows between the conductive films 732 and 733 through the end portions of the oxide semiconductor film 730b can be reduced. For this reason, in the transistor 72, even when the distance between the conductive films 732 and 733 at the end portions of the oxide semiconductor film 730b is reduced as a result of reducing the channel length to obtain high on-state current, the transistor 72 can have low off-state current. Consequently, with the short channel length, the transistor 72 can have high on-state current when in an on state and low off-state current when in an off state.

With the s-channel structure, specifically, when a voltage at which the transistor 72 is turned on is supplied to the gate electrode 734, the amount of current that flows between the conductive films 732 and 733 through the end portions of the oxide semiconductor film 730b can be increased. The current contributes to an increase in the field-effect mobility and the on-state current of the transistor 72. When the end portions of the oxide semiconductor film 730b overlap with the gate electrode 734, carriers flow in a wide region of the oxide semiconductor film 730b without being limited to a region in the vicinity of the interface between the oxide semiconductor film 730b and the gate insulating film 731, which results in an increase in carrier mobility of the transistor 72. As a result, the on-state current of the transistor 72 is increased, and the field-effect mobility is increased to greater than or equal to 10 cm$^2$/V·s or to greater than or equal to 20 cm$^2$N·s, for example. Note that here, the field-effect mobility is not an approximate value of the mobility as the physical property of the oxide semiconductor film but is the apparent field-effect mobility in a saturation region of the transistor, which is an index of current drive capability.

Note that the oxide semiconductor film 730c may be provided between the oxide semiconductor film 730b and the conductive films 732 and 733 as illustrated in FIG. 18B.

<Stacked Structure>

Figure 19:
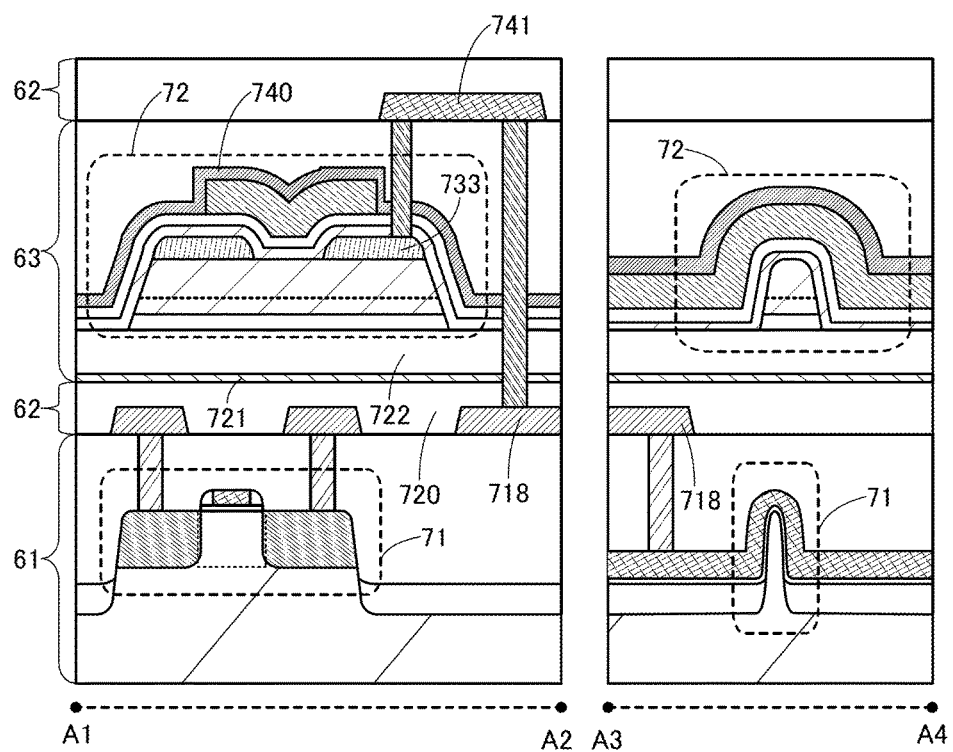
FIG. 19 illustrates one embodiment of the present invention.
Figure 20:
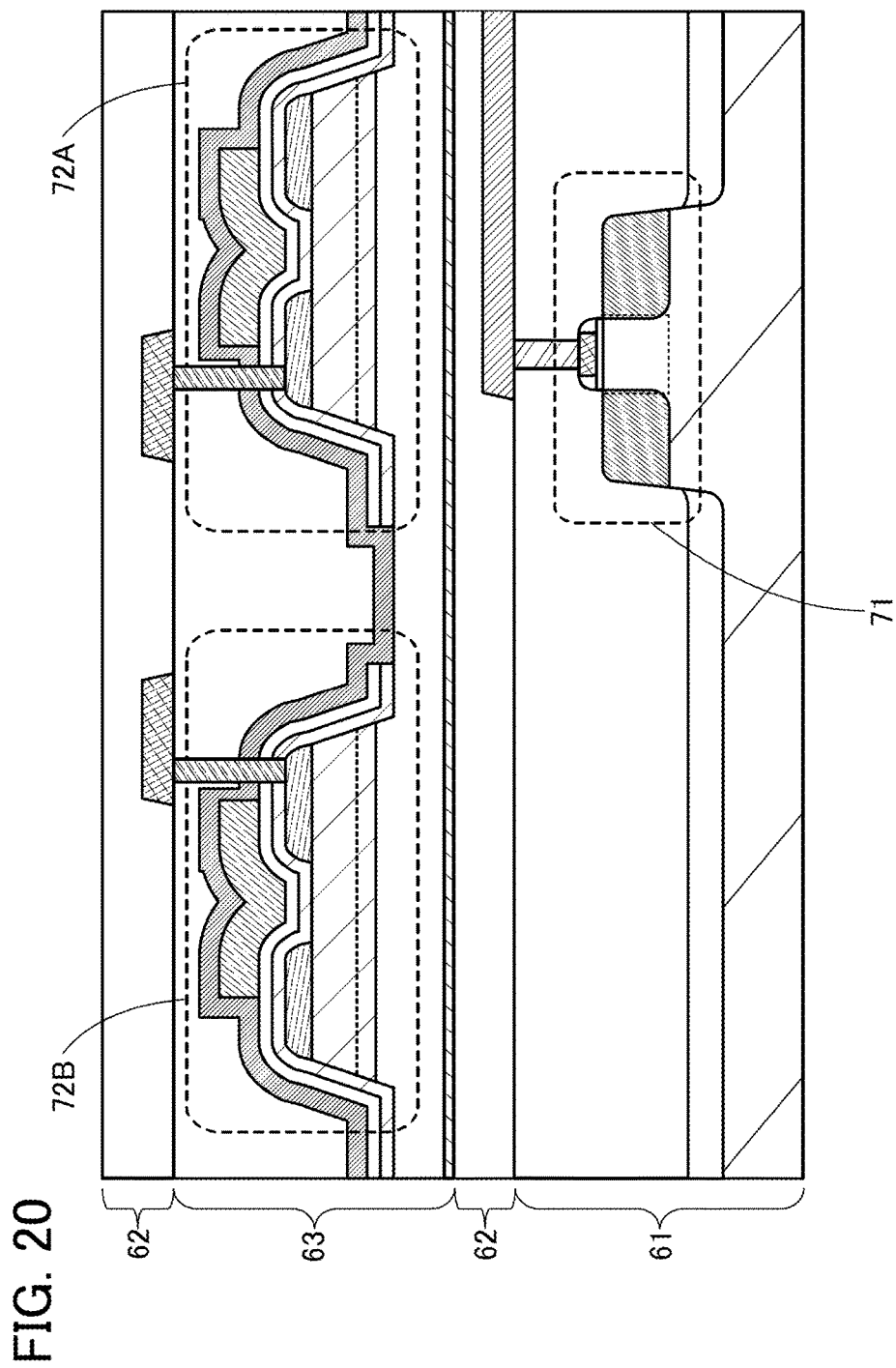
FIG. 20 illustrates one embodiment of the present invention.
Figure 21:
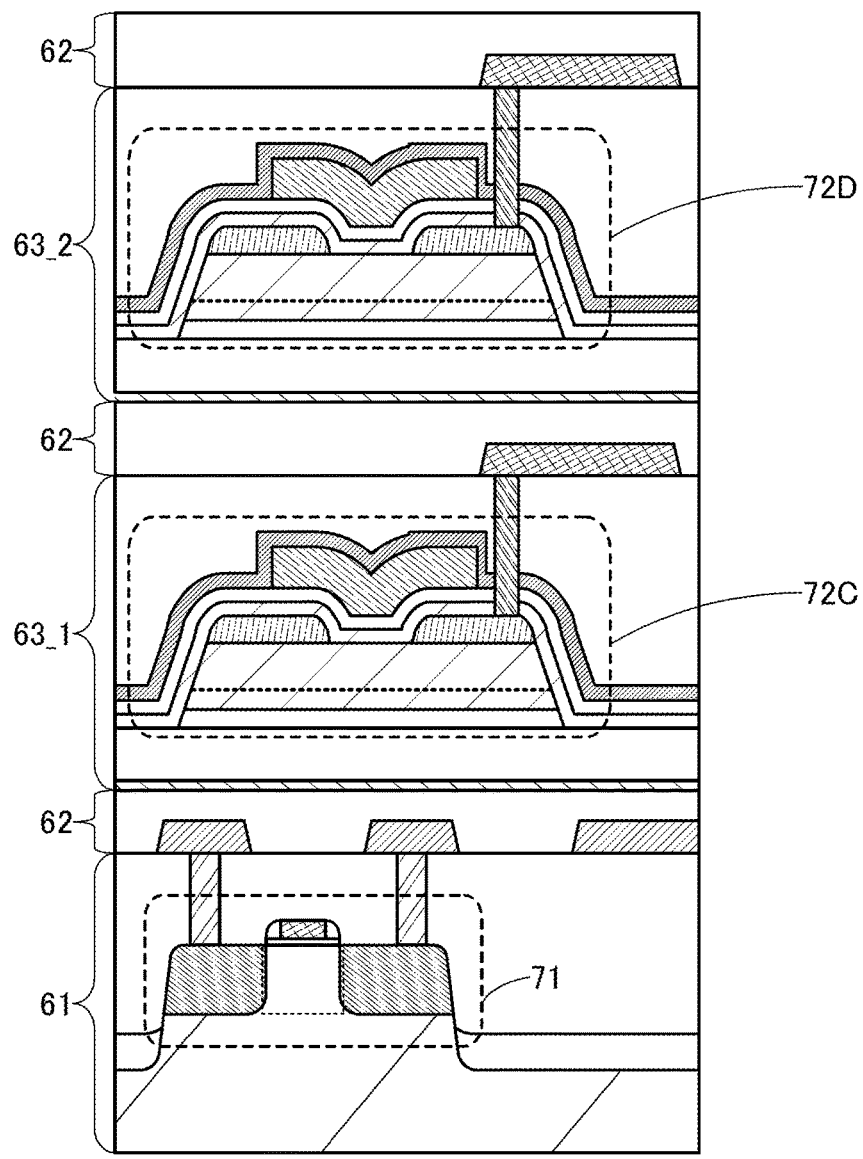
FIG. 21 illustrates one embodiment of the present invention.

FIGS. 19 to 21 illustrate examples of cross-sectional structures in which the layer including Si transistors and the wiring layer, which are described with FIG. 17, and the layer including OS transistors described with FIG. 18A are stacked.

FIG. 19 illustrates an example of a cross-sectional structure illustrated in the schematic view of FIG. 16A.

In FIG. 19, as in FIG. 17 and FIG. 18A, a region along dashed line A1-A2 shows a structure of the transistors 71 and 72 in the channel length direction, and a region along dashed line A3-A4 shows a structure of the transistors 71 and 72 in the channel width direction.

Note that in one embodiment of the present invention, the channel length direction of the transistor 71 and the channel length direction of the transistor 72 are not necessarily aligned with each other.

The transistor 71 and the transistor 72 can be connected to each other through a conductive film included in the wiring layer 62.

In the cross-sectional structure illustrated in FIG. 19, as described for FIG. 16A, the transistor 72 including a channel formation region in an oxide semiconductor film is formed over the transistor 71 including a channel formation region in a single crystal silicon substrate. With the structure illustrated in FIG. 19, the semiconductor film of the transistor 72 can overlap with the channel formation region of the transistor 71. Accordingly, a semiconductor device including a memory cell with such a structure can have a reduced layout area.

Note that an insulating film 740 is provided so as to cover the transistor 72 in FIG. 19. The insulating film 740 preferably has a function of blocking oxygen, hydrogen, water, alkali metal, alkaline earth metal, or the like. The insulating film 740 prevents outward diffusion of oxygen from the semiconductor film 730 and entry of hydrogen, water, or the like into the semiconductor film 730 from the outside. To have such a function, the insulating film 740 includes, for example, at least a single insulating layer made of silicon nitride, silicon nitride oxide, aluminum nitride, aluminum nitride oxide, aluminum oxide, aluminum oxynitride, gallium oxide, gallium oxynitride, yttrium oxide, yttrium oxynitride, hafnium oxide, hafnium oxynitride, or the like.

The wiring layer 62 is provided over the layer 63 including OS transistors, and the wiring layer 62 includes a conductive film 741. The conductive film 733 is connected to the conductive film 718 through the conductive film 741. Thus, the gate of the transistor 71 and the source or the drain of the transistor 72 can be connected to each other. Such a structure can be used in the memory cell 111 in FIG. 13A or FIG. 14A, 14B, or 14C or the like.

In the case where a plurality of transistors 72 are provided in the layer 63 including OS transistors, the transistors 72 may be provided in the same layer or different layers.

For example, in the case where the plurality of transistors 72 are provided in the same layer in the layer 63 including OS transistors, the structure illustrated in FIG. 20 can be formed. In the case where the plurality of transistors 72 are provided in different layers in the layer 63 including OS transistors, the layer 63_1 including OS transistors and the layer 63_2 including OS transistors can be separately provided so as to be stacked with the wiring layer 62 placed therebetween. This structure is illustrated in FIG. 21.

In the case of the cross-sectional structure illustrated in FIG. 20, even when the number of OS transistors is increased, only one layer, which is the layer 63 including OS transistors, is required; accordingly, the number of stacked layers can be reduced. In FIG. 20, a transistor 72A and a transistor 72B can be formed at once, for example. Accordingly, the number of steps for manufacturing a semiconductor device can be reduced.

FIG. 20 illustrates a structure of the transistors 71, 72A, and 72B in the channel length direction. A structure thereof in the channel width direction is similar to that illustrated in FIG. 19, and the aforementioned structure can be referred to.

Moreover, with the cross-sectional structure illustrated in FIG. 21, even when the number of OS transistors is increased, the layer 63_1 including OS transistors and the layer 63_2 including OS transistors are separately provided in a plurality of layers; accordingly, an increase in circuit area can be prevented. Therefore, the chip area and size of the semiconductor device can be reduced.

FIG. 21 illustrates a structure of the transistor 71, a transistor 72C, and a transistor 72D in the channel length direction. A structure thereof in the channel width direction is similar to that illustrated in FIG. 19, and the aforementioned structure can be referred to.

In the cross-sectional structure illustrated in FIG. 21, OS transistors included in the layer 63_1 including OS transistors and OS transistors included in the layer 63_2 including OS transistors, which exist in different layers, can have different film thicknesses, film qualities, and the like from each other. Thus, transistors with different characteristics can be formed separately. For example, transistors having high switching characteristics owing to thin gate insulating films and transistors having high withstand voltage owing to thick gate insulating films can be stacked. Accordingly, the semiconductor device can have high performance.

In FIG. 21, another layer 63 including OS transistors may be further stacked. For example, layers 63_3 and 63_4 including OS transistors may be stacked in this order over the layer 63_2 including OS transistors.

Structural Example

Figure 22:
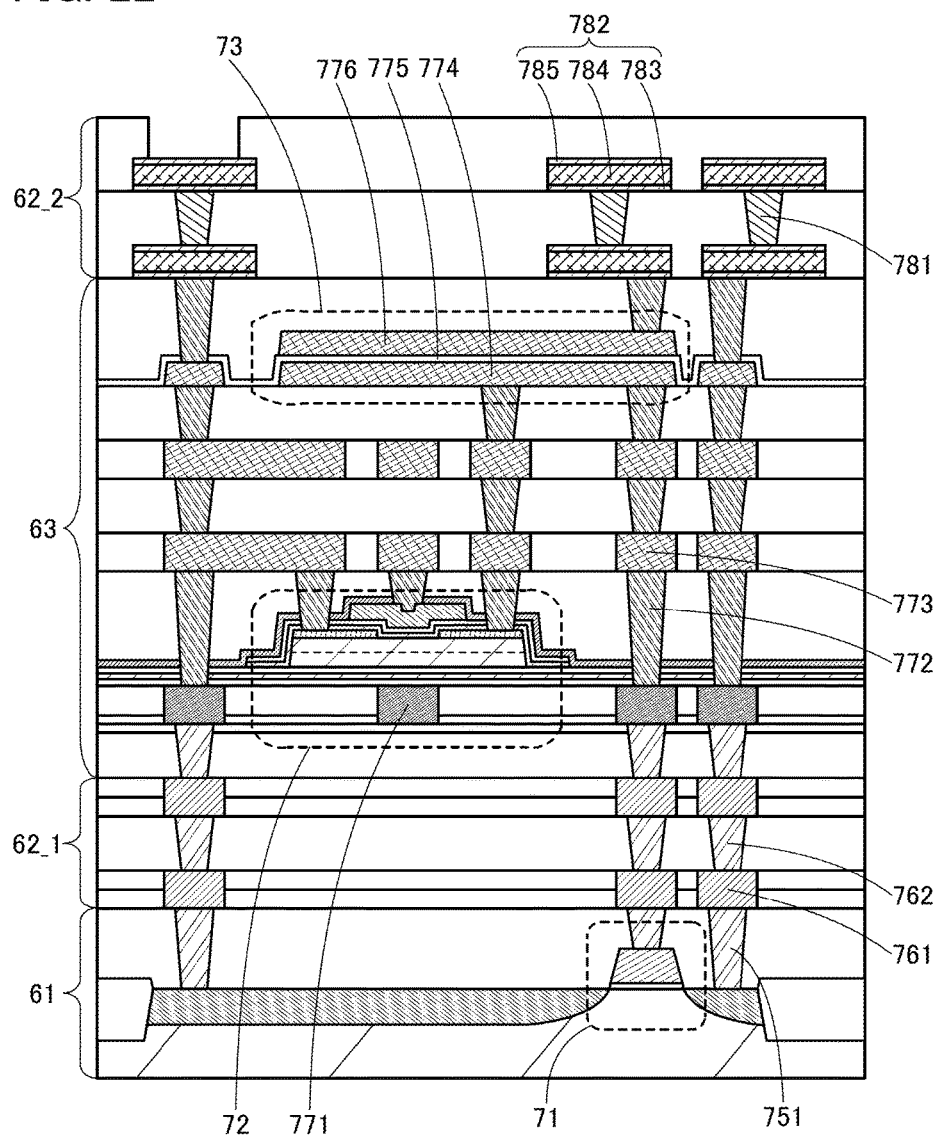
FIG. 22 illustrates one embodiment of the present invention.

FIG. 22 illustrates a specific structure in which the layer 61 including Si transistors and the layer 63 including OS transistors are stacked. Although the structural example of the memory cell 111 in any of FIGS. 14A to 14C is given here as an example, the structure in which the layer 61 including Si transistors and the layer 63 including OS transistors are stacked can be applied to other circuits.

In FIG. 22, the layer 61 including Si transistors includes the transistor 71, and the layer 63 including OS transistors includes the transistor 72 and a capacitor 73. A wiring layer 62_1 is provided between the layer 61 including Si transistors and the layer 63 including OS transistors. A wiring layer 62_2 is provided over the layer 63 including OS transistors. In FIG. 22, layers without reference numerals and hatching represent insulating layers.

The transistor 71, the transistor 72, and the capacitor 73 correspond to the transistor 542, the transistor 541, and the capacitor 543, respectively, in any of FIGS. 14A to 14C. With such a structure, the area of the memory cell 111 can be reduced, so that the size of the semiconductor device can be reduced.

The layer 61 including Si transistors includes the transistor 71. The layer 61 including Si transistors includes a plurality of conductive layers 751 provided in openings in an insulating layer. The gate electrode and the impurity regions of the transistor 71 are connected to the conductive layers 751.

The wiring layer 62_1 includes a plurality of conductive layers 761 and a plurality of conductive layers 762 provided in openings in an insulating layer. The transistor 71 is connected to the transistor 72 and the capacitor 73 through the conductive layers 761 and 762.

The layer 63 including OS transistors includes the transistor 72 and the capacitor 73. The capacitor 73 is stacked over the transistor 72. The layer 63 including OS transistors includes a plurality of conductive layers 772 provided in openings in an insulating layer and a plurality of conductive layers 773. The gate electrode, the source electrode, the drain electrode, and the like of the transistor 72 are connected to the conductive layers 772.

The capacitor 73 is stacked over the transistor 72 with insulating layers provided therebetween. The capacitor 73 includes a conductive layer 774, an insulating layer 775, and a conductive layer 776. The conductive layer 774 functions as one electrode of the capacitor 73. The insulating layer 775 functions as a dielectric of the capacitor 73. The conductive layer 776 functions as the other electrode of the capacitor 73.

One of a source and a drain of the transistor 72 is connected to the gate of the transistor 71 and the one electrode of the capacitor 73 through conductive layers. Thus, the memory cell 111 illustrated in any of FIGS. 14A to 14C can be formed.

The layer 63 including OS transistors includes a conductive layer 771. The conductive layer 771 functions as a back gate of the transistor 72. The conductive layer 771 may be supplied with the same potential as the front gate of the transistor 72 or may be supplied with a fixed potential.

The wiring layer 62_2 includes a plurality of conductive layers 781 provided in openings in an insulating layer and a plurality of conductive layers 782. Although the conductive layers 782 are each formed by stacking conductive layers 783, 784, and 785 in the example given here, the conductive layers 782 may each have a single-layer structure or may each be formed by stacking two, four, or more layers. The transistor 72 and the capacitor 73 are connected to other elements and wirings through the conductive layers 781 and 782.

In this manner, a memory cell can be formed by stacking the transistor 71, the transistor 72, and the capacitor 73.

Each of the conductive layers illustrated in FIG. 22 can be formed using a layer containing a material such as copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy including any of these materials, or a compound including any of these materials as its main components. Each conductive layer may have a single-layer structure or may be formed by stacking two or more layers.

The conductive layers provided in the layer 61 including Si transistors and the wiring layer 62_1 preferably have a higher melting point than the conductive layers provided in the wiring layer 62_2. When the melting point of the conductive layers provided in the layer 61 including Si transistors and the wiring layer 62_1 is high, thermal diffusion does not occur easily in the conductive layers. This enables an increase in process temperature at the time of forming the layer 63 including OS transistors. Accordingly, the process temperature can be increased in the step of supplying oxygen to the oxide semiconductor film of the transistor 72 or the like, so that the reliability of the transistor 72 can be improved.

The conductive layers provided in the wiring layer 62_2 preferably have a lower resistivity than the conductive layers provided in the layer 61 including Si transistors and the wiring layer 62_1. In that case, a delay of a signal input to the conductive layers provided in the wiring layer 62_1 can be reduced, so that the operation speed can be improved.

With the use of such different materials for the conductive layers provided over and under the layer 63 including OS transistors, both high reliability of the transistor 72 and high-speed operation of a circuit can be achieved.

For example, tungsten may be used as a high-melting-point material for the conductive layers 751, 761, and 762, and aluminum or copper may be used as a low-resistivity material for the conductive layers 781 and 782. In the case where the conductive layer 782 is formed by stacking the conductive layers 783, 784, and 785 as illustrated in FIG. 22, aluminum or copper may be used for the conductive layer 784, and another material (such as titanium or titanium nitride) may be used for the conductive layers 783 and 785. In that case, the temperature of heat treatment at the time of forming the transistor 72 can be set to 500° C. or higher, so that the reliability of the transistor 72 can be improved and the operation speed of a circuit connected to the conductive layers 781 and 782 can be increased.

Figure 23:
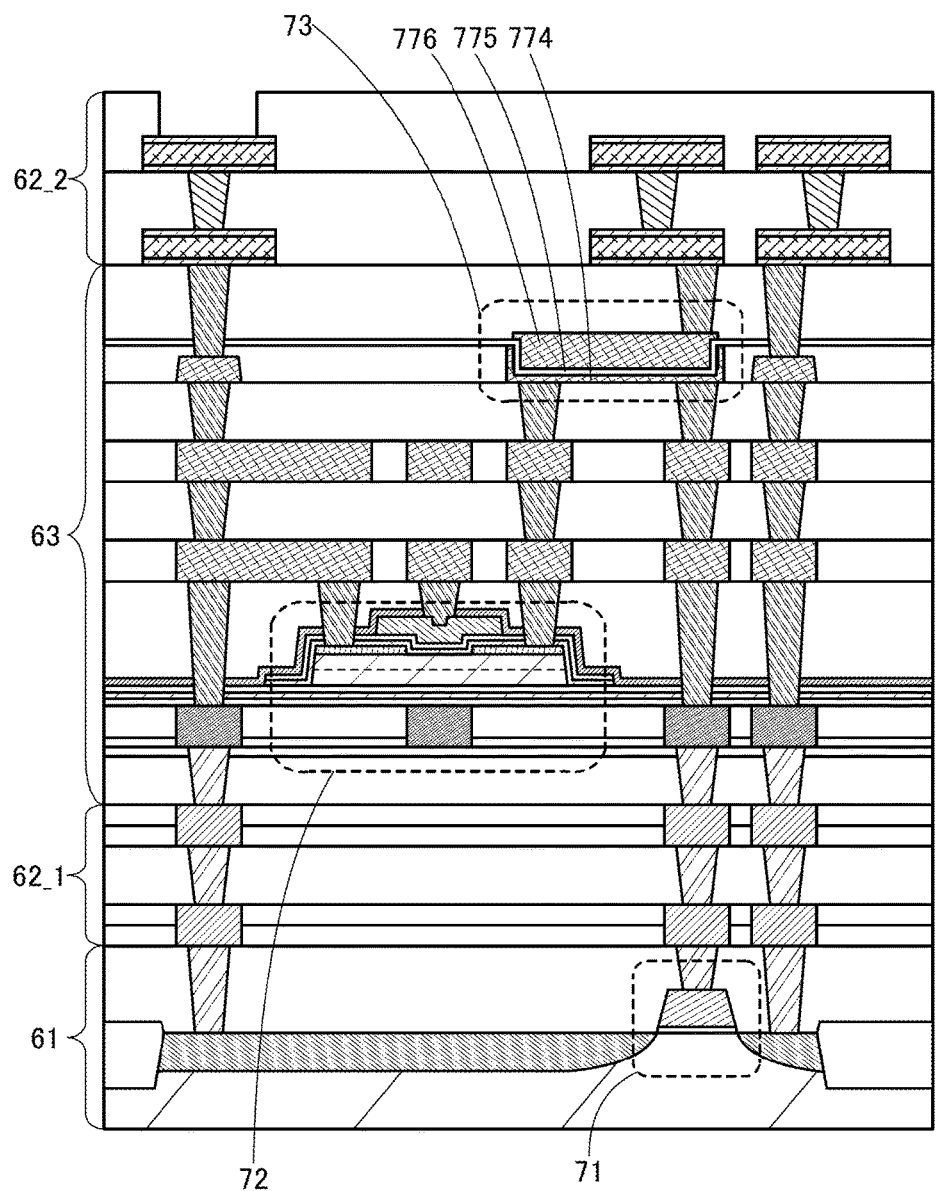
FIG. 23 illustrates one embodiment of the present invention.

Although the capacitor 73 in FIG. 22 is a planar capacitor including the conductive layers 774 and 776 which are parallel to each other, the capacitor 73 may have a different structure. For example, as illustrated in FIG. 23, the capacitor 73 may be a trench capacitor formed in an opening in an insulating layer. When the capacitor 73 is a trench capacitor, the capacitance of the capacitor 73 can be increased.

Although one layer 63 including OS transistors is stacked over the layer 61 including Si transistors in FIG. 22 or 23, two or more layers may be stacked.

OS transistors are stacked over other transistors in this manner, whereby the area of the semiconductor device can be reduced.

The structures and methods described in this embodiment can be combined with any of the structures and methods described in the other embodiments as appropriate.

Embodiment 5

In this embodiment, structural examples of OS transistors that can be used for one embodiment of the present invention will be described.

Structural Example 1

Figure 24A:
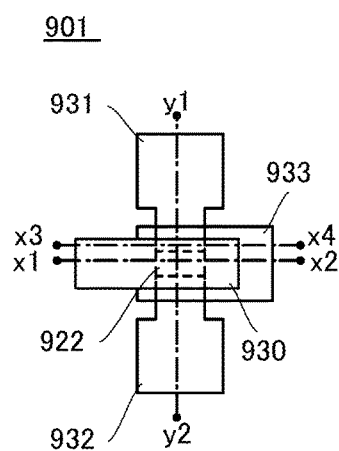
FIGS. 24A to 24D illustrate an example of a structure of a transistor.
Figure 24B:
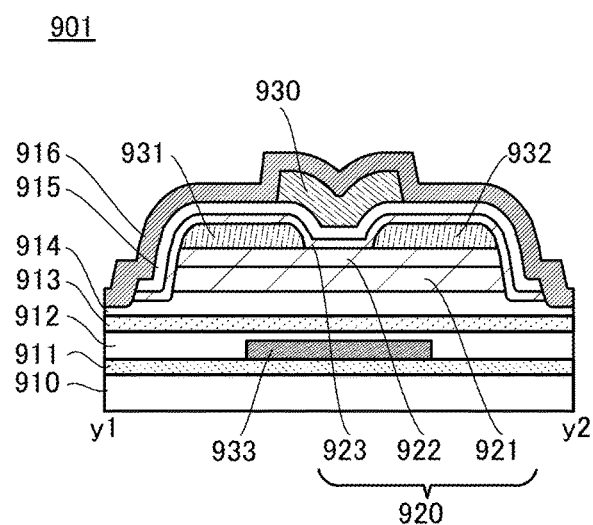
Figure 24C:
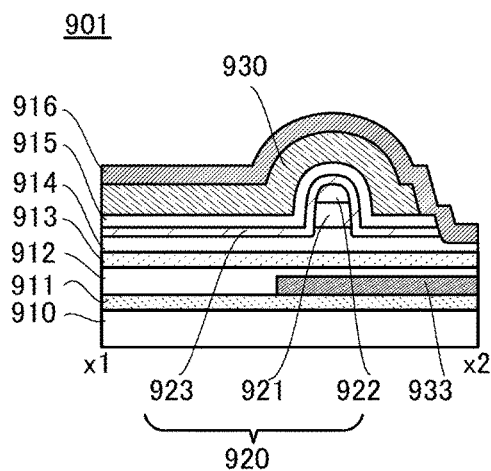
Figure 24D:
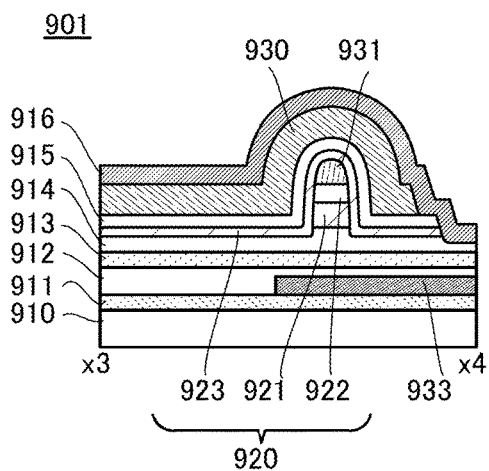

FIGS. 24A to 24D illustrate a structural example of an OS transistor. FIG. 24A is a top view illustrating the structural example of the OS transistor. FIG. 24B is a cross-sectional view along the line y1-y2, FIG. 24C is a cross-sectional view along the line x1-x2, and FIG. 24D is a cross-sectional view along the line x3-x4. Here, in some cases, the direction of the line y1-y2 is referred to as a channel length direction, and the direction of the line x1-x2 is referred to as a channel width direction. Accordingly, FIG. 24B illustrates a cross-sectional structure of the OS transistor in the channel length direction, and FIGS. 24C and 24D each illustrate a cross-sectional structure of the OS transistor in the channel width direction. To clarify the device structure, FIG. 24A does not illustrate some components.

A transistor 901 which is an OS transistor is formed over an insulating surface, here, over an insulating layer 911. The insulating layer 911 is formed over a surface of a substrate 910. The transistor 901 is covered with an insulating layer 916. Note that the insulating layer 916 can be regarded as a component of the transistor 901. The transistor 901 includes an insulating layer 912, an insulating layer 913, an insulating layer 914, an insulating layer 915, semiconductor layers 921 to 923, a conductive layer 930, a conductive layer 931, a conductive layer 932, and a conductive layer 933. Here, the semiconductor layers 921 to 923 are collectively referred to as a semiconductor region 920.

The conductive layer 930 functions as a gate electrode, and the conductive layer 933 functions as a back gate electrode. The conductive layers 931 and 932 function as a source electrode and a drain electrode. The insulating layer 911 has a function of electrically isolating the substrate 910 and the conductive layer 933 from each other. The insulating layer 915 functions as a gate insulating layer, and the insulating layers 913 and 914 function as a gate insulating layer on the back channel side.

The channel length refers to, for example, in a top view of a transistor, the distance between a source (a source region or a source electrode) and a drain (a drain region or a drain electrode) in a region in which a semiconductor (or a portion of the semiconductor in which current flows when the transistor is in the on state) and a gate electrode overlap with each other or in a region in which a channel is formed. The channel length of a transistor is not necessarily constant in all regions. In other words, the channel length of a transistor is not limited to one value in some cases. Therefore, in this specification and the like, the channel length is any one value, the maximum value, the minimum value, or the average value in a region in which a channel is formed.

The channel width refers to, for example, the length of a portion in which a source and a drain face each other in a region in which a semiconductor (or a portion of the semiconductor in which current flows when a transistor is in the on state) and a gate electrode overlap with each other or in a region in which a channel is formed. The channel width of a transistor is not necessarily constant in all regions. In other words, the channel width of a transistor is not limited to one value in some cases. Therefore, in this specification, the channel width is any one value, the maximum value, the minimum value, or the average value in a region in which a channel is formed.

Depending on the transistor structure, the channel width in a region in which a channel is actually formed (hereinafter referred to as an effective channel width) is different from the channel width shown in a top view of the transistor (hereinafter referred to as an apparent channel width) in some cases. For example, in a transistor having a three-dimensional structure, the effective channel width is larger than the apparent channel width shown in a top view of the transistor, and an influence of the effective channel width cannot be ignored in some cases. For example, in a miniaturized transistor having a three-dimensional structure, the proportion of a channel region formed on a side surface of a semiconductor is high in some cases. In this case, the effective channel width obtained when a channel is actually formed is larger than the apparent channel width shown in a top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a plan view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

As illustrated in FIGS. 24B and 24C, the semiconductor region 920 includes a region where the semiconductor layers 921 to 923 are stacked in order. The insulating layer 915 covers this stacked region. The conductive layer 930 overlaps with the stacked region with the insulating layer 913 positioned therebetween. The conductive layers 931 and 932 are provided over a stack of the semiconductor layers 921 and 922, and are in contact with a top surface of the stack. The stack of the semiconductor layers 921 and 922 and the conductive layers 931 and 932 is formed in an etching step using the same mask.

The semiconductor layer 923 is formed to cover the semiconductor layers 921 and 922 and the conductive layers 931 and 932. The insulating layer 915 covers the semiconductor layer 923. Here, the semiconductor layer 923 and the insulating layer 915 are etched using the same mask.

The conductive layer 930 is formed so as to surround, in the channel width direction, the stacked region of the semiconductor layers 921 to 923 with the insulating layer 915 positioned therebetween (see FIG. 24C). Therefore, a gate electric field is applied to this stacked region in the lateral direction as well as in the vertical direction. In the transistor 901, the gate electric field refers to an electric field generated by voltage applied to the conductive layer 930 (gate electrode layer). Accordingly, the whole region in which the semiconductor layers 921 to 923 are stacked can be electrically surrounded by the gate electric fields, so that a channel is formed in the whole semiconductor layer 922 (bulk) in some cases. Thus, the transistor 901 can have a high on-state current. The transistor 901 with the s-channel structure has an improved high frequency property. Specifically, the cut-off frequency can be improved.

The s-channel structure, because of its high on-state current, is suitable for a semiconductor device such as large-scale integration (LSI) which requires a miniaturized transistor. Furthermore, the s-channel structure is suitable for a transistor that needs to operate at high frequency because of its high on-state current. A semiconductor device including the transistor can operate at high frequency.

With the miniaturized OS transistor, a highly integrated or small sized semiconductor device can be provided. The OS transistor preferably has, for example, a region where a channel length is greater than or equal to 10 nm and less than 1 μm, further preferably greater than or equal to 10 nm and less than 100 nm, still further preferably greater than or equal to 10 nm and less than 70 nm, yet still further preferably greater than or equal to 10 nm and less than 60 nm, and yet still further preferably greater than or equal to 10 nm and less than 30 nm. In addition, the transistor preferably has, for example, a region where a channel width is greater than or equal to 10 nm and less than 1 μm, further preferably greater than or equal to 10 nm and less than 100 nm, still further preferably greater than or equal to 10 nm and less than 70 nm, yet still further preferably greater than or equal to 10 nm and less than 60 nm, and yet still further preferably greater than or equal to 10 nm and less than 30 nm.

Note that an oxide semiconductor such as an In—Ga—Zn oxide has lower thermal conductivity than silicon. Therefore, when an oxide semiconductor is used for the semiconductor layer 922, heat is easily generated especially at a drain-side end portion of the channel formation region of the semiconductor layer 922. However, since the transistor 901 in FIG. 24B has regions in which the conductive layers 931 and 932 overlap with the conductive layer 930, the conductive layers 931 and 932 are located in the vicinity of the channel formation region of the semiconductor layer 922. Accordingly, heat generated in the channel formation region of the semiconductor layer 922 is conducted to the conductive layers 931 and 932. That is, the conductive layers 931 and 932 can be used to dissipate heat from the channel formation region.

Next, details of the layers illustrated in FIGS. 24A to 24D will be described.

[Substrate]

As the substrate 910, for example, an insulator substrate, a semiconductor substrate, or a conductor substrate may be used. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a single material semiconductor substrate of silicon, germanium, or the like and a compound semiconductor substrate made of silicon carbide, silicon germanium, gallium arsenide, indium phosphide, zinc oxide, or gallium oxide. The semiconductor substrate may be a bulk substrate or a silicon on insulator (SOI) substrate in which a semiconductor layer is provided over a semiconductor substrate with an insulating region positioned therebetween. Examples of the conductor substrate include a graphite substrate, a metal substrate, an alloy substrate, and a conductive resin substrate. Other examples include a substrate including a metal nitride and a substrate including a metal oxide. Still other examples include an insulator substrate provided with a conductor or a semiconductor, a semiconductor substrate provided with a conductor or an insulator, and a conductor substrate provided with a semiconductor or an insulator. Alternatively, any of these substrates over which an element is provided may be used. Examples of the element provided over the substrate include a capacitor, a resistor, a switching element, a light-emitting element, and a memory element.

Alternatively, a flexible substrate may be used as the substrate 910. To provide a transistor over a flexible substrate, the transistor may be formed over a non-flexible substrate (e.g., a semiconductor substrate) and then separated and transferred to the substrate 910 which is a flexible substrate. In that case, a separation layer is preferably provided between the non-flexible substrate and the transistor. As the substrate 910, a sheet, a film, or a foil containing a fiber may be used. The substrate 910 may have elasticity. The substrate 910 may have a property of returning to its original shape when bending or pulling is stopped. Alternatively, the substrate 910 may have a property of not returning to its original shape. The thickness of the substrate 910 is, for example, greater than or equal to 5 μm and less than or equal to 700 μm, preferably greater than or equal to 10 μm and less than or equal to 500 μm, and further preferably greater than or equal to 15 μm and less than or equal to 300 μm. When the substrate 910 has a small thickness, the weight of the semiconductor device can be reduced. When the substrate 910 has a small thickness, even in the case of using glass or the like, the substrate 910 may have elasticity or a property of returning to its original shape when bending or pulling is stopped. Therefore, an impact applied to the semiconductor device over the substrate 910, which is caused by dropping or the like, can be reduced. That is, a robust semiconductor device can be provided.

Examples of the substrate 910 which is a flexible substrate include metal, an alloy, resin, glass, and fiber thereof. The flexible substrate preferably has a lower coefficient of linear expansion because deformation due to an environment is suppressed. The flexible substrate is formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used for the flexible substrate because of its low coefficient of linear expansion.

[Insulating Layer]

Each of the insulating layers 911 to 916 includes a single or a stacked insulating layer. The insulating layer is formed using, for example, a material such as aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

Note that in this specification, an oxynitride refers to a compound that includes more oxygen than nitrogen, and a nitride oxide refers to a compound that includes more nitrogen than oxygen. In this specification and the like, an oxide used for an insulating material includes an oxide with a nitrogen concentration of less than 1 atomic %.

The insulating layers 914 and 915 are in contact with the semiconductor region 920 and therefore preferably contain an oxide. In particular, the insulating layers 914 and 915 preferably include an oxide material from which part of oxygen is released by heating. The insulating layers 914 and 915 preferably include an oxide containing oxygen more than that in the stoichiometric composition. By heating, part of oxygen is released from an oxide film containing oxygen more than that in the stoichiometric composition. Oxygen released from the insulating layers 914 and 915 is supplied to the semiconductor region 920 which is an oxide semiconductor, so that oxygen vacancies in the oxide semiconductor can be reduced. Consequently, changes in the electrical characteristics of the transistor can be reduced, improving the reliability of the transistor.

The oxide film containing oxygen more than that in the stoichiometric composition is, for example, an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

The insulating layer 913 has a passivation function of preventing oxygen included in the insulating layer 914 from decreasing by being bonded to metal included in the conductive layer 933. The insulating layer 916 has a passivation function of preventing oxygen included in the insulating layer 915 from decreasing.

The insulating layers 911, 913, and 916 preferably have a function of blocking oxygen, hydrogen, water, alkali metal, alkaline earth metal, or the like. The insulating layers 911, 913, and 916 prevent outward diffusion of oxygen from the semiconductor region 920 and entry of hydrogen, water, or the like into the semiconductor region 920 from the outside. To have such a function, the insulating layers 911, 913, and 916 include, for example, at least a single layer of an insulating layer made of silicon nitride, silicon nitride oxide, aluminum nitride, aluminum nitride oxide, aluminum oxide, aluminum oxynitride, gallium oxide, gallium oxynitride, yttrium oxide, yttrium oxynitride, hafnium oxide, hafnium oxynitride, or the like.

Note that the insulating layer 911 corresponds to, for example, the insulating film 721 in FIG. 18A or 18B.

[Conductive Layer]

The conductive layers 931 and 932 each preferably have a single-layer or a stacked-layer conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive layers are preferably formed using a low-resistance conductive material such as aluminum or copper. The conductive layers are further preferably formed using a Cu—Mn alloy, in which case manganese oxide formed at the interface with an insulator containing oxygen has a function of preventing Cu diffusion.

The conductive layers 931 and 932 are formed using a hard mask used for forming the stack of the semiconductor layers 921 and 922. Therefore, the conductive layers 931 and 932 do not have regions in contact with the side surfaces of the semiconductor layers 921 and 922. For example, the semiconductor layers 921 and 922 and the conductive layers 931 and 932 can be formed through the following steps. A two-layer oxide semiconductor film including the semiconductor layers 921 and 922 is formed. A single-layer or stacked-layer conductive film is formed over the oxide semiconductor film. This conductive film is etched, so that a hard mask is formed. Using this hard mask, the two-layer oxide semiconductor film is etched to form the semiconductor layers 921 and 922. Then, the hard mask is etched to form the conductive layers 931 and 932.

The conductive layer 930 and the conductive layer 933 can be formed using a material similar to that of the conductive layers 931 and 932.

[Semiconductor Layer]

The semiconductor layer 922 is, for example, an oxide semiconductor containing indium (In). The semiconductor layer 922 has a high carrier mobility (electron mobility) when containing, for example, indium. The semiconductor layer 922 preferably contains an element M The element M is preferably aluminum (Al), gallium (Ga), yttrium (Y), tin (Sn), or the like. Other elements that can be used as the element M include boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), and tungsten (W). Note that two or more of the above elements may be used in combination as the element M The element M is an element having high bonding energy with oxygen, for example. The element M is an element whose bonding energy with oxygen is higher than that of indium. The element M is an element that can increase the energy gap of the oxide semiconductor, for example. Furthermore, the semiconductor layer 922 preferably contains zinc (Zn). The oxide semiconductor containing zinc is easily crystallized in some cases.

Note that the semiconductor layer 922 is not limited to the oxide semiconductor containing indium. The semiconductor layer 922 may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide. The semiconductor layer 922 is formed using, for example, an oxide with a wide energy gap. For example, the energy gap of the semiconductor layer 922 is greater than or equal to 2.5 eV and less than or equal to 4.2 eV, preferably greater than or equal to 2.8 eV and less than or equal to 3.8 eV, and further preferably greater than or equal to 3 eV and less than or equal to 3.5 eV. The semiconductor region 920 is preferably formed using CAAC-OS which is described later. Alternatively, at least the semiconductor layer 922 is preferably formed using CAAC-OS.

The semiconductor layers 921 and 923 include, for example, one or more, or two or more, elements other than oxygen included in the semiconductor layer 922. Since the semiconductor layers 921 and 923 each include one or more, or two or more, elements other than oxygen included in the semiconductor layer 922, an interface state is less likely to be formed at the interface between the semiconductor layers 921 and 922 and the interface between the semiconductor layers 922 and 923.

In the case where an In-M-Zn oxide is used as the semiconductor layer 921, when the summation of In and M is assumed to be 100 atomic %, the proportions of In and M are preferably set to be lower than 50 atomic % and higher than 50 atomic %, respectively, further preferably lower than 25 atomic % and higher than 75 atomic %, respectively. In the case where the semiconductor layer 921 is formed by a sputtering method, a sputtering target with the above composition, for example, a sputtering target containing In, M, and Zn at an atomic ratio of 1:3:2, is preferably used.

In the case where an In-M-Zn oxide is used as the semiconductor layer 922, when the summation of In and M is assumed to be 100 atomic %, the proportions of In and M are preferably set to be higher than 25 atomic % and lower than 75 atomic %, respectively, further preferably higher than 34 atomic % and lower than 66 atomic %, respectively. In the case where the semiconductor layer 922 is formed by a sputtering method, a sputtering target with the above composition, for example, a sputtering target containing In, M, and Zn at an atomic ratio of 1:1:1, 1:1:1.2, 2:1:3, 3:1:2, or 4:2:4.1, is preferably used. In particular, when a sputtering target containing In, Ga, and Zn at an atomic ratio of 4:2:4.1 is used, the semiconductor layer 922 may contain In, Ga, and Zn at an atomic ratio of 4:2:3 or in the neighborhood thereof.

In the case where an In-M-Zn oxide is used as the semiconductor layer 923, when the summation of In and M is assumed to be 100 atomic %, the proportions of In and M are preferably set to be lower than 50 atomic % and higher than 50 atomic %, respectively, further preferably lower than 25 atomic % and higher than 75 atomic %, respectively. Note that the semiconductor layers 923 and 921 may be formed using the same type of oxide. Note that the semiconductor layer 921 and/or the semiconductor layer 923 do/does not necessarily contain indium in some cases. For example, the semiconductor layer 921 and/or the semiconductor layer 923 may be gallium oxide.

Figure 25A:
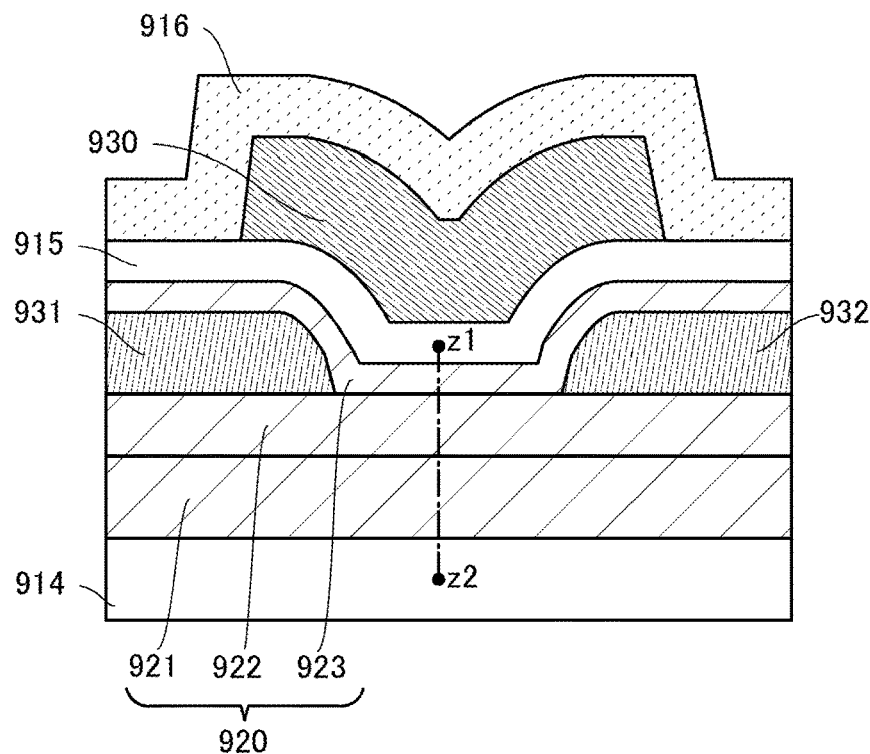
FIGS. 25A and 25B illustrate an example of a structure of a transistor.
Figure 25B:
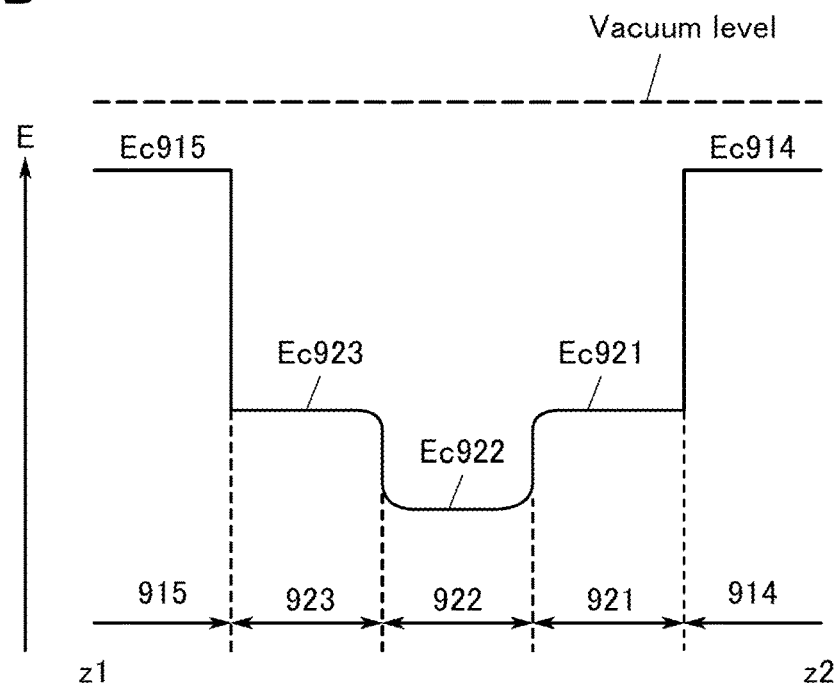

A function and an effect of the semiconductor region 920 including the stack of the semiconductor layers 921, 922, and 923 will be described with reference to FIGS. 25A and 25B. FIG. 25A is an enlarged view of the active layer (the channel portion) of the transistor 901 illustrated in FIG. 24B. FIG. 25B shows an energy band diagram of the active layer of the transistor 901, i.e., the energy band diagram of a portion along chain line z1-z2 in FIG. 25A.

In FIG. 25B, Ec914, Ec921, Ec922, Ec923, and Ec915 indicate the energies of the conduction band minima of the insulating layer 914, the semiconductor layer 921, the semiconductor layer 922, the semiconductor layer 923, and the insulating layer 915, respectively.

Here, a difference in energy between the vacuum level and the conduction band minimum (the difference is also referred to as electron affinity) corresponds to a value obtained by subtracting an energy gap from a difference in energy between the vacuum level and the valence band maximum (the difference is also referred to as ionization potential). The energy gap can be measured using a spectroscopic ellipsometer. The energy difference between the vacuum level and the valence band maximum can be measured using an ultraviolet photoelectron spectroscopy (UPS) device.

Since the insulating layers 914 and 915 are insulators, Ec914 and Ec915 are closer to the vacuum level than Ec921, Ec922, and Ec923 (that is, the insulating layers 914 and 915 have a lower electron affinity than the semiconductor layers 921 to 923).

As the semiconductor layer 922, an oxide having an electron affinity higher than those of the semiconductor layers 921 and 923 is used. For example, as the semiconductor layer 922, an oxide having an electron affinity higher than those of the semiconductor layers 921 and 923 by 0.07 eV or higher and 1.3 eV or lower, preferably 0.1 eV or higher and 0.7 eV or lower, and further preferably 0.15 eV or higher and 0.4 eV or lower is used. Note that the electron affinity refers to an energy difference between the vacuum level and the conduction band minimum.

An indium gallium oxide has a low electron affinity and a high oxygen-blocking property. Therefore, the semiconductor layer 923 preferably contains an indium gallium oxide. The gallium atomic ratio [Ga/(In+Ga)] is, for example, higher than or equal to 70%, preferably higher than or equal to 80%, and further preferably higher than or equal to 90%. At this time, when a gate voltage is applied, a channel is formed in the semiconductor layer 922 having the highest electron affinity among the semiconductor layers 921 to 923.

Here, in some cases, there is a mixed region of the semiconductor layers 921 and 922 between the semiconductor layer 921 and the semiconductor layer 922. Furthermore, in some cases, there is a mixed region of the semiconductor layers 922 and 923 between the semiconductor layer 922 and the semiconductor layer 923. The mixed region has a low interface state density. For that reason, the stack of the semiconductor layers 921, 922, and 923 has a band structure where energy at each interface and in the vicinity of the interface is changed continuously (also referred to as a band structure with a continuous junction).

At this time, electrons move mainly in the semiconductor layer 922, not in the semiconductor layers 921 and 923. As described above, when the interface state density at the interface between the semiconductor layers 921 and 922 and the interface state density at the interface between the semiconductor layers 922 and 923 are decreased, electron movement in the semiconductor layer 922 is less likely to be inhibited and the on-sate current of the transistor can be increased.

As factors of inhibiting electron movement are decreased, the on-state current of the transistor can be increased. For example, in the case where there is no factor of inhibiting electron movement, electrons are assumed to be efficiently moved. Electron movement is inhibited, for example, in the case where physical unevenness in a channel formation region is large. The electron movement is also inhibited, for example, in the case where the density of defect states is high in a region where a channel is formed.

To increase the on-state current of the transistor 901, for example, the root mean square (RMS) roughness in a measurement area of 1 μm×1 μm of a top surface of the semiconductor layer 922, or a bottom surface thereof (a formation surface; here, a top surface of the semiconductor layer 921), is less than 1 nm, preferably less than 0.6 nm, further preferably less than 0.5 nm, and still further preferably less than 0.4 nm. The average surface roughness (also referred to as Ra) in the measurement area of 1 μm×1 μm is less than 1 nm, preferably less than 0.6 nm, further preferably less than 0.5 nm, and still further preferably less than 0.4 nm. The maximum difference (P–V) in the measurement area of 1 μm×1 μm is less than 10 nm, preferably less than 9 nm, further preferably less than 8 nm, and still further preferably less than 7 nm. Note that RMS roughness, Ra, and P–V can be measured using a scanning probe microscope.

For example, in the case where the semiconductor layer 922 contains oxygen vacancies (also denoted by $V_O$), donor levels are formed by entry of hydrogen into sites of oxygen vacancies in some cases. A state in which hydrogen enters sites of oxygen vacancies is denoted by $V_OH$ in the following description in some cases. $V_OH$ scatters electrons to be a factor of decreasing the on-state current of the transistor. Note that sites of oxygen vacancies are more stable by entry of oxygen than by entry of hydrogen. Thus, a decrease in oxygen vacancies in the semiconductor layer 922 results in an increase in the on-state current of the transistor in some cases.

For example, the hydrogen concentration at a certain depth in the semiconductor layer 922 or in a certain region of the semiconductor layer 922, which is measured by secondary ion mass spectrometry (SIMS), is higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, and still further preferably higher than or equal to $1\times10^{16}$ atoms/cm$^3$ and lower than or equal to $5\times10^{18}$ atoms/cm$^3$.

To decrease oxygen vacancies in the semiconductor layer 922, for example, excess oxygen in the insulating layer 915 can be moved to the semiconductor layer 922 through the semiconductor layer 921. In this case, the semiconductor layer 921 is preferably a layer having oxygen permeability (a layer through which oxygen can permeate).

In the case where the transistor 901 has an s-channel structure, a channel is formed in the whole of the semiconductor layer 922. Therefore, as the semiconductor layer 922 has a larger thickness, a channel region becomes larger. In other words, the thicker the semiconductor layer 922 is, the higher the on-state current of the transistor 901 is.

Moreover, the thickness of the semiconductor layer 923 is preferably as small as possible to increase the on-state current of the transistor 901. For example, the semiconductor layer 923 has a region with a thickness of less than 10 nm, preferably less than or equal to 5 nm, and further preferably less than or equal to 3 nm. Meanwhile, the semiconductor layer 923 has a function of blocking entry of elements other than oxygen (such as hydrogen and silicon) included in the adjacent insulator into the semiconductor layer 922 where a channel is formed. For this reason, it is preferable that the semiconductor layer 923 have a certain thickness. For example, the semiconductor layer 923 has a region with a thickness of greater than or equal to 0.3 nm, preferably greater than or equal to 1 nm, and further preferably greater than or equal to 2 nm. The semiconductor layer 923 preferably has an oxygen blocking property to suppress outward diffusion of oxygen released from the insulating layer 915 and the like.

To improve the reliability of the transistor 901, preferably, the thickness of the semiconductor layer 921 is large and the thickness of the semiconductor layer 923 is small. For example, the semiconductor layer 921 has a region with a thickness of greater than or equal to 10 nm, preferably greater than or equal to 20 nm, further preferably greater than or equal to 40 nm, and still further preferably greater than or equal to 60 nm. When the thickness of the semiconductor layer 921 is made large, the distance from an interface between the adjacent insulator and the semiconductor layer 921 to the semiconductor layer 922 in which a channel is formed can be large. However, to prevent the productivity of the semiconductor device from decreasing, the semiconductor layer 921 has a region with a thickness of, for example, less than or equal to 200 nm, preferably less than or equal to 120 nm, and further preferably less than or equal to 80 nm.

In order that the transistor 901 have stable electrical characteristics, it is effective to make the semiconductor layer 922 intrinsic or substantially intrinsic by reducing the concentration of impurities in the semiconductor region 920. Note that in this specification and the like, the expression "an oxide semiconductor is substantially intrinsic" refers to a state where an oxide semiconductor has a carrier density lower than $8\times10^{11}/cm^3$, preferably lower than $1\times10^{11}/cm^3$, and further preferably lower than $1\times10^{10}/cm^3$ and higher than or equal to $1\times10^{-9}/cm^3$.

In the oxide semiconductor, hydrogen, nitrogen, carbon, silicon, and a metal element other than a main component are impurities. For example, hydrogen and nitrogen form donor levels to increase the carrier density, and silicon forms impurity levels in the oxide semiconductor. The impurity levels serve as traps and might cause deterioration of the electric characteristics of the transistor. Therefore, it is preferable to reduce the concentration of the impurities in the semiconductor layers 921, 922, and 923 and at interfaces between the semiconductor layers.

For example, a region with a silicon concentration of higher than or equal to $1\times10^{16}$ atoms/cm$^3$ and lower than $1\times10^{19}$ atoms/cm$^3$, preferably higher than or equal to $1\times10^{16}$ atoms/cm$^3$ and lower than $5\times10^{18}$ atoms/cm$^3$, and further preferably higher than or equal to $1\times10^{16}$ atoms/cm$^3$ and lower than $2\times10^{18}$ atoms/cm$^3$ is provided between the semiconductor layer 922 and the semiconductor layer 921. In addition, a region with a silicon concentration of higher than or equal to $1\times10^{16}$ atoms/cm$^3$ and lower than $1\times10^{19}$ atoms/cm$^3$, preferably higher than or equal to $1\times10^{16}$ atoms/cm$^3$ and lower than $5\times10^{18}$ atoms/cm$^3$, and further preferably higher than or equal to $1\times10^{16}$ atoms/cm$^3$ and lower than $2\times10^{18}$ atoms/cm$^3$ is provided between the semiconductor layer 922 and the semiconductor layer 923. The silicon concentration can be measured by, for example, SIMS.

It is preferable to reduce the concentration of hydrogen in the semiconductor layers 921 and 923 in order to reduce the concentration of hydrogen in the semiconductor layer 922. The semiconductor layers 921 and 923 each have a region in which the concentration of hydrogen is higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, and still further preferably higher than or equal to $1\times10^{16}$ atoms/cm$^3$ and lower than or equal to $5\times10^{18}$ atoms/cm$^3$. The hydrogen concentration can be measured by, for example, SIMS.

It is preferable to reduce the concentration of nitrogen in the semiconductor layers 921 and 923 in order to reduce the concentration of nitrogen in the semiconductor layer 922. The semiconductor layers 921 and 923 each have a region in which the concentration of nitrogen is higher than or equal to $1\times10^{16}$ atoms/cm$^3$ and lower than $5\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $1\times10^{18}$ atoms/cm$^3$, and still further preferably higher than or equal to $1\times10^{16}$ atoms/cm$^3$ and lower than or equal to $5\times10^{17}$ atoms/cm$^3$. The nitrogen concentration can be measured by SIMS.

A transistor in which the above highly purified oxide semiconductor is used for a channel formation region exhibits an extremely low off-state current. When a source-drain voltage is, for example, about 0.1 V, 5 V, or 10 V, the off-state current normalized by the channel width of the transistor can be as low as several yoctoamperes per micrometer to several zeptoamperes per micrometer.

FIGS. 24A to 24D show an example of the three-layer semiconductor region 920; however, one embodiment of the present invention is not limited thereto. For example, the semiconductor region 920 may have a two-layer structure without the semiconductor layer 921 or the semiconductor layer 923. Alternatively, the semiconductor region 920 may have a four-layer structure in which a semiconductor layer similar to any one of the semiconductor layers 921 to 923 is provided over or under the semiconductor layer 921 or over or under the semiconductor layer 923. Alternatively, the semiconductor region 920 may have an n-layer structure (n is an integer of 5 or more) in which semiconductor layers similar to any one of the semiconductor layers 921 to 923 are provided at two or more of the following positions: over the semiconductor layer 921, under the semiconductor layer 921, over the semiconductor layer 923, and under the semiconductor layer 923.

Note that the semiconductor layers 921 to 923 in FIGS. 24A to 24D correspond to the oxide semiconductor films 730a to 730c in FIG. 18A or 18B.

In the case where the transistor 901 does not include a back gate electrode, the conductive layer 933 need not be provided. In that case, the insulating layer 912 is not provided, and the insulating layer 913 is formed over the insulating layer 911.

Structural Example 2

Figure 26A:
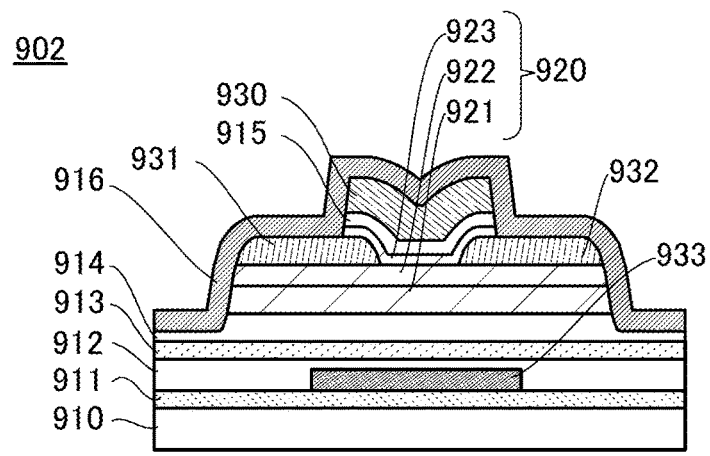
FIGS. 26A to 26C each illustrate an example of a structure of a transistor.

In the transistor 901 illustrated in FIGS. 24A to 24D, the semiconductor layer 923 and the insulating layer 915 can be etched with the conductive layer 930 used as a mask. FIG. 26A illustrates a structural example of the OS transistor manufactured through such a process. In a transistor 902 illustrated in FIG. 26A, edges of the semiconductor layer 923 and the insulating layer 915 are substantially aligned with an edge of the conductive layer 930. The semiconductor layer 923 and the insulating layer 915 are positioned only under the conductive layer 930.

Structural Example 3

Figure 26B:
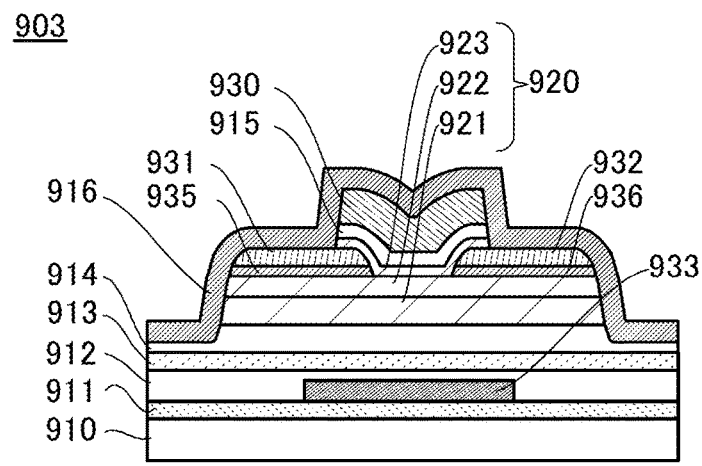

A transistor 903 illustrated in FIG. 26B has a device structure in which a conductive layer 935 and a conductive layer 936 are added to the transistor 902. A pair of electrodes serving as a source electrode and a drain electrode of the transistor 903 include a stack of the conductive layers 935 and 931 and a stack of the conductive layers 936 and 932.

Each of the conductive layers 935 and 936 includes a single-layer or stacked-layer conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. The conductor may be an alloy or a compound, and a conductor containing aluminum, a conductor containing copper and titanium, a conductor containing copper and manganese, a conductor containing indium, tin, and oxygen, a conductor containing titanium and nitrogen, or the like may be used.

The conductive layers 935 and 936 may have a property of transmitting visible light. Alternatively, the conductive layers 935 and 936 may have a property of not transmitting visible light, ultraviolet light, infrared light, or X-rays by reflecting or absorbing it. In some cases, such a property can suppress a change in the electric characteristics of the transistor 903 due to stray light.

The conductive layers 935 and 936 may preferably be formed using a layer that does not form a Schottky barrier with the semiconductor layer 922 or the like. Accordingly, the on-state characteristics of the transistor 903 can be improved.

Note that the conductive layers 935 and 936 may preferably have a higher resistance than the conductive layers 931 and 932. The conductive layers 935 and 936 may preferably have a lower resistance than a channel of the transistor 903 (specifically, the semiconductor layer 922). For example, the conductive layers 935 and 936 may have a resistivity higher than or equal to 0.1 $\Omega$cm and lower than or equal to 100 $\Omega$cm, higher than or equal to 0.5 $\Omega$cm and lower than or equal to 50 $\Omega$cm, or higher than or equal to 1 $\Omega$cm and lower than or equal to 10 $\Omega$cm. The conductive layers 935 and 936 having a resistivity within the above range can reduce electric field concentration in a boundary portion between the channel and the drain. This suppresses a change in the electric characteristics of the transistor 903. In addition, a punch-through current generated by an electric field from the drain can be reduced. Thus, a transistor with a small channel length can have favorable saturation characteristics. Note that in a circuit configuration where the source and the drain do not interchange, only one of the conductive layers 935 and 936 (e.g., the layer on the drain side) may preferably be provided.

Structural Example 4

Figure 26C:
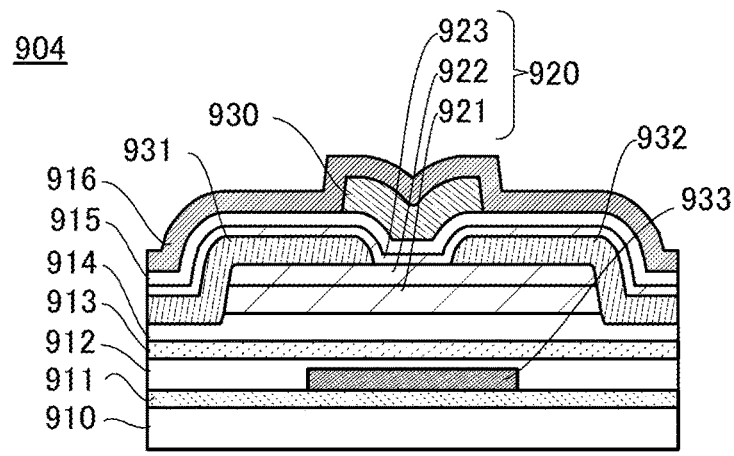

In the transistor 901 illustrated in FIGS. 24A to 24D, the conductive layers 931 and 932 may be in contact with side surfaces of the semiconductor layers 921 and 922. FIG. 26C illustrates an example of such a structure. In a transistor 904 illustrated in FIG. 26C, the conductive layers 931 and 932 are in contact with the side surfaces of the semiconductor layers 921 and 922.

<Crystal Structure of Oxide Semiconductor Film>

A structure of an oxide semiconductor film in the semiconductor region 920 is described below. In this specification, trigonal and rhombohedral crystal systems are included in a hexagonal crystal system.

An oxide semiconductor film is classified roughly into a non-single-crystal oxide semiconductor film and a single crystal oxide semiconductor film. The non-single-crystal oxide semiconductor film includes any of a CAAC-OS film, a polycrystalline oxide semiconductor film, a microcrystalline oxide semiconductor film, an amorphous oxide semiconductor film, and the like.

In this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, the term "substantially parallel" indicates that the angle formed between two straight lines is greater than or equal to $-30°$ and less than or equal to $30°$. In addition, the term "perpendicular" indicates that the angle formed between two straight lines is greater than or equal to $80°$ and less than or equal to $100°$, and accordingly also includes the case where the angle is greater than or equal to $85°$ and less than or equal to $95°$.

In addition, the term "substantially perpendicular" indicates that the angle formed between two straight lines is greater than or equal to $60°$ and less than or equal to $120°$.

[CAAC-OS Film]

The CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting unevenness of a surface where the CAAC-OS film is formed (hereinafter, the surface where the CAAC-OS film is formed is also referred to as a formation surface) or a top surface of the CAAC-OS film, and is arranged parallel to the formation surface or the top surface of the CAAC-OS film.

On the other hand, according to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around $31°$. This peak is assigned to the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

When the CAAC-OS film with an $InGaZnO_4$ crystal is analyzed by an out-of-plane method, a peak may also be observed when 2θ is around $36°$, in addition to the peak at 2θ of around $31°$. The peak at 2θ of around $36°$ indicates that a crystal having no c-axis alignment is included in part of the CAAC-OS film. It is preferable that in the CAAC-OS film, a peak appear when 2θ is around $31°$ and that a peak not appear when 2θ is around $36°$.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which the impurity concentration is low and the density of defect states is low (the number of oxygen vacancies is small) is referred to as a highly purified intrinsic or substantially highly purified intrinsic state. A highly purified intrinsic or substantially highly purified intrinsic oxide semiconductor film has few carrier generation sources, and thus can have a low carrier density. Therefore, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released and might behave like fixed electric charge. Thus, the transistor including the oxide semiconductor film having high impurity concentration and a high density of defect states has unstable electrical characteristics in some cases.

With the use of the CAAC-OS film in an OS transistor, variation in the electrical characteristics of the transistor due to irradiation with visible light or ultraviolet light is small.

[Microcrystalline Oxide Semiconductor Film]

A microcrystalline oxide semiconductor film has a region in which a crystal part is observed and a region in which a crystal part is not clearly observed in a high-resolution TEM image. In most cases, the size of a crystal part included in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm, is specifically referred to as nanocrystal (nc). An oxide semiconductor film including nanocrystal is referred to as an nc-OS (nanocrystalline oxide semiconductor) film. In a high-resolution TEM image of the nc-OS film, for example, a grain boundary is not clearly observed in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the size of a crystal part, a peak indicating a crystal plane does not appear. Furthermore, a halo pattern is shown in a selected-area electron diffraction pattern of the nc-OS film obtained by using an electron beam having a probe diameter (e.g., 50 nm or larger) larger than the size of a crystal part. Meanwhile, spots are shown in a nanobeam electron diffraction pattern of the nc-OS film obtained by using an electron beam having a probe diameter close to or smaller than the size of a crystal part. Furthermore, in a nanobeam electron diffraction pattern of the nc-OS film, regions with high luminance in a circular (ring) pattern are shown in some cases. Moreover, in a nanobeam electron diffraction pattern of the nc-OS film, a plurality of spots are shown in a ring-like region in some cases.

The nc-OS film is an oxide semiconductor film that has high regularity as compared with an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

[Amorphous Oxide Semiconductor Film]

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found. When the amorphous oxide semiconductor film is subjected to structural analysis by an out-of-plane method with an XRD apparatus, a peak which shows a crystal plane does not appear. A halo pattern is observed when the amorphous oxide semiconductor film is subjected to electron diffraction. Furthermore, a spot is not observed and a halo pattern appears when the amorphous oxide semiconductor film is subjected to nanobeam electron diffraction.

An oxide semiconductor film may have a structure having physical properties intermediate between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be observed. Furthermore, in the high-resolution TEM image, there are a region where a crystal part is clearly observed and a region where a crystal part is not observed. In some cases, growth of the crystal part occurs due to the crystallization of the a-like OS film, which is induced by a slight amount of electron beam employed in the TEM observation. In contrast, in the nc-OS film that has good quality, crystallization hardly occurs by a slight amount of electron beam used for TEM observation.

The crystal part size in the a-like OS film and the nc-OS film can be measured using high-resolution TEM images. For example, an InGaZnO$_4$ crystal has a layered structure in which two Ga—Zn—O layers are included between In—O layers. A unit cell of the InGaZnO$_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the InGaZnO$_4$ crystal.

The density of an oxide semiconductor film varies depending on the structure in some cases. For example, when the composition of an oxide semiconductor film is determined, the structure of the oxide semiconductor film can be expected by comparing the density of the oxide semiconductor film with the density of a single crystal oxide semiconductor film having the same composition as the oxide semiconductor film. For example, the density of the a-like OS film is higher than or equal to 78.6% and lower than 92.3% of the density of the single crystal oxide semiconductor film having the same composition. For example, the density of each of the nc-OS film and the CAAC-OS film is higher than or equal to 92.3% and lower than 100% of the density of the single crystal oxide semiconductor film having the same composition. Note that it is difficult to deposit an oxide semiconductor film having a density of lower than 78% of the density of a single crystal oxide semiconductor film having the same composition.

Specific examples of the above description are given. For example, in the case of an oxide semiconductor film having an atomic ratio of In:Ga:Zn=1:1:1, the density of a single crystal $InGaZnO_4$ film with a rhombohedral crystal structure is 6.357 $g/cm^3$. Accordingly, in the case of the oxide semiconductor film having an atomic ratio of In:Ga:Zn=1:1:1, the density of the a-like OS film is higher than or equal to 5.0 $g/cm^3$ and lower than 5.9 $g/cm^3$. For example, in the case of the oxide semiconductor film having an atomic ratio of In:Ga:Zn=1:1:1, the density of each of the nc-OS film and the CAAC-OS film is higher than or equal to 5.9 $g/cm^3$ and lower than 6.3 $g/cm^3$.

Note that there might be no single crystal oxide semiconductor film having the same composition as the oxide semiconductor film. In that case, single crystal oxide semiconductor films with different compositions are combined at an adequate ratio, which makes it possible to calculate a density equivalent to that of a single crystal oxide semiconductor film with the desired composition. The density of a single crystal oxide semiconductor film having the desired composition can be calculated using a weighted average according to the combination ratio of the single crystal oxide semiconductor films with different compositions. Note that it is preferable to use as few kinds of single crystal oxide semiconductor films as possible to calculate the density.

Note that an oxide semiconductor film may be a stacked film including two or more films of an amorphous oxide semiconductor film, an a-like OS film, a microcrystalline oxide semiconductor film, and a CAAC-OS film, for example.

<Film Formation Method>

A sputtering method and a plasma CVD method are typical examples of a method of forming an insulating layer, a conductive layer, a semiconductor layer, and the like included in a semiconductor device. These layers can be formed by another method, for example, a thermal CVD method. A metal organic chemical vapor deposition (MOCVD) method or an atomic layer deposition (ALD) method can be employed as a thermal CVD method, for example.

A thermal CVD method has an advantage that no defect due to plasma damage is generated since it does not utilize plasma for forming a film. Deposition by a thermal CVD method may be performed in the following manner: the pressure in a chamber is set to an atmospheric pressure or a reduced pressure, and a source gas and an oxidizer are supplied to the chamber at the same time, react with each other in the vicinity of the substrate or over the substrate, and are deposited on the substrate.

Deposition by an ALD method may be performed in the following manner: the pressure in a chamber is set to an atmospheric pressure or a reduced pressure, source gases for reaction are sequentially introduced into the chamber, and then, the sequence of the gas introduction is repeated. For example, two or more kinds of source gases are sequentially supplied to the chamber by switching respective switching valves (also referred to as high-speed valves). In this case, a first source gas is introduced, an inert gas (e.g., argon or nitrogen) or the like is introduced at the same time as the first source gas or after the first source gas is introduced so that the source gases are not mixed, and then, a second source gas is introduced. In the case where the first source gas and the inert gas are introduced at the same time, the inert gas serves as a carrier gas, and the inert gas may also be introduced at the same time as the second source gas. Alternatively, the first source gas may be exhausted by vacuum evacuation instead of the introduction of the inert gas, and then, the second source gas may be introduced. The first source gas is adsorbed on the surface of the substrate to form a first single-atomic layer; then, the second source gas is introduced to react with the first single-atomic layer; as a result, a second single-atomic layer is stacked over the first single-atomic layer, so that a thin film is formed. The sequence of the gas introduction is repeated plural times until a desired thickness is obtained, so that a thin film with excellent step coverage can be formed. The thickness of the thin film can be adjusted by the number of times the sequence of the gas introduction is repeated; therefore, an ALD method makes it possible to accurately adjust thickness and thus is suitable for manufacturing a minute FET.

The conductive films and the semiconductor films which are described in the above embodiments can be formed by a thermal CVD method such as an MOCVD method or an ALD method. For example, in the case where an $InGaZnO_X$ (X>0) film is formed, trimethylindium, trimethylgallium, and diethylzinc can be used. Note that the chemical formula of trimethylindium is $(CH_3)_3In$. The chemical formula of trimethylgallium is $(CH_3)_3Ga$. The chemical formula of dimethylzinc is $(CH_3)_2Zn$.

Without limitation to the above combination, triethylgallium (chemical formula: $(C_2H_5)_3Ga$) can be used instead of trimethylgallium, and diethylzinc (chemical formula: $(C_2H_5)_2Zn$) can be used instead of dimethylzinc.

For example, in the case where a tungsten film is formed using a deposition apparatus employing ALD, a $WF_6$ gas and a $B_2H_6$ gas are sequentially introduced plural times to form an initial tungsten film, and then, a $WF_6$ gas and an $H_2$ gas are sequentially introduced plural times to form a tungsten film. Note that an $SiH_4$ gas may be used instead of a $B_2H_6$ gas.

For example, in the case where an oxide semiconductor film, e.g., an $InGaZnO_X$ (X>0) film is formed using a deposition apparatus employing ALD, an $In(CH_3)_3$ gas and an $O_3$ gas are sequentially introduced plural times to form an $InO_2$ layer, a $Ga(CH_3)_3$ gas and an $O_3$ gas are sequentially introduced plural times to form a GaO layer, and then, a $Zn(CH_3)_2$ gas and an $O_3$ gas are sequentially introduced plural times to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed by mixing these gases. Although an $H_2O$ gas which is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

The structures and methods described in this embodiment can be combined with any of the structures and methods described in the other embodiments as appropriate.

Embodiment 6

In this embodiment, a configuration example of a central processing unit in which the semiconductor device of one embodiment of the present invention is used as a memory device will be described.

Figure 27:
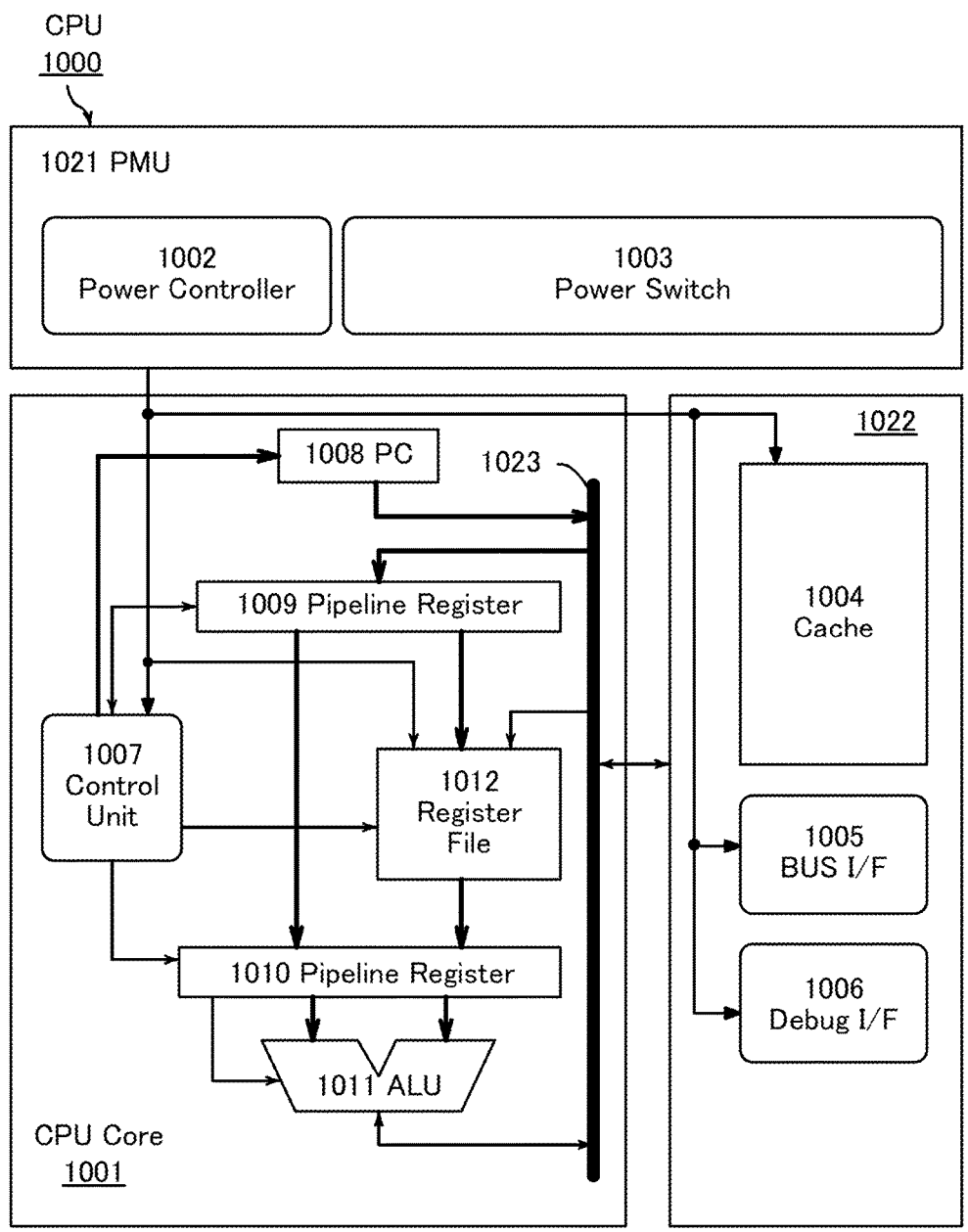
FIG. 27 illustrates an example of a configuration of a central processing unit.

FIG. 27 illustrates a configuration example of a central processing unit (CPU) 1000. The CPU 1000 illustrated in FIG. 27 includes a CPU core 1001, a power management unit (PMU) 1021, and a peripheral circuit 1022. The PMU 1021 includes a power controller 1002 and a power switch 1003. The peripheral circuit 1022 includes a cache 1004 including cache memory, a bus interface (BUS I/F) 1005, and a debug interface (Debug I/F) 1006. The CPU core 1001 includes a data bus 1023, a control unit 1007, a program counter (PC) 1008, a pipeline register 1009, a pipeline register 1010, an arithmetic logic unit (ALU) 1011, and a register file 1012. Data is transmitted between the CPU core 1001 and the peripheral circuit 1022 via the data bus 1023.

The semiconductor device described in the above embodiment can be applied to the cache 1004 and can be used as a cache memory, for example. In that case, fine-grained power gating of the cache 1004 can be conducted, and power consumption of the CPU 1000 can be reduced.

The control unit 1007 has functions of decoding and executing instructions contained in a program such as inputted applications by controlling the overall operations of the PC 1008, the pipeline registers 1009 and 1010, the ALU 1011, the register file 1012, the cache 1004, the bus interface 1005, the debug interface 1006, and the power controller 1002.

The ALU 1011 has a function of performing a variety of arithmetic operations such as four arithmetic operations and logic operations. The cache 1004 has a function of temporarily storing frequently used data. The PC 1008 is a register having a function of storing an address of an instruction to be executed next. Although not illustrated in FIG. 27, the cache 1004 includes a cache controller for controlling the operation of the cache memory.

The pipeline register 1009 has a function of temporarily storing instruction data. The register file 1012 includes a plurality of registers including a general purpose register and can store data that is read from the main memory, data obtained as a result of arithmetic operations in the ALU 1011, or the like. The pipeline register 1010 has a function of temporarily storing data used for arithmetic operations performed in the ALU 1011, data obtained as a result of arithmetic operations in the ALU 1011, or the like.

The bus interface 1005 functions as a path for data between the CPU 1000 and devices outside the CPU 1000. The debug interface 1006 functions as a path of a signal for inputting an instruction to control debugging to the CPU 1000.

The power switch 1003 has a function of controlling supply of a power supply voltage to circuits other than the power controller 1002 in the CPU 1000. These circuits belong to several different power domains. The power switch 1003 controls whether the power supply voltage is supplied to circuits in the same power domain. The power controller 1002 has a function of controlling the operation of the power switch 1003. With such a configuration, the CPU 1000 can perform power gating. An example of the flow of power gating will be described.

First, the CPU core 1001 sets the timing for stopping the supply of the power supply voltage in a register of the power controller 1002. Next, an instruction to start power gating is sent from the CPU core 1001 to the power controller 1002. Then, the registers and the cache 1004 in the CPU 1000 start data storing if necessary. Subsequently, the power switch 1003 stops the supply of the power supply voltage to the circuits other than the power controller 1002 in the CPU 1000. Then, an interrupt signal is input to the power controller 1002, thereby starting the supply of the power supply voltage to the circuits in the CPU 1000. Note that a counter may be provided in the power controller 1002 to be used to determine the timing of starting the supply of the power supply voltage regardless of input of the interrupt signal. Next, the registers and the cache 1004 start data restoration in the case where data has been stored elsewhere. After that, execution of an instruction is resumed in the control unit 1007.

This power gating can be performed in the entire processor or one or more logic circuits included in the processor. The supply of power can be stopped even for a short time. Accordingly, power gating can be performed at a fine spatial or temporal granularity.

Embodiment 7

In this embodiment, an electronic component and an electronic device or the like including the electronic component will be described as examples of semiconductor devices.

Figure 28A:
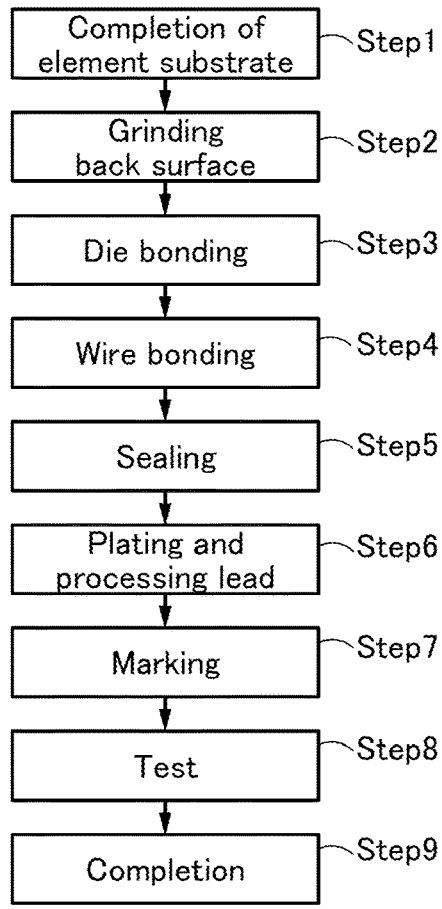
FIGS. 28A and 28B illustrate an example of a method for manufacturing an electronic component.

FIG. 28A is a flow chart showing an example of a method for manufacturing an electronic component. The electronic component is also referred to as a semiconductor package, an IC package, or a package. This electronic component has various standards and names depending on the direction and the shape of terminals. Therefore, an example of the electronic component will be described in this embodiment.

A semiconductor device including transistors is completed by integrating detachable components on a printed circuit board through an assembly process (post-process). The post-process can be completed through steps shown in FIG. 28A. Specifically, after an element substrate is completed in a pre-process (Step 1), the substrate is divided into a plurality of chips in a dicing step (Step 2). Before the substrate is divided into a plurality of pieces, the substrate is thinned to reduce warpage or the like of the substrate caused in the pre-process and to reduce the size of the component.

The chip is picked up, mounted on a lead frame, and bonded thereto in a die bonding step (Step 3). In the die bonding step, the chip may be bonded to the lead frame with a resin or a tape. As the bonding method, a method suitable for the product may be selected. In the die bonding step, the chip may be mounted on an interposer and bonded thereto. In a wire bonding step, a lead of the lead frame and an electrode on the chip are electrically connected to each other with a metal wire (Step 4). As the metal wire, a silver wire or a gold wire can be used. The wire bonding may be either ball bonding or wedge bonding.

A molding step is performed to seal the wire-bonded chip with an epoxy resin or the like (Step 5). After being plated, the lead of the lead frame is cut and processed into a predetermined shape (Step 6). The plating process prevents rust of the lead and facilitates soldering at the time of mounting on a printed board in a later step. Printing (marking) is performed on the package surface (Step 7). After a testing step (Step 8), the electronic component is completed (Step 9). An electronic component including the semiconductor device described in the above embodiment can achieve low power consumption and a small size.

Figure 28B:
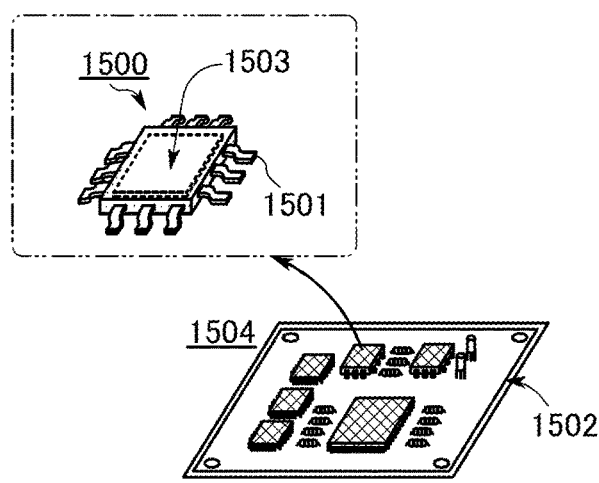

FIG. 28B is a perspective schematic view of the completed electronic component. As an example, FIG. 28B illustrates a quad flat package (QFP). In FIG. 28B, an electronic component 1500 includes a lead 1501 and a circuit portion 1503. The circuit portion 1503 includes, for example, the semiconductor device or the memory device described in the above embodiment and a logic circuit. The electronic component 1500 is mounted on a printed board 1502, for example. A plurality of electronic components 1500 which are combined and electrically connected to each other over the printed board 1502 can be mounted on an electronic device. A completed circuit board 1504 is provided in an electronic device or the like. The electronic component 1500 can be used as, for example, a random access memory that stores data or a processing unit that executes various kinds of processing, such as a CPU, an MCU, an FPGA, or a wireless IC. When an electronic device includes the electronic component 1500, the power consumption of the electronic device can be reduced, or the size of the electronic device can be easily reduced.

The electronic component 1500 can be used as an electronic component (IC chip) of electronic devices in a wide range of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy. Such an electronic device can be used for display devices, personal computers (PC), and image reproducing devices provided with recording media (devices which reproduce the content of recording media such as DVDs, Blu-ray discs, flash memories, and HDDs and have display portions for displaying images). Other examples of electronic devices that can be equipped with the semiconductor device of one embodiment of the present invention include cellular phones, game machines including portable game machines, portable data terminals, e-book readers, cameras (e.g., video cameras and digital still cameras), wearable display devices (e.g., head mounted display devices, goggle-type display devices, glasses-type display devices, armband-type display devices, bracelet-type display devices, and necklace-type display devices), navigation systems, audio reproducing devices (e.g., car audio systems and digital audio players), copiers, facsimiles, printers, multifunction printers, automated teller machines (ATM), and vending machines. FIGS. 29A to 29F illustrate specific examples of these electronic devices.

Figure 29A:
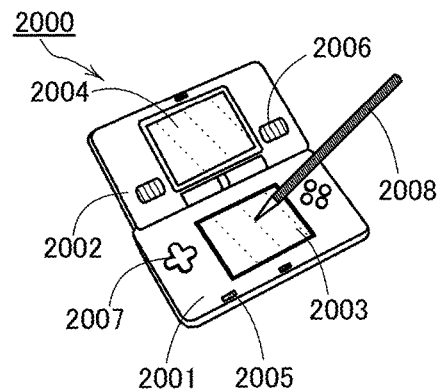
FIGS. 29A to 29F each illustrate an example of an electronic device.

A portable game machine 2000 in FIG. 29A includes a housing 2001, a housing 2002, a display portion 2003, a display portion 2004, a microphone 2005, a speaker 2006, an operation key 2007, a stylus 2008, and the like.

Figure 29B:
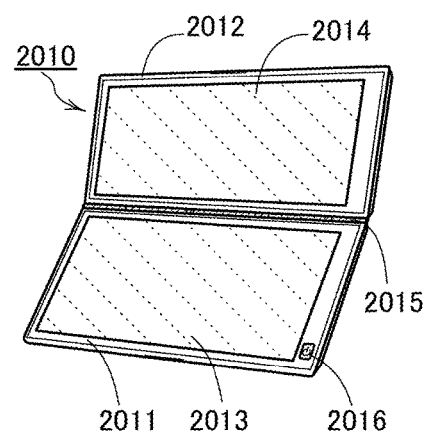

A portable information terminal 2010 in FIG. 29B includes a housing 2011, a housing 2012, a display portion 2013, a display portion 2014, a joint 2015, an operation key 2016, and the like. The display portion 2013 is provided in the housing 2011, and the display portion 2014 is provided in the housing 2012. The housings 2011 and 2012 are connected to each other with the joint 2015, and the angle between the housings 2011 and 2012 can be changed with the joint 2015. Images displayed on the display portion 2013 may be switched depending on the angle between the housings 2011 and 2012 at the joint 2015. A display device with a touch panel may be used as the display portion 2013 and/or the display portion 2014.

Figure 29C:
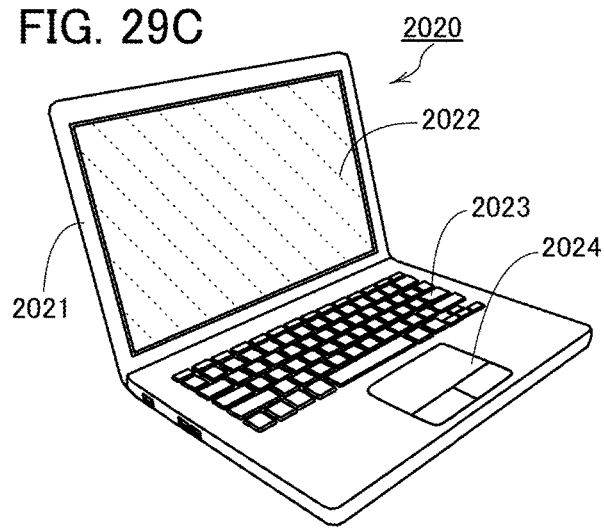

A laptop PC 2020 in FIG. 29C includes a housing 2021, a display portion 2022, a keyboard 2023, a pointing device 2024, and the like.

Figure 29D:
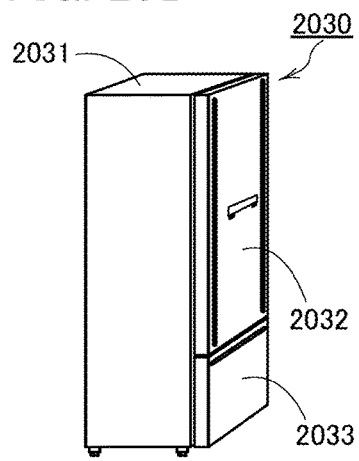

An electric refrigerator-freezer 2030 in FIG. 29D includes a housing 2031, a refrigerator door 2032, a freezer door 2033, and the like.

Figure 29E:
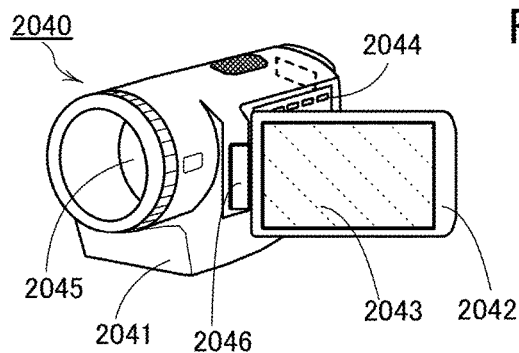

A video camera 2040 in FIG. 29E includes a housing 2041, a housing 2042, a display portion 2043, an operation key 2044, a lens 2045, a joint 2046, and the like. The operation key 2044 and the lens 2045 are provided in the housing 2041, and the display portion 2043 is provided in the housing 2042. The housings 2041 and 2042 are connected to each other with the joint 2046, and the angle between the housings 2041 and 2042 can be changed with the joint 2046. The orientation of an image displayed on the display portion 2043 may be changed and display/non-display of an image may be switched depending on the angle between the housings 2041 and 2042, for example.

Figure 29F:
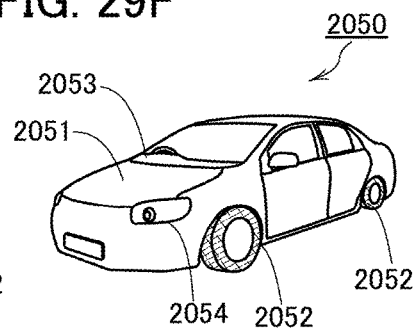

A motor vehicle 2050 in FIG. 29F includes a car body 2051, wheels 2052, a dashboard 2053, lights 2054, and the like.

The structures and methods described in this embodiment can be combined with any of the structures and methods described in the other embodiments as appropriate.

Example

In this example, measurement results of characteristics of a memory device including an OS transistor will be described.

One example of possible errors in a memory is a soft error due to the entry of radiation. The soft error is a phenomenon in which a malfunction such as inversion of data stored in a memory is caused by electron-hole pair generation when a transistor is irradiated with a rays emitted from a material of a memory or a package or the like, secondary cosmic ray neutrons generated by nuclear reaction of primary cosmic rays entering the Earth's atmosphere from outer space with nuclei of atoms existing in the atmosphere, or the like. In this example, the soft-error tolerance of a memory including an OS transistor was evaluated by radiation irradiation.

For measurement, 8 k-bit memories each including 8192 memory cells 111 illustrated in FIG. 13A or FIG. 14C were used. In each of the memory cells 111 illustrated in FIG. 13A, the capacitance of the capacitors 523 and 524 was set to 30 fF, the transistors 511 to 516 were Si transistors with a channel length of 0.35 μm, and the transistors 521 and 522 were OS transistors with a channel length of 0.8 μm. In each of the memory cells 111 illustrated in FIG. 14C, the capacitance of the capacitor 543 was set to 6.7 fF, the transistors 542 and 544 were Si transistors with a channel length of 0.35 μm, and the transistor 541 was an OS transistor with a channel length of 0.8 μm. In either memory cell, an SOI substrate was used for the Si transistors.

The soft-error tolerances of 8 k-bit memories 1 to 3 including the above memory cells were evaluated by radiation irradiation of the memories and by measurement of data retention characteristics thereof at that time. The memory 1 was in a state where data was retained at the node N7 of the memory cell 111 illustrated in FIG. 14C. The memory 2 was in a state where data was retained at the nodes N4 and N5 of the circuit 520 including OS transistors in the memory cell 111 illustrated in FIG. 13A. The memory 3 was in a state where data was retained at the nodes N2 and N3 of the circuit 510 corresponding to an SRAM cell in the memory cell 111 illustrated in FIG. 13A. Two samples (samples A and B) of each of the memories 1 to 3 were measured. A radiation source of the radiation with which the memories 1 to 3 were irradiated was an α-ray source using americium (Am) having a mass number of 241, and the distance between the radiation source and the sample was set to 1 mm. In tests, the number of memory cells 111 where retained data were varied by radiation irradiation was counted as the number of soft errors. Table 2 shows test results.

TABLE 2

| | | Test No. | | |
|---|---|---|---|---|
| | | 1 | 2 | 3 |
| Test conditions | Power supply voltage | 2 V | Minimum operating voltage | Minimum operating voltage |
| | Distance to radiation source | 1 mm | 1 mm | 1 mm |
| | Retention time | 5 min | 5 min | 20 min |
| Memory 1 | Number of soft errors (A) | 0 | 0 | — |
| | Number of soft errors (B) | 0 | 0 | — |
| Memory 2 | Number of soft errors (A) | 0 | 0 | 0 |
| | Number of soft errors (B) | 0 | 0 | 0 |
| Memory 3 | Number of soft errors (A) | 0 | 1 | 5 |
| | Number of soft errors (B) | 0 | 1 | 2 |

The tests were conducted under three kinds of conditions (tests 1 to 3). Through the test 1 in which the memories had a power supply voltage of 2 V and retained data for five minutes in the state of being irradiated with radiation, no soft errors occurred in any of the samples.

Next, the test 2 was conducted by changing the operating voltage to the lowest voltage of less than 2 V at which the memories can operate (the minimum operating voltage). As a result, a soft error was observed in each of the samples A and B of the memory 3. That is, a soft error occurred in the circuit 510 corresponding to the SRAM cell in FIG. 13A. On the other hand, no soft errors were observed in the memories 1 and 2 where data was retained with the OS transistor(s).

Next, the test 3 was conducted by extending the data retention time to 20 minutes while keeping the operating voltage at the minimum operating voltage. As a result, the number of soft errors increased in the memory 3. On the other hand, in the memory 2 where data was retained with the OS transistors, no soft errors were observed and data was retained correctly even though the retention time was extended and the amount of radiation irradiation was increased.

The results of the tests 1 to 3 show that the memory cell 111 illustrated in FIG. 14C has a high soft-error tolerance. In addition, in the memory cell 111 illustrated in FIG. 13A, the occurrence of soft errors can be reduced when data stored in the circuit 510 corresponding to an SRAM cell is temporarily stored in the circuit 520 including the OS transistors. That is, the soft-error tolerance of an SRAM cell can be improved by backup using OS transistors.

As described above, a highly reliable memory device having a high soft-error tolerance can be obtained by configuring memory cells using OS transistors.

This application is based on Japanese Patent Application serial no. 2015-022827 filed with Japan Patent Office on Feb. 9, 2015, the entire contents of which are hereby incorporated by reference.

What is claimed is:

1. A semiconductor device comprising:
a plurality of first memory circuits; and
a first selection circuit,
wherein each of the plurality of first memory circuits comprises a plurality of second memory circuits and a second selection circuit,
wherein each of the plurality of second memory circuits comprises a cell array and a driver circuit,
wherein the cell array comprises a first memory cell and a second memory cell,
wherein the first memory cell and the second memory cell each comprise a transistor and a capacitor,
wherein one of a source and a drain of the transistor is electrically connected to the capacitor,
wherein a channel formation region of the transistor comprises an oxide semiconductor,
wherein the first selection circuit is electrically connected to the plurality of first memory circuits,
wherein the second selection circuit is electrically connected to the plurality of second memory circuits,
wherein the first selection circuit is configured to select a particular first memory circuit from the plurality of first memory circuits in accordance with an address signal input to the first selection circuit,
wherein the second selection circuit is configured to select a particular second memory circuit from the plurality of second memory circuits in accordance with an address signal input to the second selection circuit, and
wherein the semiconductor device is configured to stop power supply to the driver circuit in each of the plurality of first memory circuits not selected by the first selection circuit and to stop power supply to the driver circuit in each of the plurality of second memory circuits not selected by the second selection circuit.

2. The semiconductor device according to claim 1, further comprising a switch between the driver circuit and a wiring for supplying a power supply potential,
wherein power supply to the driver circuit is stopped by turning off the switch.

3. The semiconductor device according to claim 1,
wherein the driver circuit comprises a first logic circuit and a second logic circuit,
wherein the first logic circuit is electrically connected to the first memory cell through a first wiring,
wherein the second logic circuit is electrically connected to the second memory cell through a second wiring, and
wherein the semiconductor device is configured to stop power supply to the second logic circuit in a period where the first memory cell is selected.

4. A central processing unit comprising a cache memory including the semiconductor device according to claim 1.

5. An electronic device comprising:
the semiconductor device according to claim 1; and
a display portion, a microphone, a speaker, or an operation key.

6. The semiconductor device according to claim 1,
wherein the transistor comprises a first gate and a second gate.

7. The semiconductor device according to claim 6,
wherein the first gate is connected to the second gate.

8. A semiconductor device comprising:
a plurality of memory circuits; and
a selection circuit,
wherein each of the plurality of memory circuits comprises a cell array and a driver circuit,
wherein the cell array comprises a first memory cell and a second memory cell,
wherein the first memory cell and the second memory cell each comprise a transistor and a capacitor,
wherein one of a source and a drain of the transistor is electrically connected to the capacitor,
wherein a channel formation region of the transistor comprises an oxide semiconductor,
wherein the selection circuit is electrically connected to the plurality of memory circuits,
wherein the selection circuit is configured to select a particular memory circuit from the plurality of memory circuits in accordance with an address signal input to the selection circuit, and wherein the semiconductor device is configured to stop power supply to the driver circuit in each of the plurality of memory circuits not selected by the selection circuit.

9. The semiconductor device according to claim 8, further comprising a switch between the driver circuit and a wiring for supplying a power supply potential,
wherein power supply to the driver circuit is stopped by turning off the switch.

10. The semiconductor device according to claim 8,
wherein the driver circuit comprises a first logic circuit and a second logic circuit,
wherein the first logic circuit is electrically connected to the first memory cell through a first wiring,
wherein the second logic circuit is electrically connected to the second memory cell through a second wiring, and
wherein the semiconductor device is configured to stop power supply to the second logic circuit in a period where the first memory cell is selected.

11. A central processing unit comprising a cache memory including the semiconductor device according to claim 8.

12. An electronic device comprising:
the semiconductor device according to claim 8; and
a display portion, a microphone, a speaker, or an operation key.

13. The semiconductor device according to claim 8,
wherein the transistor comprises a first gate and a second gate.

14. The semiconductor device according to claim 13,
wherein the first gate is connected to the second gate.

15. A semiconductor device comprising:
a wiring for supplying a power supply potential;
a plurality of memory circuits;
a switch between the wiring for supplying a power supply potential and the plurality of memory circuits; and
a selection circuit between the wiring for supplying a power supply potential and the plurality of memory circuits,
wherein each of the plurality of memory circuits comprises a cell array and a driver circuit,
wherein the cell array comprises a first memory cell and a second memory cell,
wherein the first memory cell and the second memory cell each comprise a transistor and a capacitor,
wherein one of a source and a drain of the transistor is electrically connected to the capacitor,
wherein a channel formation region of the transistor comprises an oxide semiconductor,
wherein the selection circuit is configured to select a particular memory circuit from the plurality of memory circuits, and
wherein a switch connected to the each of the plurality of memory circuits other than the particular memory circuit is configured to be turned off.

16. The semiconductor device according to claim 15,
wherein the driver circuit comprises a first logic circuit and a second logic circuit,
wherein the first logic circuit is electrically connected to the first memory cell through a first wiring,
wherein the second logic circuit is electrically connected to the second memory cell through a second wiring, and
wherein the semiconductor device is configured to stop power supply to the second logic circuit in a period where the first memory cell is selected.

17. A central processing unit comprising a cache memory including the semiconductor device according to claim 15.

18. An electronic device comprising:
the semiconductor device according to claim 15; and
a display portion, a microphone, a speaker, or an operation key.

19. The semiconductor device according to claim 15,
wherein the transistor comprises a first gate and a second gate.

20. The semiconductor device according to claim 19,
wherein the first gate is connected to the second gate.

* * * * *